United States Patent
Tanitsu et al.

(10) Patent No.: US 6,741,394 B1
(45) Date of Patent: May 25, 2004

(54) OPTICAL INTEGRATOR, ILLUMINATION OPTICAL APPARATUS, EXPOSURE APPARATUS AND OBSERVATION APPARATUS

(75) Inventors: Osamu Tanitsu, Kumagaya (JP); Yuji Kudo, Tokyo (JP); Mitsunori Toyoda, Fukaya (JP); Masato Shibuya, Omiya (JP)

(73) Assignee: Nikon Corporation, Tokyo (JP)

( * ) Notice: Subject to any disclaimer, the term of this patent is extended or adjusted under 35 U.S.C. 154(b) by 331 days.

(21) Appl. No.: 09/703,727

(22) Filed: Nov. 2, 2000

Related U.S. Application Data

(62) Division of application No. 09/041,353, filed on Mar. 12, 1998, now Pat. No. 6,177,222.

(30) Foreign Application Priority Data

Dec. 15, 1999 (JP) .......................................... P11-355879
May 26, 2000 (JP) ..................................... P2000-157332
Jul. 31, 2000 (JP) ..................................... P2000-230349

(51) Int. Cl.⁷ .............................................. G02B 27/10
(52) U.S. Cl. ...................... 359/619; 359/626; 359/625; 359/628
(58) Field of Search ................................. 359/619, 621, 359/625, 626, 628

(56) References Cited

U.S. PATENT DOCUMENTS

| | | | |
|---|---|---|---|
| 5,418,583 A | * 5/1995 | Masumoto | 353/38 |
| 5,581,379 A | * 12/1996 | Aoyama et al. | 349/5 |
| 5,594,526 A | 1/1997 | Mori et al. | 355/67 |
| 5,615,047 A | 3/1997 | Komatsuda et al. | 359/618 |
| 5,695,274 A | 12/1997 | Kamihara et al. | 362/268 |
| 5,760,963 A | 6/1998 | Mori | 359/622 |
| 5,808,784 A | * 9/1998 | Ando et al. | 359/443 |
| 5,850,300 A | 12/1998 | Kathman et al. | 359/9 |

(List continued on next page.)

FOREIGN PATENT DOCUMENTS

| | | |
|---|---|---|
| EP | 0 633 506 A1 | 1/1995 |
| EP | 0 747 772 A1 | 12/1998 |
| EP | 0 952 491 A2 | 10/1999 |

(List continued on next page.)

OTHER PUBLICATIONS

U.S. patent application Ser. No. 09/540,874, Komatsuda et al., filed May 31, 2000.

*Primary Examiner*—Ricky Mack
(74) *Attorney, Agent, or Firm*—Oliff & Berridge, PLC

(57) ABSTRACT

The present invention is aimed at providing a wavefront dividing type optical integrator which can yield a uniform illuminance distribution substantially over the whole illumination field formed thereby even when the size of each micro lens constituting the optical integrator is made smaller so as to set a large number of wavefront divisions. The optical integrator in accordance with the present invention is a wavefront dividing type optical integrator, having a number of micro lenses arranged two-dimensionally, for forming a number of light sources by dividing a wavefront of an incident beam; each micro lens having a rectangular entrance surface and a rectangular exit surface, and satisfying at least one of the following conditions:

$$(d_1/2)(D_1/2)/(\lambda \cdot f) \geq 3.05$$

$$(d_2/2)(D_2/2)/(\lambda \cdot f) \geq 3.05$$

where f is the focal length of each micro lens, $d_1$ is the length of one side of the entrance surface of each micro lens, $d_2$ is the length of the other side of the entrance surface of each micro lens, $D_1$ is the length of the side of exit surface in each micro lens corresponding to the one side of entrance surface, $D_2$ is the length of the side of exit surface in each micro lens corresponding to the other side of entrance surface, and $\lambda$ is the wavelength of the incident beam.

46 Claims, 23 Drawing Sheets

ENTRANCE SURFACE        EXIT SURFACE

U.S. PATENT DOCUMENTS

| | | | |
|---|---|---|---|
| 5,895,737 A | 4/1999 | McCullough et al. | 430/30 |
| 6,049,374 A | 4/2000 | Komatsuda et al. | 355/67 |
| 6,072,620 A * | 6/2000 | Shiono et al. | 359/290 |
| 6,127,095 A | 10/2000 | Kudo | 430/311 |
| 6,238,063 B1 | 5/2001 | Tanitsu et al. | 362/626 |

FOREIGN PATENT DOCUMENTS

| | | |
|---|---|---|
| JP | A 64-42821 | 2/1989 |
| JP | A 1-198759 | 8/1989 |
| JP | A 7-130600 | 5/1995 |
| JP | A 7-142313 | 6/1995 |
| JP | A 7-306304 | 11/1995 |
| JP | A 8-328261 | 12/1996 |
| JP | A 9-223661 | 8/1997 |
| JP | A 10-275771 | 10/1998 |
| JP | A 10-340854 | 12/1998 |
| JP | A 11-174365 | 7/1999 |
| JP | A 2000-21750 | 1/2000 |
| JP | A 2000-39505 | 2/2000 |
| JP | A 2000-58442 | 2/2000 |
| JP | A 2000-82655 | 3/2000 |
| JP | A 2000-114164 | 4/2000 |
| JP | A 2000-223396 | 8/2000 |
| JP | A 2000-223405 | 8/2000 |
| WO | WO 99/36832 | 7/1999 |
| WO | WO 99/49505 | 9/1999 |

* cited by examiner

ENTRANCE SURFACE

EXIT SURFACE

ENTRANCE SURFACE

EXIT SURFACE

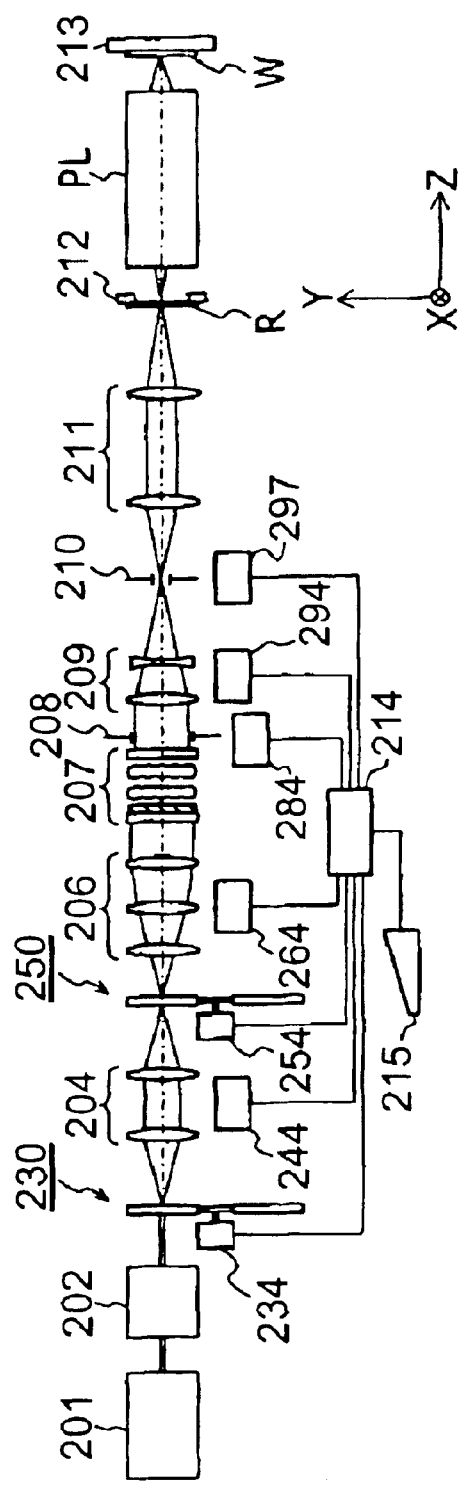
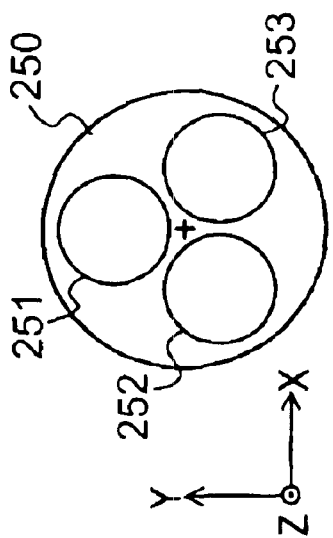
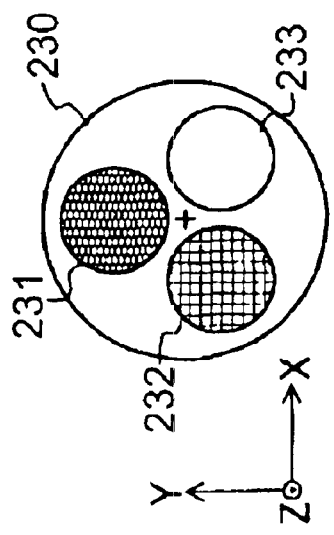

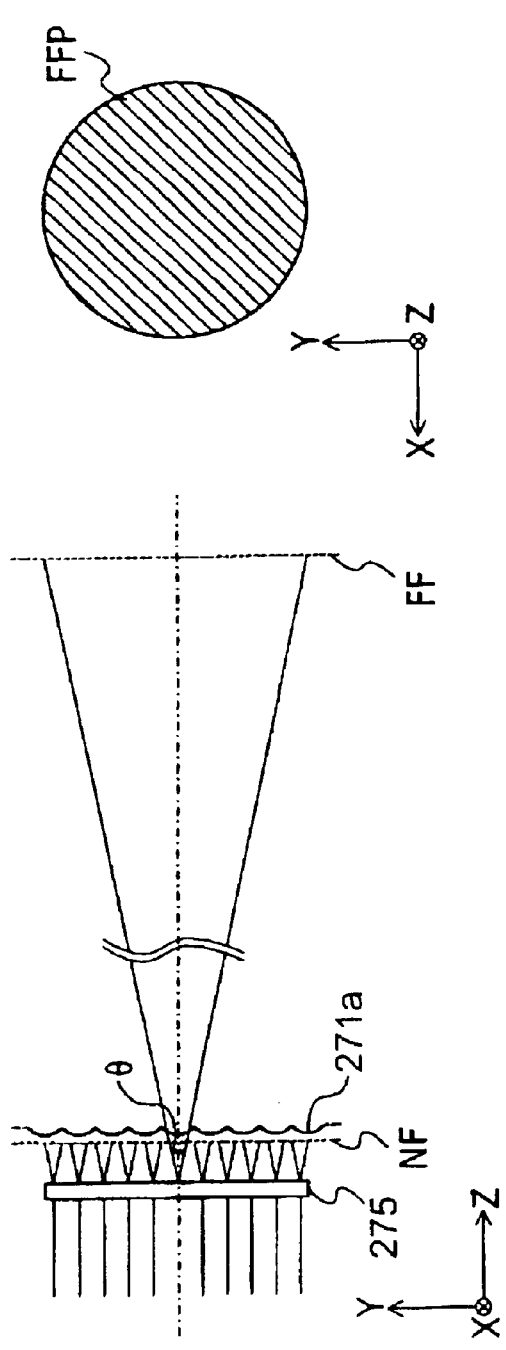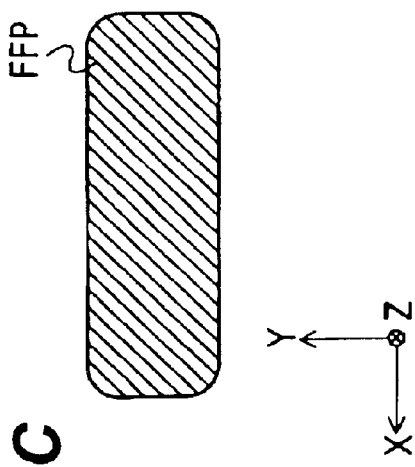
Fig.17A Fig.17B Fig.17C

US 6,741,394 B1

OPTICAL INTEGRATOR, ILLUMINATION OPTICAL APPARATUS, EXPOSURE APPARATUS AND OBSERVATION APPARATUS

This is a Division of application Ser. No. 09/041,353 filed Mar. 12, 1998 now U.S. Pat. No. 6,177,222. The entire disclosure of the prior application(s) is hereby incorporated by reference herein in its entirety.

BACKGROUND OF THE INVENTION

1. Field of the Invention

The present invention relates to a wavefront dividing type optical integrator; an illumination optical apparatus comprising this optical integrator; and an illumination optical apparatus suitable for exposure apparatus, observation apparatus (microscopes), and the like using this illumination optical apparatus.

2. Related Background Art

In a typical exposure apparatus for making micro devices such as semiconductor device, imaging picking device, liquid crystal display device, and thin film magnetic head, a beam emitted from a light source is incident on a micro fly's eye lens, and a secondary light source composed of a number of light sources is formed on the image-side focal plane thereof. Beams from the secondary light source are made incident on a condenser lens after being restricted by an aperture stop disposed near the image-side focal plane of the micro fly's eye lens.

The Beams collected by the condenser lens illuminate, in a superimposing manner, a mask formed with a predetermined pattern. The light transmitted through the pattern of mask forms an image on a photosensitive substrate by way of a projection optical system. Thus, a mask pattern is projected (transferred) onto the photosensitive substrate. The pattern formed in the mask is highly integrated. As a consequence, for accurately transferring this fine pattern onto a photosensitive substrate, it is indispensable that a uniform illuminance distribution be obtained on the photosensitive substrate.

The micro fly's eye lens is a wavefront dividing type optical integrator composed of a number of micro lenses densely arranged in a matrix. In general, the micro fly's eye lens is constructed by etching a plane-parallel glass sheet, for example, so as to form a micro lens group. Here, each micro lens constituting the micro fly's eye lens is smaller than each lens element constituting a fly's eye lens.

SUMMARY OF THE INVENTION

As mentioned above, it is indispensable for a photolithgrahic exposure apparatus for transferring a fine pattern onto a photosensitive substrate to yield a uniform illuminance distribution on the mask and/or on the photosensitive substrate. Reducing the unevenness in illuminance, it has been desired to increase the number of micro lenses micro optical elements constituting the micro fly's eye lens (micro fly's eye optical member), i.e., to increase the number of divisions of wavefront.

On the other hand, when making a micro fly's eye lens by etching and the like, the glass sheet is harder to etch deeply, and the making will be easier if the size of each micro lens is made smaller. However, simply reducing the size of each micro lens is disadvantageous in that illuminance decreases by the amount of diffraction limit with respect to the entrance surface of each micro lens in marginal areas of an illumination field formed on a surface to be irradiated which is optically conjugate with the entrance surface.

It is an object of the present invention to provide a wavefront dividing type optical integrator which can yield a uniform illuminance distribution substantially over the whole illumination field formed thereby even when the size of each micro lens is made smaller so as to set a large number of wavefront divisions; an illumination optical apparatus comprising this optical integrator; and a photolithgrahic exposure apparatus and-observation apparatus comprising this illumination optical apparatus.

The optical integrator in accordance with a first aspect of the present invention is a wavefront dividing type optical integrator, having a number of micro lenses (micro optical elements) arranged two-dimensionally, for forming a number of light sources by dividing a wavefront of an incident beam; each micro lens having a rectangular entrance surface and a rectangular exit surface, and satisfying at least one of the following conditions:

$$(d_1/2)(D_1/2)/(\lambda \cdot f) \geqq 3.05$$

$$(d_2/2)(D_2/2)/(\lambda \cdot f) \geqq 3.05$$

where f is the focal length of each micro lens, $d_1$ is the length of one side of the entrance surface of each micro lens, $d_2$ is the length of the other side of the entrance surface of each micro lens, $D_1$ is the length of the side of exit surface in each micro lens corresponding to the one side of entrance surface, $D_2$ is the length of the side of exit surface in each micro lens corresponding to the other side of entrance surface, and $\bar{e}$ is the wavelength of the incident beam.

The optical integrator may be characterized in that the length $d_1$ of the one side of entrance surface is longer than the length $d_2$ of the other side of entrance surface, and the condition of $$(d_1/2)(D_1/2)/(\lambda \cdot f) \geqq 3.05$$

is satisfied.

The optical integrator in accordance with a second aspect of the present invention is a wavefront dividing type optical integrator, having a number of micro lenses (micro optical elements) arranged two-dimensionally, for forming a number of light sources by dividing a wavefront of an incident beam; each micro lens having a rectangular entrance surface and a circular or regular hexagonal exit surface, and satisfying at least one of the following conditions:

$$(d_1/2)(D/2)/(\lambda \cdot f) \geqq 3.05$$

$$(d_2/2)(D/2)/(\lambda \cdot f) \geqq 3.05$$

where f is the focal length of each micro lens, $d_1$ is the length of one side of the entrance surface of each micro lens, $d_2$ is the length of the other side of the entrance surface of each micro lens, D is the diameter of the circular exit surface or the diameter of a circle circumscribing the regular hexagonal exit surface of each micro lens, and $\bar{e}$ is the wavelength of the incident beam.

The optical integrator may be characterized in that the length $d_1$ of the one side of entrance surface is longer than the length $d_2$ of the other side of entrance surface, and the condition of $$(d_1/2)(D_1/2)/(\lambda \cdot f) \geqq 3.05$$

is satisfied.

The optical integrator in accordance with a third aspect of the present invention is a wavefront dividing type optical integrator, having a number of micro lenses (micro optical elements) arranged two-dimensionally, for forming a number of light sources by dividing a wavefront of an incident beam; each micro lens having a circular entrance surface with a diameter of d or a regular hexagonal entrance surface inscribed in a circle having a diameter of d, and satisfying the following condition:

$$(d_1/2)2/(\lambda \cdot f) \geq 3.05$$

where f is the focal length of each micro lens, and ë is the wavelength of the incident beam.

The illumination optical apparatus in accordance with a fourth aspect of the present invention is an illumination optical apparatus for illuminating a surface to be irradiated according to a beam from a light source, the illumination optical apparatus comprising the optical integrator, disposed in an optical path between the light source and the surface to be irradiated, for forming a number of light sources according to a luminous beam the light source; and a light-guiding optical system, disposed in an optical path between the optical integrator and the surface to be irradiated, for guiding beams from a number of light sources formed by the optical intergrator to the surface to be irradiated.

In the illumination optical apparatus, the light-guiding optical system may comprise a condenser optical system, disposed in the optical path between the optical integrator and the surface to be irradiated, for condensing beams from a number of light sources formed by the optical integrator so as to form an illumination field in a superimposing manner; an image forming optical system, disposed in an optical path between the condenser optical system and the surface to be irradiated, for forming an image of the illumination field near the surface to be irradiated according to a beam from the illumination field; and an aperture stop, disposed in an optical path of the image forming optical system at a position substantially optically conjugate with a position where the light sources are formed, for blocking an unnecessary beam.

In the illumination optical apparatus, each micro lens (micro optical element) in the optical integrator may have at least one refractive surface formed into an aspheric form which is symmetrical about an axis parallel to a reference optical axis in order to attain a substantially uniform illuminance on the surface to be irradiated. If an aspheric surface is introduced into each micro lens element in the optical integrator as such, then the number of parameters in terms of optical designing increases, which makes it easier to yield a desirable design solution, whereby the degree of freedom in design can be improved from the viewpoint of aberration correction in particular. Therefore, in the optical integrator, not only the occurrence of spherical aberration is favorably suppressed, but also the sine condition is substantially satisfied, whereby the occurrence of coma can be suppressed favorably. As a result, unevenness in illumination can favorably be restrained from occurring due to the optical integrator as multiple light source forming member whereby the uniformity in illuminance and the uniformity in numerical aperture can be satisfied at the same time.

In the fourth aspect of the present invention, the above-mentioned effects can be obtained when each micro lens of the optical integrator has at least one aspheric refractive surface even if the condition concerning the entrance surface and exit surface in accordance with the first aspect of the present invention is not satisfied. That is to say, the illumination optical apparatus in accordance with the fourth aspect of the present invention is aimed at satisfying the uniformity in illuminance on the surface to be illuminated and the uniformity in numerical aperture at the same time, and may comprise light source for supplying illumination light, multiple light source forming member for forming a number of light sources according to a beam from the light source, and a condenser optical system for guiding beams from the light sources to the surface to be irradiated or a surface optically conjugate with the surface to be irradiated; wherein the multiple light source forming member has a wavefront dividing type optical integrator comprising a number of micro lens elements, each micro lens element in the wavefront dividing type optical integrator having at least one refractive surface formed into an aspheric form which is symmetrical about an axis parallel to a reference optical axis in order to attain a substantially uniform illuminance on the surface to be irradiated.

In the illumination optical apparatus, the optical integrator may have a number of combining optical systems whose optical axes are respective axes parallel to the reference optical axis, at least one refractive surface formed aspheric being formed into a predetermined aspheric surface in order to favorably restrain coma from occurring in the combining optical systems.

The illumination optical system may be characterized in that it comprises a filter having a predetermined optical transmissivity distribution disposed near the optical integrator on the entrance side thereof in order to correct unevenness in illumination on the surface to be irradiated; and positioning sub-system, connected to the optical integrator and the filter, for positioning the optical integrator and filter with respect to each other. In this case, it is preferred that the positioning means sub-system have an alignment mark formed in the wavefront dividing type optical integrator and an alignment mark formed in the filter.

The illumination optical apparatus may be characterized in that an iris stop adapted to change the size of an opening portion is disposed adjacent the exit surface of the optical integrator.

In the illumination optical apparatus, the optical integrator may have at least two optical element bundles disposed along the reference optical axis with a space therebetween, at least two of the optical element bundles having the aspheric optical surface.

In the illumination optical apparatus, at least two of the optical element bundles may have a number of combining optical systems each comprising at least two micro optical elements corresponding to each other along the axis, all optical surfaces in the combining optical systems being formed into aspheric surfaces having properties identical to each other.

The illumination optical apparatus may comprise positioning sub-system, connected to at least two of the optical element bundles, for positioning at least two of the optical element bundles with respect to each other. In this case, it is preferred that the positioning sub-system have respective alignment marks formed in at least two of optical element bundles. Preferably, a filter having a predetermined optical transmissivity distribution for correcting unevenness in illuminance on the surface to be irradiated is disposed near the wavefront dividing type optical integrator on the entrance side thereof, and the positioning sub-system has an alignment mark formed in the filter in order to position at least two of the optical element bundles and the filter with respect to each other.

In the illumination optical apparatus, the optical integrator may have 1,000 or more axes.

The illumination optical apparatus may have light source image enlarging member, disposed in the optical path between the optical integrator and the light source at or near a position conjugate with the surface to be irradiated, for enlarging the light source image. Employing a configuration having light source image enlarging member as such reduces damages to optical members in the illumination optical apparatus.

In the illumination optical apparatus, the divergent angle of beams by way of the light source image enlarging member may be determined such that no loss in illumination light occurs in the optical integrator.

The illumination optical apparatus may be characterized in that the optical integrator has a plurality of lens surfaces, arranged two-dimensionally, each forming the light source image; the light source image enlarging member enlarges the light source image formed by way of the lens surface; and the divergent angle of the light source image enlarging member is set such that the enlarged light source image is smaller than the lens surface.

In the illumination optical apparatus, the optical integrator may have a plurality of lens surfaces, arranged two-dimensionally, each forming a light source image.

The illumination optical apparatus may be characterized in that a substantially uniform illuminance distribution is formed in a near field of the light source image enlarging member.

The illumination optical apparatus may be characterized in that only one pattern is formed in a far field of the light source image enlarging member.

In the illumination optical apparatus, the far field pattern of the light source image enlarging member may be circular, elliptical, or polygonal.

At a pupil of the illumination optical apparatus, a secondary light source having an optical intensity distribution in which the optical intensity in a pupil center region including an optical axis in a region on the pupil is set lower than that in a region surrounding the pupil center region may be formed.

The illumination optical apparatus may further comprise a diffractive optical element, disposed between the light source and the optical integrator, for controlling a form of the secondary light source formed at the pupil of the illumination optical apparatus.

The illumination optical apparatus may have zeroth-order light blocking member, disposed between the diffractive optical element for controlling the form of the secondary light source and the optical integrator, for blocking zeroth-order light from the diffractive optical element for controlling the form of the secondary light source.

In the illumination optical apparatus, the optical integrator may comprise a plurality of lens surfaces arranged two-dimensionally and an entrance-side cover glass disposed on the entrance side of the plurality of lens surfaces, the entrance-side cover glass being provided with the zeroth-order light blocking member.

In the illumination optical apparatus, the light source image enlarging member may have a diffractive optical element or diffuser.

The illumination optical apparatus may be characterized in that an antireflection film with respect to a wavelength of the illumination light is disposed on a surface of the diffractive optical element or diffuser.

In the illumination optical apparatus, the optical integrator may comprise a plurality of lens surfaces arranged two-dimensionally and an exit-side cover glass disposed on the exit side of the plurality of lens surfaces, the exit-side cover glass being provided with a light-shielding member for blocking light passing through a region different from the plurality of lens surfaces toward the surface to be irradiated.

The illumination optical apparatus may comprise a micro fly's eye lens (micro fly's eye optical member) disposed in the optical path between the light source and the surface to be irradiated, comprising a substrate having a surface formed with a plurality of lens surfaces, the lens surfaces of the micro fly's eye lens being provided with an antireflection film with respect to the illumination light.

The illumination optical apparatus may comprise illuminance distribution correcting member, disposed between the light source and the optical integrator, for controlling respective intensity distributions of Fourier-transformed images of the plurality of light source images independently from each other.

In the illumination optical apparatus, the optical integrator may comprise a plurality of lens surfaces arranged two-dimensionally, an entrance-side cover glass disposed on the entrance side of the plurality of lens surfaces, and an exit-side cover glass disposed on the exit side of the plurality of lens surfaces, the illuminance distribution correcting member being disposed in an optical path between the entrance-side cover glass and the exit-side cover glass.

The illumination optical-apparatus may form an illumination area on the surface to be irradiated, the illuminance region having a form whose length in a predetermined direction differs from that in a direction orthogonal to the predetermined direction.

In the illumination optical apparatus, the antireflection film may have at least one ingredient selected from aluminum fluoride; barium fluoride; calcium fluoride; cerium fluoride; cesium fluoride; erbium fluoride; gadolinium fluoride; hafnium fluoride; lanthanum fluoride; lithium fluoride; magnesium fluoride; sodium fluoride; cryolite; chiolite; neodymium fluoride; lead fluoride; scandium fluoride; strontium fluoride; terbium fluoride; thorium fluoride; yttrium fluoride; ytterbium fluoride; samarium fluoride; dysprosium fluoride; praseodymium fluoride; europium fluoride; holmium fluoride; bismuth fluoride; a fluorine resin comprising at least one material selected from the group consisting of polytetrafluoroethylene, polychlorotrifluoroethylene, polyvinyl fluoride, fluorinated ethylene propylene resin, polyvinylidene fluoride, and polyacetal; aluminum oxide; silicon oxide; germanium oxide; zirconium oxide; titanium oxide; tantalum oxide; niobium oxide; hafnium oxide; cerium oxide; magnesium oxide; neodymium oxide; gadolinium oxide; thorium oxide; yttrium oxide; scandium oxide; lanthanum oxide; praseodymium oxide; zinc oxide; lead oxide; a mixture group and complex compound group comprising at least two materials selected from a group of silicon oxides; a mixture group and complex compound group comprising at least two materials selected from a group of hafnium oxides; and a mixture group and complex compound group comprising at least two materials selected from a group of aluminum oxides.

In the illumination optical apparatus, the light source may supply illumination light having a wavelength of 200 nm or shorter.

In the illumination optical apparatus, the diffractive optical element or micro fly's eye lens may have silica glass doped with fluorine.

The illumination optical apparatus in accordance with a fifth aspect of the present invention is an illumination optical apparatus for illuminating a surface to be irradiated with a beam from a light source, the apparatus including a plurality of optical elements disposed in an optical path between the light source and the surface to be irradiated, at least one of the optical elements comprising positioning sub-system, provided in the at least one optical element, for optically positioning the at least one optical element.

In the illumination optical apparatus, the positioning sub-system may be disposed outside the optical path between the light source and the surface to be irradiated.

The illumination optical apparatus in accordance with a sixth aspect of the present invention is an illumination optical apparatus for illuminating a surface to be irradiated with illumination light from a light source, the apparatus comprising a micro fly's eye lens, disposed in an optical path between the light source and the surface to be irradiated, having a substrate with a surface formed with a plurality of lens surfaces; and a condenser optical system, disposed in an optical path between the micro fly's eye lens and the surface to be irradiated, for guiding a beam from the micro fly's eye lens to the surface to be irradiated or a surface optically conjugate with the surface to be irradiated, the lens surfaces of the micro fly's eye lens being provided with an antireflection film with respect to the illumination light. When the antireflection film is provided as such, the efficiency of illumination onto the surface to be irradiated can be improved.

In the illumination optical apparatus, the antireflection film may have at least one ingredient selected from aluminum fluoride; barium fluoride; calcium fluoride; cerium fluoride; cesium fluoride; erbium fluoride; gadolinium fluoride; hafnium fluoride; lanthanum fluoride; lithium fluoride; magnesium fluoride; sodium fluoride; cryolite; chiolite; neodymium fluoride; lead fluoride; scandium fluoride; strontium fluoride; terbium fluoride; thorium fluoride; yttrium fluoride; ytterbium fluoride; samarium fluoride; dysprosium fluoride; praseodymium fluoride; europium fluoride; holmium fluoride; bismuth fluoride; a fluorine resin comprising at least one material selected from the group consisting of polytetrafluoroethylene, polychlorotrifluoroethylene, polyvinyl fluoride, fluorinated ethylene propylene resin, polyvinylidene fluoride, and polyacetal; aluminum oxide; silicon oxide; germanium oxide; zirconium oxide; titanium oxide; tantalum oxide; niobium oxide; hafnium oxide; cerium oxide; magnesium oxide; neodymium oxide; gadolinium oxide; thorium oxide; yttrium oxide; scandium oxide; lanthanum oxide; praseodymium oxide; zincbxide; leadoxide; amixture group and complex compound group comprising at least two materials selected from a group of silicon oxides; a mixture group and complex compound group comprising at least two materials selected from a group of hafnium oxides; and a mixture group and complex compound group comprising at least two materials selected from a group of aluminum oxides.

The illumination optical apparatus in accordance with a seventh aspect of the present invention is an illumination optical apparatus for illuminating a surface to be irradiated with illumination light from a light source, the apparatus comprising a micro fly's eye lens, disposed in an optical path between the light source and the surface to be irradiated, having a substrate with a surface formed with a plurality of lens surfaces; a condenser optical system, disposed in an optical path between the micro fly's eye lens and the surface to be irradiated, for guiding a beam beam from the micro fly's eye lens to the surface to be irradiated or a surface optically conjugate with the surface to be irradiated; and an exit-side protecting member disposed on the exit side of the micro fly's eye lens and formed from a material transparent to the illumination light, the exit-side protecting member having a light-shielding member, provided in the exit-side protecting member, for blocking light passing through a region of the micro fly's eye lens different from the plurality of lens surfaces toward the surface to be irradiated. If the light-shielding member is provided as such, so as to block the light passed through the region of micro fly's eye lens different from the lens surfaces, then image forming performances can be improved.

In the illumination optical apparatus, the optical integrator may comprise an entrance-side cover glass disposed on the entrance side of the micro fly's eye lens.

The illumination optical apparatus in accordance with an eighth aspect of the present invention is an illumination exposure apparatus, adapted to be combined with a photolithgrahic exposure apparatus comprising a projection optical system by which an image of a pattern on a mask disposed at a first surface is formed on a photosensitive substrate disposed at a second surface, for illuminating the first surface with a beam from a light source, the illumination optical apparatus comprising multiple beam superimposing member, disposed between the light source and the first surface, for dividing the beam from the light source and superimposing thus divided number of beams on an illumination field which is a region on a predetermined surface; and an illumination image forming optical system, disposed between the multiple beam superposing member and the first surface, for forming an image of the illumination field on or near the first surface, the illumination image forming optical system having an aperture stop disposed at a position optically conjugate with a pupil of the projection optical system.

In the illumination optical apparatus, the multiple beam superposing member may divide a wavefront of the beam from the light source.

The exposure apparatus in accordance with a ninth aspect of the present invention is a photolithgrahic exposure apparatus for projecting a pattern of a mask onto a photosensitive substrate, the apparatus comprising the illumination optical apparatus, the surface to be irradiated being set on the photosensitive substrate.

A projection exposure apparatus incorporating the illumination optical apparatus therein can satisfy the uniformity in illuminance in the exposure surface of photosensitive substrate, which is the surface to be irradiated, and the uniformity in numerical aperture. As a result, favorable projection/exposure with a high throughput can be carried out under a favorable exposure condition.

The exposure apparatus in accordance with a tenth aspect of the present invention is a photolithgrahic exposure apparatus for transferring a pattern of a mask disposed on a first surface onto a workpiece disposed on a second surface, the exposure apparatus comprising the illumination optical apparatus for illuminating the first surface; and a projection exposure apparatus, disposed in an optical path between the first and second surfaces, for projecting the pattern of the mask onto the workpiece, the illumination optical apparatus further comprising optical intensity distribution changing member, disposed in the optical path between the light source and the optical integrator, for changing an optical intensity distribution of a beam incident on the optical integrator.

The exposure apparatus in accordance with an eleventh aspect of the present invention is a photolithgrahic exposure apparatus for illuminating a mask formed with a pattern with illumination light in a predetermined wavelength range so as to form an image of the pattern onto a substrate by way of a projection optical system, the exposure apparatus comprising the illumination optical apparatus for supplying the illumination light to the mask.

The exposure apparatus may be characterized in that an illumination area on the mask has a form whose length in a predetermined direction differs from that in a direction orthogonal to the predetermined direction, and exposure is carried out while changing a relative relationship between the mask and the illumination area.

The exposure method in accordance with a twelfth aspect of the present invention is an exposure method in which a mask formed with a pattern is illuminated with illumination light in a predetermined wavelength range so as to form an image of the pattern onto a substrate by way of a projection optical system, wherein the illumination light is supplied to the mask by use of the illumination optical apparatus. When the illumination optical apparatus is used as such, projection/exposure can be carried out under a favorable exposure condition, whereby favorable micro devices (semiconductor device, image pickup device, liquid crystal display picking device, thin film magnetic head, and the like) can be made.

The observation apparatus in accordance with a thirteenth aspect of the present invention is an observation apparatus for forming an image of an object to be observed, the apparatus comprising the illumination optical apparatus for illuminating the object to be observed; and an image forming optical system, disposed between the object to be observed and the image, for forming an image of the object to be observed according to light having traveled by way of the object to be observed.

The illumination optical apparatus in accordance with a fourteenth aspect of the present invention is an illumination optical apparatus for illuminating a surface to be irradiated with illumination light from a light source, the illumination optical apparatus comprising an optical integrator, disposed in an optical path between the light source and the surface to be irradiated, for forming a secondary light source according to a beam from the light source; a condenser optical system, disposed between the optical integrator and the surface to be irradiated, for guiding a beam from the optical integrator to the surface to be irradiated or a surface optically conjugate with the surface to be irradiated; and a diffractive optical element disposed in an optical path between the light source and the surface to be irradiated, a surface of the diffractive optical element being provided with an antireflection film with respect to the illumination light. When the antireflection film is provided as such, the efficiency of illumination onto the surface to be irradiated can be improved.

In the illumination optical apparatus, the antireflection film may have at least one ingredient selected from aluminum fluoride; barium fluoride; calcium fluoride; cerium fluoride; cesium fluoride; erbium fluoride; gadolinium fluoride; hafnium fluoride; lanthanum fluoride; lithium fluoride; magnesium fluoride; sodium fluoride; cryolite; chiolite; neodymium fluoride; lead fluoride; scandium fluoride; strontium fluoride; terbium fluoride; thorium fluoride; yttrium fluoride; ytterbium fluoride; samarium fluoride; dysprosium fluoride; praseodymium fluoride; europium fluoride; holmium fluoride; bismuth fluoride; a fluorine resin comprising at least one material selected from the group consisting of polytetrafluoroethylene, polychlorotrifluoroethylene, polyvinyl fluoride, fluorinated ethylene propylene resin, polyvinylidene fluoride, and polyacetal; aluminum oxide; silicon oxide; germanium oxide; zirconium oxide; titanium oxide; tantalum oxide; niobium oxide; hafnium oxide; cerium oxide; magnesium oxide; neodymium oxide; gadolinium oxide; thorium oxide; yttrium oxide; scandium oxide; lanthanum oxide; praseodymium oxide; zinc oxide; lead oxide; a mixture group and complex compound group comprising at least two materials selected from a group of silicon oxides; a mixture group and complex compound group comprising at least two materials selected from a group of hafnium oxides; and a mixture group and complex compound group comprising at least two materials selected from a group of aluminum oxides.

The present invention will be more fully understood from the detailed description given hereinbelow and the accompanying drawings, which are given byway of illustration only and are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

BRIEF DESCRIPTION OF THE DRAWINGS

FIG. 14A is a view showing a schematic configuration of the projection exposure apparatus in accordance with a sixth embodiment;

FIG. 14B is a view showing a turret provided with micro fly's eyes lenses;

FIG. 14C is a view showing a turret provided with diffractive optical elements;

FIG. 17A is a view for explaining a function of a diffractive optical element as light source image enlarging member;

FIG. 17B is a view showing a far field pattern formed by a diffractive optical element;

FIG. 17C is a view showing a far field pattern formed by a diffractive optical element;

DESCRIPTION OF THE PREFERRED EMBODIMENTS

Figure 1:
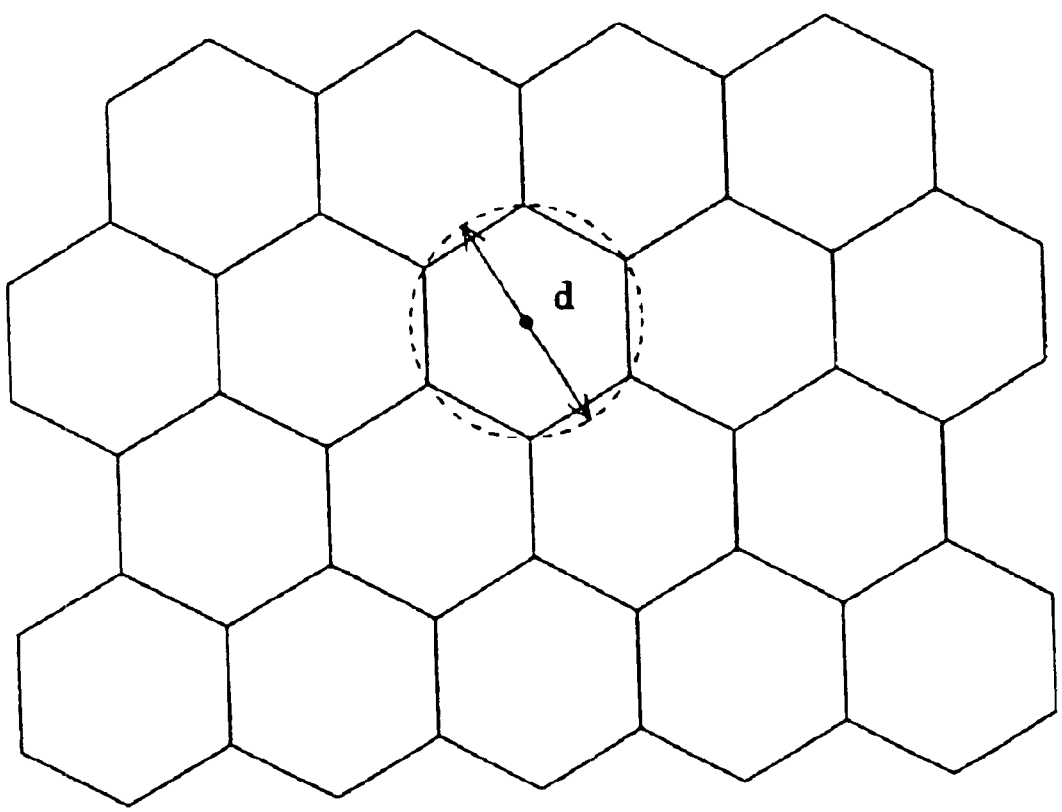
FIG. 1 is a view showing an optical integrator in which the entrance surface and exit surface of each micro lens have regular hexagonal forms with the same size.

First, a case where the entrance surface and exit surface of each of micro lenses constituting an optical integrator have regular hexagonal forms with the same size as shown in FIG. 1 will be considered. In this case, illuminance decreases by the amount of diffraction limit with respect to the entrance surface of each micro lens in marginal areas of an illumination field formed on a surface to be irradiated which is optically conjugate with the entrance surface. Letting d be the diameter of the circle circumscribing the entrance surface and exit surface having a regular hexagonal form, NA be the numerical aperture of the entrance surface of each micro lens (see FIG. 6B), f be the focal length of each micro lens, and $\lambda$ be the wavelength of an incident beam, the width b of marginal areas (see FIG. 6C) on the entrance surface contributing to lowering the illuminance due to the diffraction limit is represented by the following expression (a):

$$b=0.61 \cdot (\lambda/NA)=0.61 \cdot \lambda/[(d/2)/f] \tag{a}$$

For yielding a uniform illuminance distribution substantially over the whole illumination field formed on the surface to be irradiated, it is desirable that the above-mentioned width b be smaller than 1/10 of the size d of the entrance surface, i.e., the following conditional expression (b) be satisfied:

$$0.61 \cdot [\lambda/(d/2)/f] \leq d/10 \tag{b}$$

Conditional expression (b) can be modified, so as to yield the relationship indicated by the following conditional expression (1):

$$(d/2)2/(\lambda \cdot f) \geq 305 \tag{1}$$

For yielding a further uniform illuminance distribution over the illumination field, it is more desirable that the above-mentioned width b be smaller than 1/100 of the size d of the entrance surface, i.e., the following conditional expression (c) be satisfied:

$$0.61 \cdot [\lambda/(d/2)/f] \leq d/100 \tag{c}$$

Conditional expression (c) can be modified, so as to yield the relationship indicated by the following conditional expression (1'):

$$(d/2)2/(\lambda \cdot f) \geq 30.5 \tag{1'}$$

Though the case where the entrance surfaces and exit surfaces of the optical integrator have regular hexagonal forms with the same size is explained in the foregoing, the same applies to a case where the entrance surfaces and exit surfaces have circular forms with the same size.

Figure 2A:
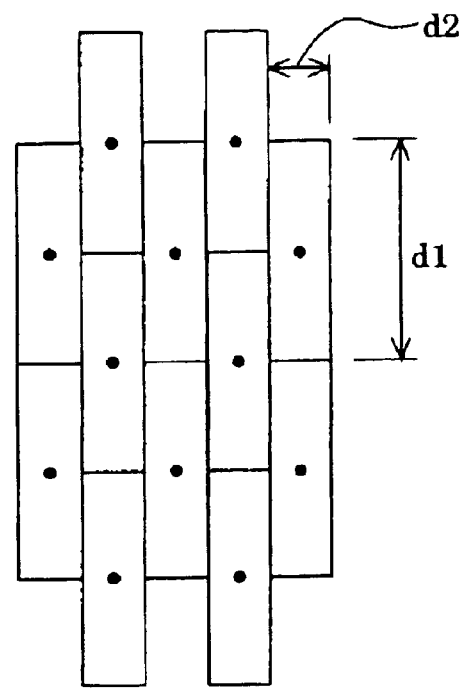
FIG. 2A is a view showing an optical integrator in which the entrance surface of each micro lens has a rectangular form.
Figure 2B:
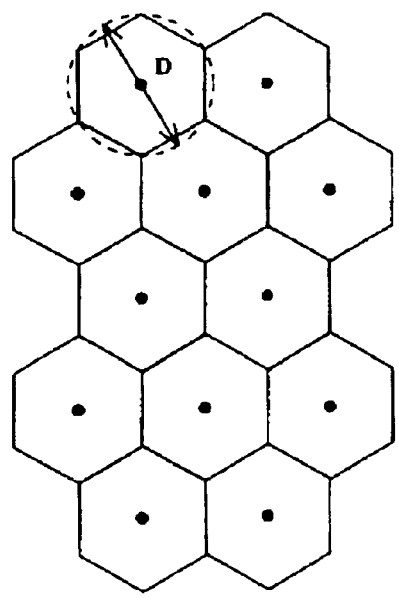
FIG. 2B is a view showing an optical integrator in which the exit surface of each micro lens has a regular hexagonal form.

A case where the entrance surface of each micro lens has a rectangular form as shown in FIG. 2A and the exit surface of each micro lens has a regular hexagonal form as shown in FIG. 2B will now be considered. In this case, letting $d_1$ be the length of the longer side of the rectangular entrance surface, $d_2$ be the length of the shorter side of the rectangular entrance surface, D be the diameter of the circle circumscribing the regular hexagonal exit surface, NA be the numerical aperture of each micro lens, and $\lambda$ be the wavelength of an incident beam, the width b of marginal areas on the entrance surface contributing to lowering the illuminance due to the diffraction limit is represented by the following expression (d):

$$b=0.61 \cdot \lambda/[(D/2)/f] \tag{d}$$

For yielding a uniform illuminance distribution substantially over the whole illumination field formed on the surface to be irradiated, it is desirable that the above-mentioned width b be smaller than 1/10 of the size $d_1$ of the entrance surface in the longer-side direction or smaller than 1/10 of the size $d_2$ thereof in the shorter-side direction, i.e., the following-conditional expression (e) or (f) be satisfied:

$$0.61 \cdot [\lambda/(D/2)/f] \leq d_1/10 \tag{e}$$

$$0.61 \cdot [\lambda/(D/2)/f] \leq d_2/10 \tag{f}$$

Conditional expressions (e) and (f) can be modified, so as to yield the respective relationships indicated by the following conditional expressions (2) and (3):

$$(d_1/2)(D/2)/(\lambda \cdot f) \geq 3.05 \tag{2}$$

$$(d_2/2)(D/2)/(\lambda \cdot f) \geq 3.05 \tag{3}$$

For yielding a further uniform illuminance distribution substantially over the whole illumination field, it is desirable that the above-mentioned width b be smaller than 1/100 of the size $d_1$ of the entrance surface in the longer-side direction or smaller than 1/100 of the size $d_2$ thereof in the shorter-side direction, i.e., the following conditional expression (g) or (h) be satisfied:

$$0.61 \cdot [\lambda/(D/2)/f] \leq d_1/100 \tag{g}$$

$$0.61 \cdot [\lambda/(D/2)/f] \leq d_2/100 \tag{h}$$

Conditional expressions (g) and (h) can be modified, so as to yield the respective relationships indicated by the following conditional expressions (2') and (3'):

$$(d_1/2)(D/2)/(\lambda \cdot f) \geq 30.5 \tag{2'}$$

$$(d_2/2)(D/2)/(\lambda \cdot f) \geq 30.5 \tag{3'}$$

If the exit surface is completely regular hexagonal, then it is necessary for the ratio between the length $d_1$ of the longer side of the entrance surface and the length $d_2$ of the shorter side to satisfy the relationship indicated by the following expression (i):

$$d_1 : d_2 = 3 : \sqrt{3}/2 \text{ or } 1.5 : \sqrt{3} \tag{i}$$

Here, $\sqrt{3}$ indicates the square root of 3. Meanwhile, it is necessary for the form of the entrance surface of an optical integrator to be set similar to the form of an illumination area (illumination field) to be formed on the surface to be irradiated. Therefore, in practice, the entrance surface is set to a predetermined rectangular form, and the form of the exit surface is set to a hexagonal form approximating a regular hexagonal form according to the form of entrance surface.

Though the case where the exit surfaces of the optical integrator have a regular hexagonal form is explained in the foregoing, the same applies to a case where the exit surfaces have circular forms. Preferably, the exit surfaces of the optical integrator have a form similar to the form of its light source. In the case of a lamp light source, substantially circular forms and regular hexagonal forms are effective.

Figure 3A:
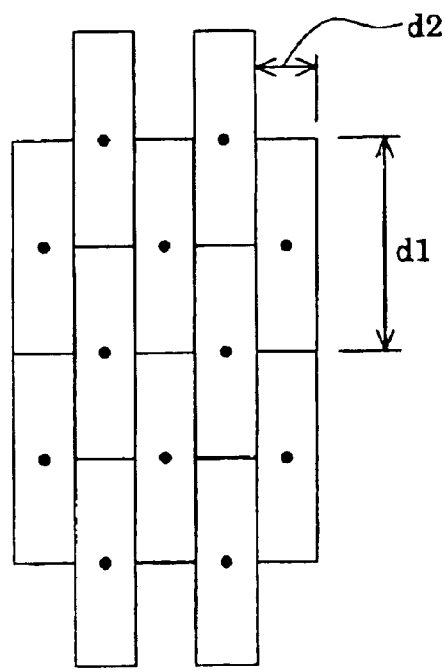
FIG. 3A is a view showing an optical integrator in which the entrance surface of each micro lens has a rectangular form.
Figure 3B:
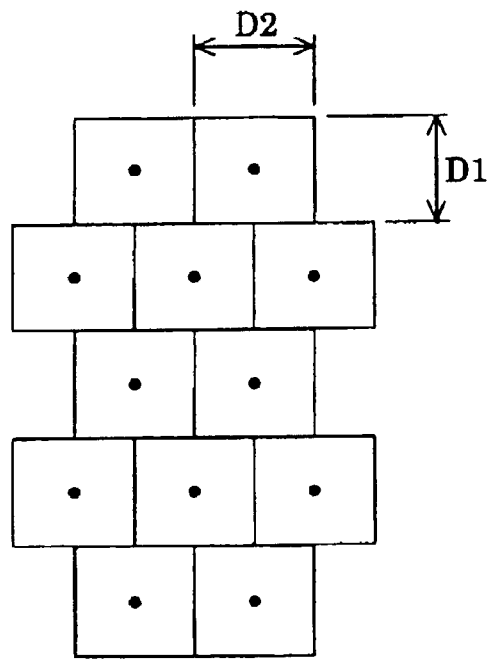
FIG. 3B is a view showing an optical integrator in which the exit surface of each micro lens has a rectangular form.

A case where the entrance surface and exit surface of each micro lens have rectangular forms as shown in FIGS. 3A and 3B will now be considered. In this case, letting $d_1$ be the length of the longer side of the rectangular entrance surface, $d_2$ be the length of the shorter side of the rectangular entrance surface, $D_1$ be the length of the rectangular exit surface along a direction corresponding to the longer-side direction of the entrance surface, $D_2$ be the length of the rectangular exit surface along a direction corresponding to the shorter-side direction of the entrance surface, NA be the numerical aperture of each micro lens, f be the focal length of each micro lens, and $\lambda$ be the wavelength of an incident beam, the respective widths $b_1$ and $b_2$ along the longer-side direction and shorter-side direction of marginal areas on the entrance surface contributing to lowering the illuminance due to the diffraction limit is represented by the following expressions (j) and (k):

$$b_1 = 0.61 \cdot \lambda/[(D_1/2)/f] \tag{j}$$

$$b_2 = 0.61 \cdot \lambda/[(D_2/2)/f] \tag{k}$$

For yielding a uniform illuminance distribution substantially over the whole illumination field formed on the surface to be irradiated, it is desirable that the above-mentioned width $b_1$ be smaller than $1/10$ of the size $d_1$ of the entrance surface in the longer-side direction or the above-mentioned width $b_2$ be smaller than $1/10$ of the size $d_2$ of the entrance surface in the shorter-side direction, i.e., the following conditional expression (m) or (n) be satisfied:

$$0.61 \cdot \lambda/[(D_1/2)/f] \leq d_1/10 \tag{m}$$

$$0.61 \cdot \lambda/[(D_2/2)/f] \leq d_2/10 \tag{n}$$

Conditional expressions (m) and (n) can be modified, so as to yield the respective relationships indicated by the following conditional expressions (4) and (5):

$$(d_1/2)(D_1/2)/(\lambda \cdot f) \geq 3.05 \tag{4}$$

$$(d_2/2)(D_2/2)/(\lambda \cdot f) \geq 3.05 \tag{5}$$

For yielding a further uniform illuminance distribution substantially over the whole illumination field, it is desirable that the above-mentioned width $b_1$ be smaller than $1/100$ of the size $d_1$ of the entrance surface in the longer-side direction or the above-mentioned width $b_2$ be smaller than $1/100$ of the size $d_2$ of the entrance surface in the shorter-side direction, i.e., the following conditional expression (p) or (q) be satisfied:

$$0.61 \cdot \lambda/[(D_1/2)/f] \leq d_1/100 \tag{p}$$

$$0.61 \cdot \lambda/[(D_2/2)/f] \leq d_2/100 \tag{q}$$

Conditional expressions (p) and (q) can be modified, so as to yield the respective relationships indicated by the following conditional expressions (4') and (5'):

$$(d_1/2)(D_1/2)/(\lambda \cdot f) \geq 30.5 \tag{4'}$$

$$(d_2/2)(D_2/2)/(\lambda \cdot f) \geq 30.5 \tag{5'}$$

Finally, a case where both of the entrance surface and exit surface of each micro lens have rectangular forms with the same size will be considered. In this case, letting $d_1$ be the length of the longer side of the rectangular entrance and exit surfaces, $d_2$ be the length of the shorter side of the rectangular entrance and exit surfaces, NA be the numerical aperture of each micro lens, f be the focal length of each micro lens, and $\lambda$ be the wavelength of an incident beam, the width b of marginal areas on the entrance surface contributing to lowering the illuminance due to the diffraction limit is represented by the following expression (r):

$$b = 0.61 \cdot \lambda/[(d_1/2)/f] \tag{r}$$

For yielding a uniform illuminance distribution substantially over the whole illumination field formed on the surface to be irradiated, it is desirable that the above-mentioned width b be smaller than $1/10$ of the size $d_1$ of the entrance surface in the longer-side direction or smaller than $1/10$ of the size $d_2$ thereof in the shorter-side direction, i.e., the following conditional expression (s) or (t) be satisfied:

$$0.61 \cdot \lambda/[(d_1/2)/f] \leq d_1/10 \tag{s}$$

$$0.61 \cdot \lambda/[(d_2/2)/f] \leq d_2/10 \tag{s}$$

Conditional expressions (s) and (t) can be modified, so as to yield the respective relationships indicated by the following conditional expressions (6) and (7):

$$(d_1/2)2/(\lambda \cdot f) \geq 3.05 \tag{6}$$

$$(d_2/2)2/(\lambda \cdot f) \geq 3.05 \tag{6}$$

For yielding a further uniform illuminance distribution substantially over the whole illumination field, it is desirable that the above-mentioned width b be smaller than $1/100$ of the size $d_1$ of the entrance surface in the longer-side direction or smaller than $1/100$ of the size $d_2$ thereof in the shorter-side direction, i.e., the following conditional expression (u) or (v) be satisfied:

$$0.61 \cdot \lambda/[(d_1/2)/f] \leq d_1/100 \tag{u}$$

$$0.61 \cdot \lambda/[(d_2/2)/f] \leq d_2/100 \tag{v}$$

Conditional expressions (u) and (v) can be modified, so as to yield the respective relationships indicated by the following conditional expressions (6') and (7'):

$$(d_1/2)2/(\lambda \cdot f) \geq 30.5 \qquad (6')$$

$$(d_2/2)2/(\lambda \cdot f) \geq 30.5 \qquad (7')$$

Embodiments of the present invention will be explained with reference to the accompanying drawings.

First Embodiment

Figure 5:
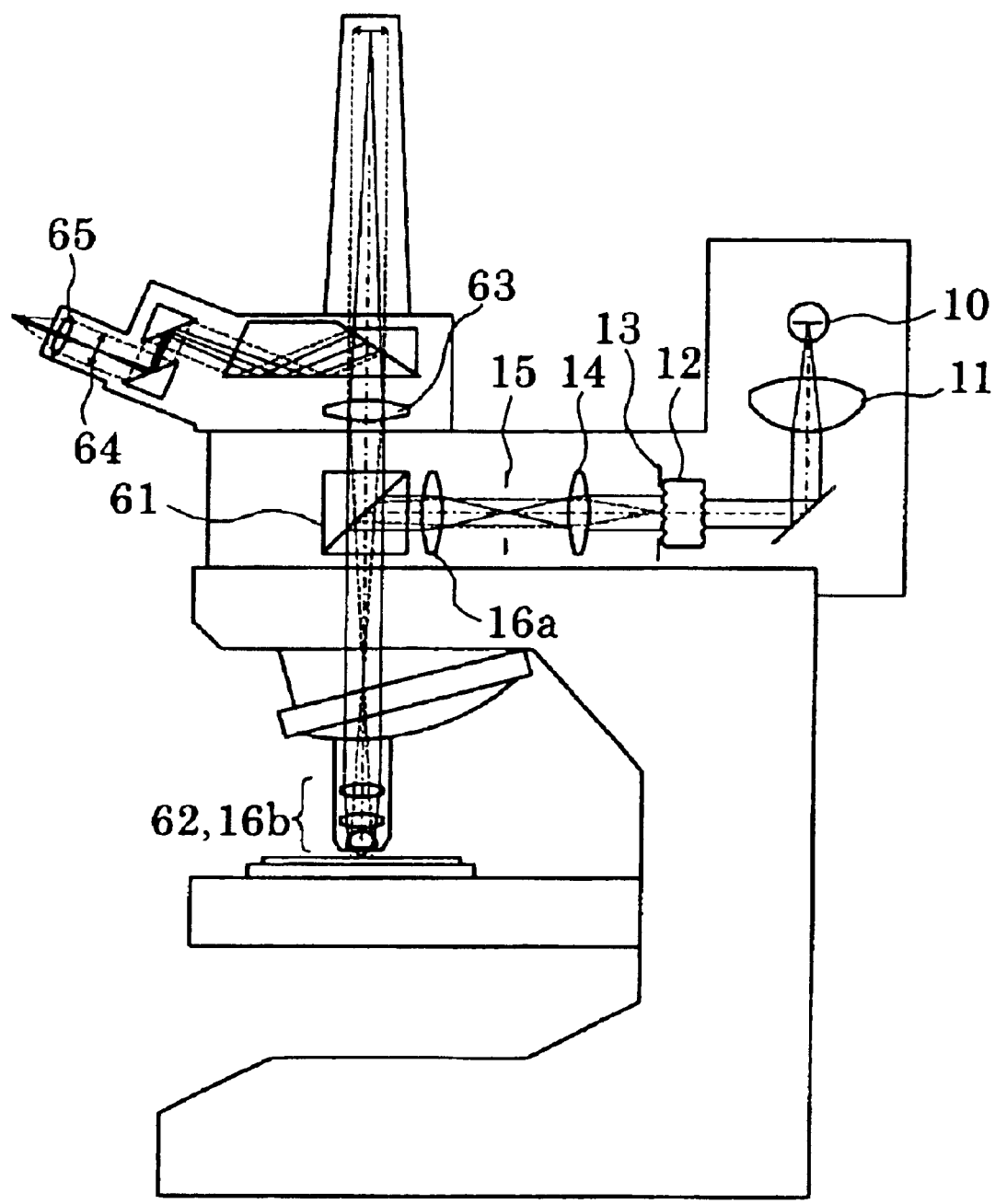
FIG. 5 is a view schematically showing the configuration of the microscope in accordance with a first embodiment.

FIG. 5 is a view schematically showing a microscope (observation apparatus) in accordance with an embodiment of the present invention. The microscope in accordance with the first embodiment is an epi-illumination (a vertical incident illumination) type microscope, in which a beam from an illumination field formed at the position of a field stop is made incident on a beam splitter 61 by way of a front lens group 16a of an image forming optical system 16. The beam reflected by the beam splitter 61 vertical-incident-illuminates an object surface by way of a rear lens group 16b of the image forming optical system 16. The reflected light from the object surface is made incident on the beam splitter 61 by way of a first objective lens 62 (i.e., the rear lens group 16b of the image forming optical system 16). The light transmitted through the beam splitter 61 forms an observation object image 64 by way of a second objective lens 63. This observation object image 64 is observed under enlarged magnification by way of an eyepiece 65.

Figure 6A:
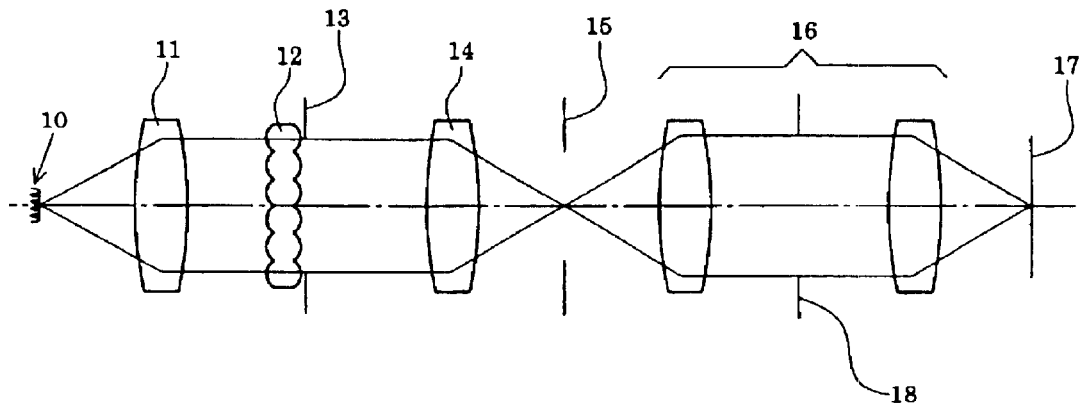
FIG. 6A is a view showing the illumination optical apparatus included in the microscope in accordance with the first embodiment.
Figure 6B:
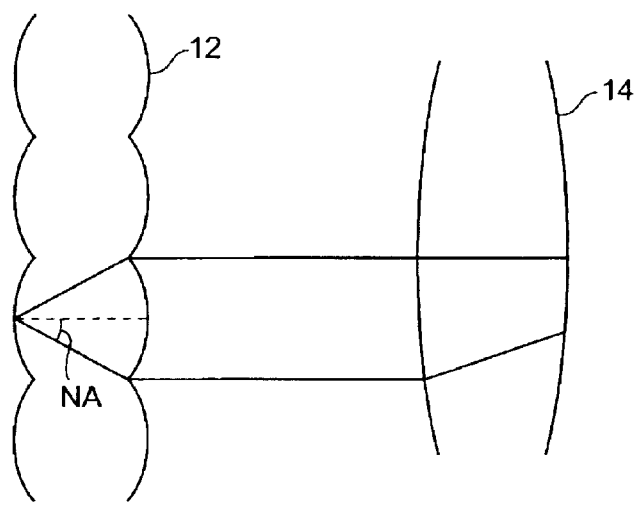
FIG. 6B is a view for explaining the numerical aperture of a micro lens included in the illumination optical apparatus.
Figure 6C:
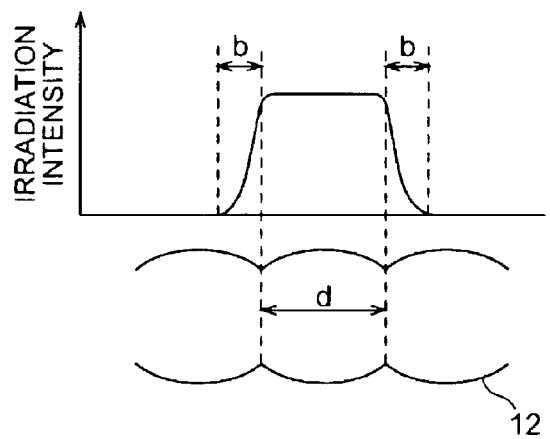
FIG. 6C is a chart showing an illuminance distribution of light incident on a micro lens.

The illumination optical apparatus included in the microscope in accordance with the first embodiment will now be explained with reference to FIG. 6A. FIG. 6A is a view schematically showing the configuration of the illumination optical apparatus included in the microscope. The illumination optical apparatus is equipped with a halogen lamp 10, for example, as a light source for supplying illumination light. A beam from the halogen lamp 10 is turned into a substantially parallel beam by way of a collimator lens 11 and is made incident on a micro fly's eye lens 12 acting as a wavefront dividing type optical integrator. As shown in FIGS. 1 and 5, the micro fly's eye lens 12 is an optical element composed of a number of micro lenses densely arranged in a matrix, each having a positive refracting power, whereas the entrance surface and exit surface of each micro lens have regular hexagonal forms with the same size (size d). The micro fly's eye lens 12 is constructed, for example, by etching a plane-parallel glass sheet so as to form a micro lens group.

Hence, the beam incident on the micro fly's eye lens 12 is two-dimensionally divided by a number of micro lenses, so that a substantial surface light source (hereinafter referred to as "secondary light source") composed of a number of light sources is formed at the image-side focal plane of the micro fly's eye lens 12. The beam from the secondary light source formed at the image-side focal plane of the micro fly's eye lens 12 is restricted by an aperture stop 13 disposed in the vicinity thereof and then is collected by a condenser lens 14, so as to form an illumination field at the image-side focal plane of the condenser lens 14. A field stop 15 is located at a position where the illumination field is formed (i.e., the image-side focal plane of the condenser lens 14). Thus, the collimator lens 11, micro fly's eye lens 12, and condenser lens 14 constitute multiple beam superimposing member for forming a number of light sources according to the beam from the light source 10 and forming an illumination field which is a region on a predetermined surface where beam from the light sources are superimposed.

The beam from the illumination field having passed through the field stop 15 illuminates, by way of the image forming optical system 16, an object surf ace (sample surface) 17 to be observed. Here, the field stop 15 and the object surface 17 as the surface to be irradiated are disposed so as to become optically conjugate with each other by way of the image forming optical system 16. As a consequence, an illumination area as an image of the opening portion of the field stop 15 (i.e., an image of the illumination field) is formed on the object surface 17. An aperture stop 18 for blocking unnecessary light which causes flare and the like is disposed near the pupil plane of the image forming optical system 16. Though basic performances of the illumination optical apparatus will be satisfied if only one of the aperture stops 13 and 18 is disposed, it is desirable that both aperture stops 13 and 18 be provided in order to favorably restrain flare from occurring and so forth Also, it is preferred that the aperture stop 13 and/or aperture stop 18 have a variable opening portion.

Second Embodiment

Figure 7:
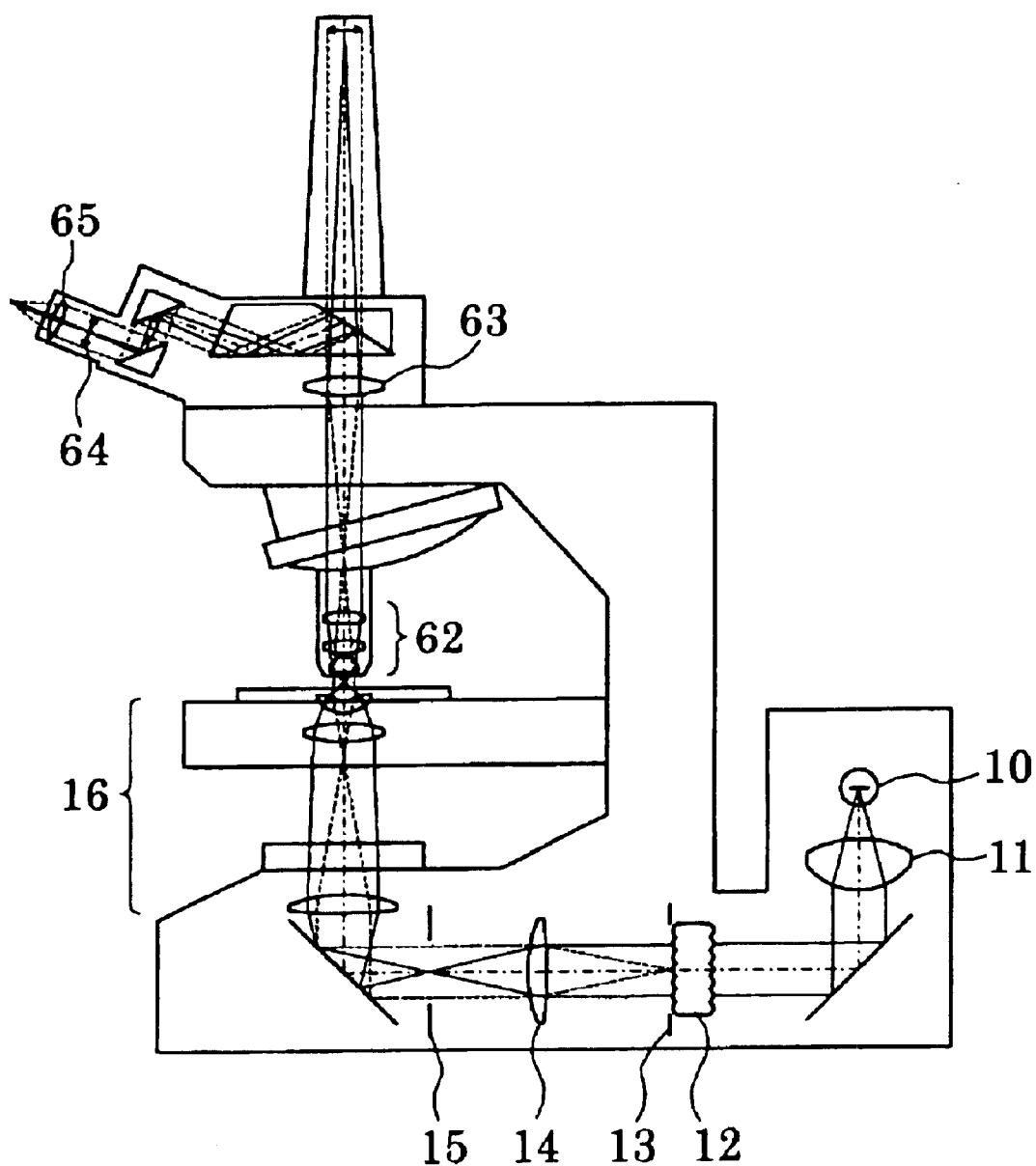
FIG. 7 is a view schematically showing the configuration of the microscope in accordance with a second embodiment.

The microscope in accordance with a second embodiment of the present invention will now be explained with reference to FIG. 7. The microscope in accordance with the second embodiment is a transmitted illumination (a vertical transmitted illumination) type microscope, in which a beam from an illumination field formed at the position of a field stop 15 illuminates an object surface from thereunder by way of an image forming optical system 16. The light transmitted through the object surface forms an observation object image 64 by way of a first objective lens 62 and a second objective lens 63. This observation object image 64 is observed under enlarged magnification byway of an eyepiece 65. The illumination optical apparatus included in the microscope in accordance with the second embodiment is the illumination optical apparatus shown in FIG.5, too. In FIGS. 6A and 7, the aperture stop 18 is not depicted.

In the illumination optical apparatus included in the microscopes of the first and second embodiments, the micro fly's eye lens 12 is configured so as to satisfy the above-mentioned conditional expression (1). Therefore, in the illumination field formed at the position of the field stop 15 and, consequently, in the illumination area (illumination field) formed at the object surface 17, which is a surface to be irradiated, the width of marginal areas where illuminance decreases can be kept small, so that a uniform illuminance distribution can be obtained substantially over the whole illumination area. If the micro fly's eye lens 12 is configured so as to satisfy the above-mentioned conditional expression (1'), then the width of marginal areas where illuminance decreases can be kept smaller, so that a further uniform illuminance distribution can be obtained substantially over the whole illumination area.

Third Embodiment

Figure 8:
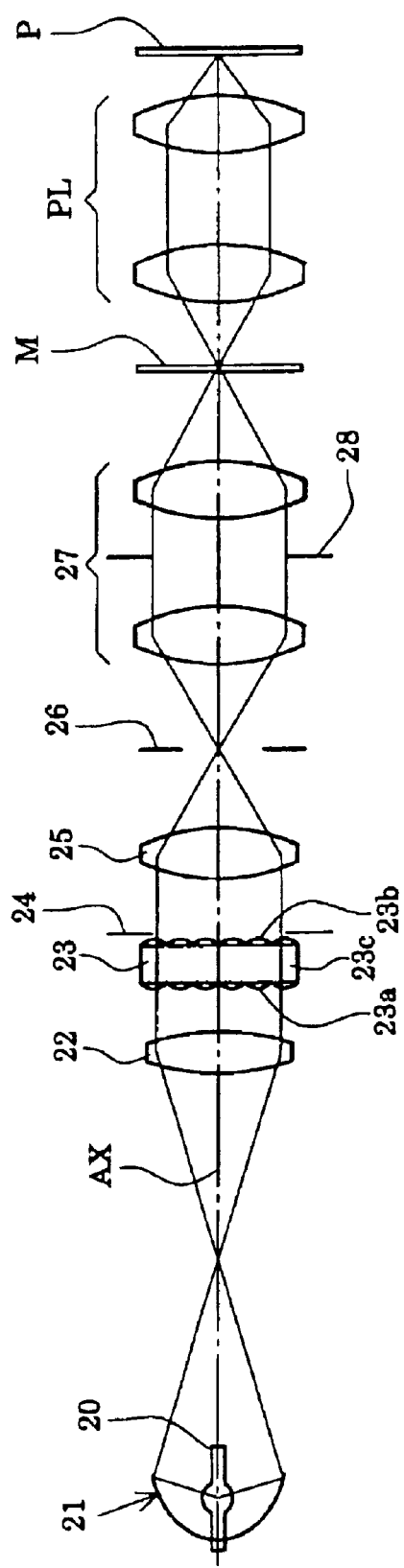
FIG. 8 is a view schematically showing the configuration of the exposure apparatus in accordance with a third embodiment.

FIG. 8 is a view schematically showing the configuration of a photolithographic exposure apparatus in accordance with a third embodiment of the present invention. The exposure apparatus employs an super-high pressure mercury lamp as its light source, and is used for making a liquid crystal display device. The exposure apparatus in accordance with the third embodiment is equipped with a light source 20 comprising an super-high pressure mercury lamp supplying light including an emission line of i-line, for example. The light source 20 is positioned at a first focal position of an elliptical mirror 21 having an elliptical reflecting surface which has rotational symmetry about an optical axis AX. As a consequence, an illumination beam emitted from the light source 20 forms a light source image at a second focal position of the elliptical mirror 21.

A divergent beam from the light source image formed at the second focal position of the elliptical mirror 21 is converted into a substantially parallel beam by a collimator lens 22, and then enters a wavefront dividing type optical integrator 23 by way of a wavelength selecting filter (not depicted). The wavelength selecting filter chooses only the ray at i-line (365 nm) as exposure light. Here, the wavelength selecting filter may choose ray at g-line (436 nm), h-line (405 nm), and i-line at the same time; ray at g-line and h-line at the same time; and ray at h-line and i-line at the same time, for example.

In the optical integrator 23, as shown in FIG. 8, a plane-parallel plate 23c having a predetermined thickness is interposed between a first micro lens group (bundle) 23a on the entrance side and a second micro lens group (bundle) 23b on the exit side, and they are integrally constructed. Here, the first micro lens group 23a on the entrance side is composed of a number of rectangular ($d_1 \times d_2$) micro lenses, each having a positive refracting power, densely arranged in a matrix as shown in FIG. 2A. On the other hand, the second micro lens group 23b is composed of a number of regular hexagonal (size D) micro lenses, each having a positive refracting power, densely arranged in a matrix as shown in FIG. 2B. The first micro lens group 23a on the entrance side and the second micro lens group 23b on the exit side are formed by a mold method, for example, such that respective optical axes of micro lenses corresponding to each other strictly align with each other.

In this case, a micro lens constituting the optical integrator 23 is composed of one first micro lens in the first micro lens group 23a on the entrance side and one second micro lens corresponding thereto in the second micro lens group 23b on the exit side. The focal length of the micro lens constituting the optical integrator 23 is a composite focal length of the above-mentioned first and second micro lenses. Here, the plane-parallel plate 23c having a predetermined thickness may be interposed between the first micro lens group 23a on the entrance side and the second micro lens group 23b on the exit side, and they may be joined together with an adhesive or the like. For a further detailed configuration of the optical integrator 23, reference can be made to the disclosure of U.S. Pat. No. 5,594,526 (e.g., FIGS. 6 and 7).

Thus, a secondary light source composed of a number of light sources is formed at the image-side focal plane of the optical integrator 23. A beam from the secondary light source is restricted by an aperture stop 24 disposed near the image-side focal plane of the optical integrator 23, and then is made incident on a condenser lens 25. The aperture stop 24 has an opening portion, disposed at a position (illumination pupil position) optically conjugate with the entrance pupil plane of a projection optical system PL which will be mentioned later, for defining the area of the secondary light source contributing to illumination. Also, the aperture stop 24 is disposed at the object-side focal plane of the condenser lens 25.

As a consequence, a beam collected by way of the condenser lens 25 illuminates, in a superimposing manner, an illumination field stop 26 for defining the illumination area (illumination field) of a mask M which will be mentioned later. The beam having passed through a rectangular opening portion of the illumination field stop 26 illuminates, in a superimposing manner by way of an image forming optical system 27, the mask M formed with a predetermined transfer pattern. Thus, an image of the opening portion of the illumination field stop 26, i.e., a rectangular illumination area similar to the cross-sectional form of the first micro lenses of the optical integrator 23, is formed on the mask M.

An aperture stop 28 for blocking unnecessary light which causes flare and the like is disposed near the pupil plane of the image forming optical system 27 (a position optically conjugate with the entrance pupil plane of the projection optical system PL). Such use of aperture stop 28 is applicable not only to an illumination apparatus using a micro fly's eye lens as with this embodiment, but also to illumination optical apparatus using an internal reflection type integrator.

The mask M is held on a mask stage (not depicted) which is two-dimensionally movable along a mask surface. Positional coordinates of the mask stage are configured so as to be measured by an interferometer (not depicted) and controlled in terms of position. A beam transmitted through the pattern of the mask M forms an image of the mask pattern onto a plate P, which is a photosensitive substrate, by way of the projection optical system PL. The plate P is held on a plate stage (not depicted) which is two-dimensionally movable along a plate surface. Positional coordinates of the plate stage are configured so as to be measured by an interferometer (not depicted) and controlled in terms of position.

Thus, when batch exposure or scan exposure is carried out while the plate P is two-dimensionally driven and controlled within a plane orthogonal to the optical axis of the projection optical system PL, individual exposure areas of the plate P are successively exposed to the pattern of the mask M. In the batch exposure, the individual exposure areas of the plate P are batch exposed to the mask pattern according to so-called step-and-repeat technique. In the scan exposure, on the other hand, exposure with scanning is carried out while the mask M and the plate P are moved relative to the projection optical system PL along a direction (scanning direction) optically corresponding to the shorter-side direction of the rectangular entrance surface of the optical integrator 23 (i.e., the shorter-side direction of the rectangular illumination area formed on the mask M) according to so-called step-and-scan technique, whereby individual exposure areas of the plate P are successively exposed to the pattern of the mask M.

In the exposure apparatus in accordance with the third embodiment, the optical integrator 23 is configured so as to satisfy at least one of the above-mentioned conditional expressions (2) and (3). Therefore, in the illumination area (exposure area) formed on the mask M that is the surface to be irradiated and, consequently, on the plate P, the width of marginal portions where illuminance decreases can be kept small, whereby a uniform illumination distribution can be obtained substantially over the whole illumination area. If the optical integrator 23 is configured so as to satisfy at least one of conditional expressions (2') and (3'), then the width of marginal portions where illuminance decreases can be kept smaller, whereby a further uniform illumination distribution can be obtained substantially over the whole illumination area.

Meanwhile, when carrying out scan exposure in the exposure apparatus in accordance with the third embodiment, the illuminance distribution along the scanning direction (the direction optically corresponding to the shorter-side direction of the rectangular entrance surface of the optical integrator 23) is smoothed by an action of the scan exposure, whereby it is preferred that conditional expression (2) concerning the longer-side direction of the rectangular entrance surface of the optical integrator 23 in two conditional expressions (2) and (3) be satisfied. Similarly, when carrying out scan exposure in the third embodiment, it is further preferred that conditional expression (2') be satisfied.

In the third embodiment, the first micro lens group 23a on the entrance side is composed of a number of rectangular micro lenses, whereas the second micro lens group 23b on the exit side is composed of a number of regular hexagonal micro lenses. However, a modified example is possible in which, as shown in FIG. 3, the first micro lens group 23a on the entrance side is composed of a number of rectangular ($d_1 \times d_2$) micro lenses, whereas the second micro lens group 23b on the exit side is composed of a number of rectangular ($D_1 \times D_2$) micro lenses. In the case of this modified example, one of the above-mentioned conditional expressions (4) and (5) is preferably satisfied, and one of the above-mentioned conditional expressions (4') and (5') is more preferably satisfied. When carrying out scan exposure in the modified example, conditional expression (4) concerning the longer-side direction of the rectangular entrance surface is preferably satisfied, and conditional expression (4') is more preferably satisfied.

Fourth Embodiment

Figure 9:
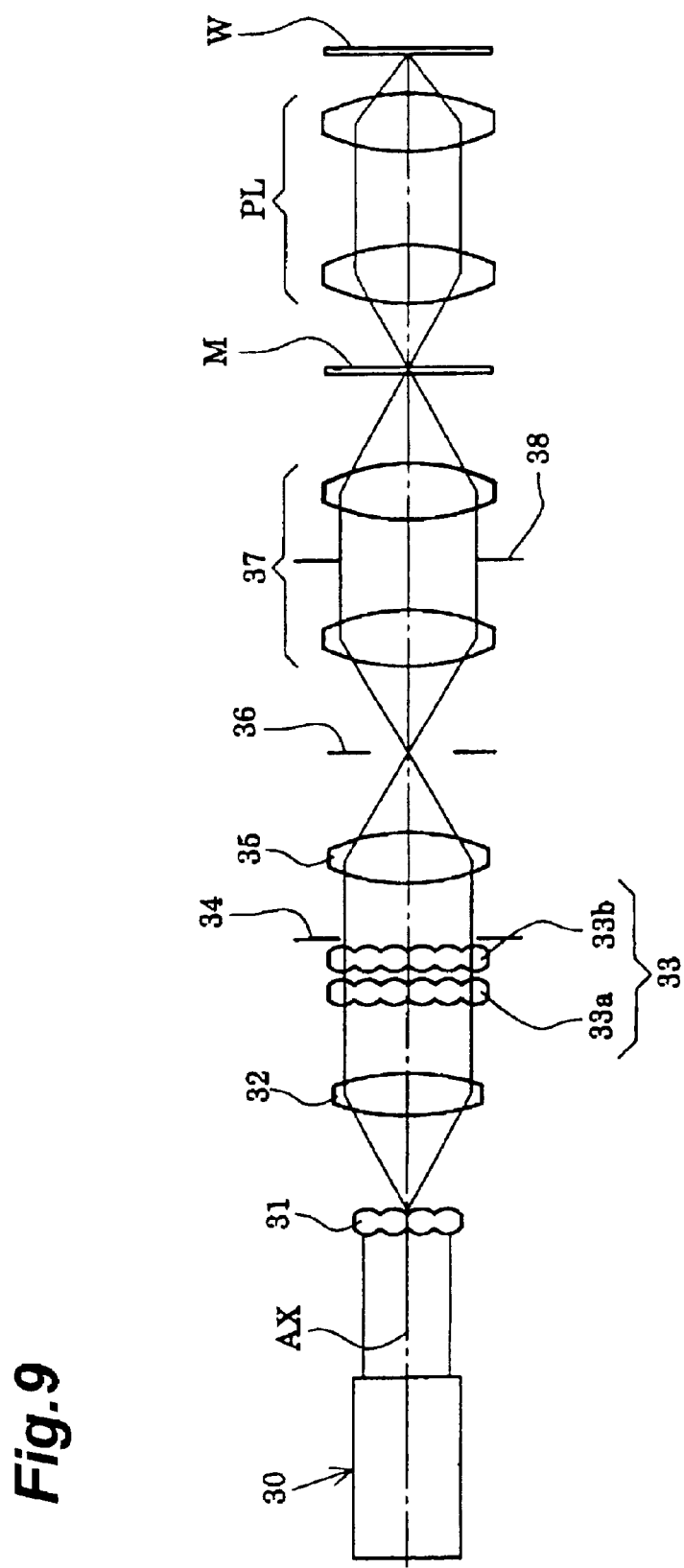
FIG. 9 is a view schematically showing the configuration of the exposure apparatus in accordance with a fourth embodiment.

FIG. 9 is a view showing the configuration of the exposure apparatus in accordance with a fourth embodiment of the present invention. In the exposure apparatus in accordance with the fourth embodiment, the present invention is applied to a photolithographic exposure apparatus using an excimer laser light source for making a semiconductor device. The exposure apparatus is equipped with an excimer laser light source for supplying light having a wavelength of 248 nm (KrF) or 193 nm (ArF), for example, as a light source 30 for supplying exposure light (illumination light). A substantially parallel beam emitted from the light source 30 is shaped into a beam having a predetermined rectangular cross section by way of a beam expander (not depicted) and then is made incident on a micro fly's eye lens 31.

The micro fly's eye lens 31 is composed of a number of square micro lenses, each having a positive refracting power, densely arranged in a matrix. Thus, a number of light sources are formed at the image-side focal plane of the micro fly's eye lens 31. Beams from a number of light sources formed at the image-side focal plane of the micro fly's eye lens 31 are made incident on a wavefront dividing type optical integrator 33 by way of a first condenser lens 32. As shown in FIG. 9, the optical integrator 33 is constituted by a first micro fly's eye lens 33a disposed on the entrance side and a second micro fly's eye lens 33b disposed on the exit side.

Figure 4:
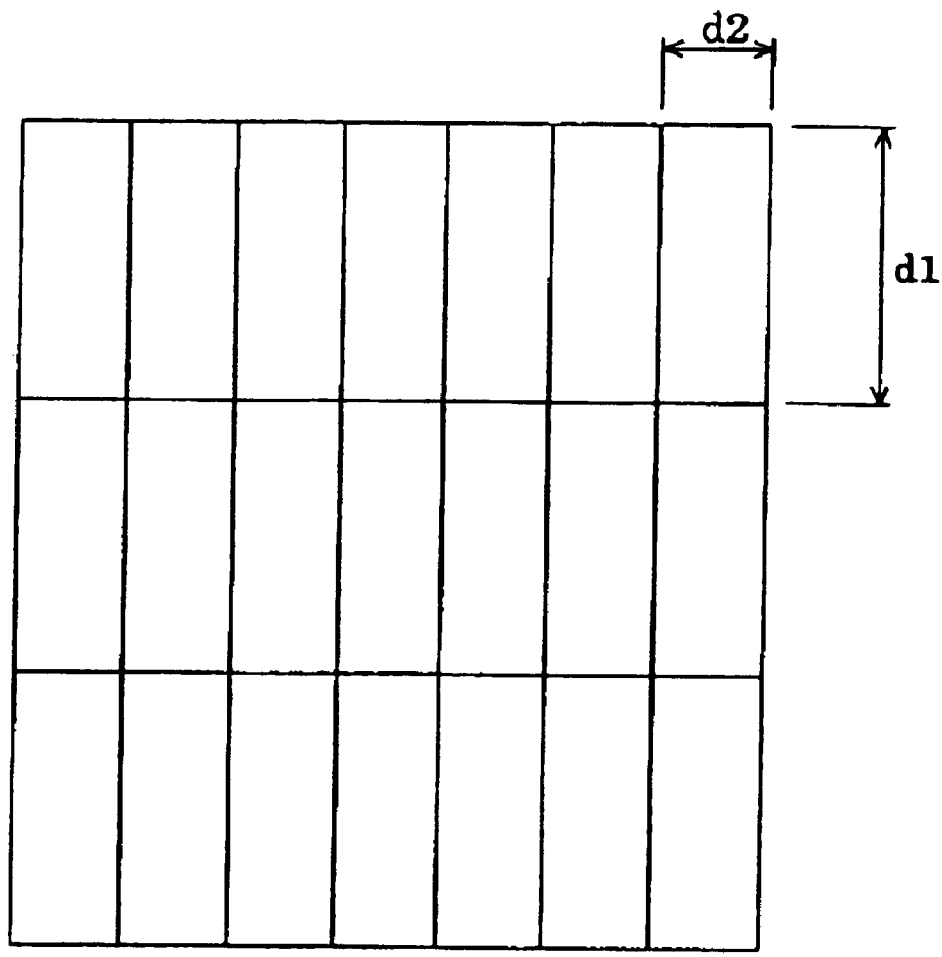
FIG. 4 is a view showing an optical integrator in which the entrance 'surface and exit surface of each micro lens have rectangular forms with the same size.

Here, as shown in FIG. 4, each of the first micro fly's eye lens 33a on the entrance side and the second micro fly's eye lens 33b on the exit side is composed of a number of rectangular micro lenses, each having a positive refracting power, densely arranged in a matrix. Also, each of first micro lenses constituting the first micro fly's eye lens 33a on the entrance side and each of second micro lenses constituting the second micro fly's eye lens 33b on the exit side have rectangular ($d_1 \times d_2$) forms with the same size. Further, the first micro fly's eye lens 33a and the second micro fly's eye lens 33b are positioned with respect to each other such that the optical axis of each first micro lens strictly aligns with the optical axis of its corresponding second micro lens.

In this case, a micro lens constituting the optical integrator 33 is constituted by a first micro lens constituting the first micro fly's eye lens 33a on the entrance side and a second micro lens constituting the second micro fly's eye lens 33b on the exit side. The focal length of each micro lens constituting the optical integrator 33 is a composite focal length of the above-mentioned first and second micro lenses. It is preferred that cover glasses be disposed on the entrance side and exit side of the optical integrator 33. Also, the radius of curvature of the first micro lenses constituting the first micro fly's eye lens 33a and that of the second micro lenses constituting the second micro fly's eye lens 33b may be made slightly different from each other, so that the object-side focal position coincides with the entrance surface of the first micro fly's eye lens 33a while the image-side focal position thereof resides in a space on the exit side of the second micro fly's eye lens 33b. In this case, there are advantages from the viewpoints of light energy quantity and endurance to laser.

A specific numerical example of first and second micro lenses constituting the first and second fly's eyes lens 33a, 33b (micro lenses constituting the optical integrator 33) will now be explained. In the following numerical example, as a mode advantageous in terms of light energy quantity and endurance to laser, the curvature of the outermost exit-side lens surface among the four lens surfaces is set to a value different from that of the other lens surfaces.

In the following table showing the numerical example, the numbers on the left end indicate those of individual lens surfaces counted from the light source side (entrance side of light), r is the radius of apex curvature of lens surface, d is the lens surface distance, and n is the refractive index when the wavelength λ of irradiation light is 248 nm. Also, f is the focal length of an optical system combining the first and second micro lenses together.

All micro lens surfaces constituting the optical integrator 33 in this numerical example have aspheric forms with rotational symmetry. These aspheric surfaces are the represented by the following expression:

$$S(y) = \frac{y^2/r}{1 + \sqrt{1 - y^2/r^2}}$$

where y is the height in a direction perpendicular to the center axis, S(y) is the distance (sag amount) along the center axis from the tangent plane of the apex of each aspheric surface at the height y to the respective aspheric surface, r is the reference radius of curvature (radius of apex curvature), and κ is the conical coefficient.

In the following table, κ indicates the conical coefficient of each lens surface. The size ($d_1 \times d_2$) of each lens surface is indicated at the right end of the table. In the following numerical example, mm can be used as its unit, for instance.

| | \multicolumn{5}{c}{f = 1.336 (mm), λ = 248 (nm)} | | | |
|---|---|---|---|---|---|
| | r | d | n | κ | d1 × d2 |
| (1) | 1.76000 | 1.00000 | 1.50839 | −2.5 | 0.486 × 0.18 (mm) |
| (2) | −1.76000 | 0.40000 | | −2.5 | 0.486 × 0.18 (mm) |
| (3) | 1.76000 | 1.00000 | 1.50839 | −2.5 | 0.486 × 0.18 (mm) |
| (4) | −1.29200 | 0.18542 | | −2.5 | 0.275 × 0.18 (mm) |

Thus configured micro fly's eye lenses satisfy the following expressions:

$$\frac{\frac{d_1}{2} \times \frac{D_1}{2}}{\lambda \times f} = 137.5$$

$$\frac{\frac{d_2}{2} \times \frac{D_2}{2}}{\lambda \times f} = 24.4$$

That is, a uniform illuminance distribution can be obtained substantially over the whole illumination field formed in the above-mentioned numerical example.

In the above-mentioned numerical example, spherical aberration becomes −0.0021, the sine condition unsatisfying amount becomes 0.0051, and coma becomes −0.0004. It can be seen that the above-mentioned numerical example introducing aspheric surfaces as such not only restrains spherical aberration from occurring, but also favorably suppresses the occurrence of coma by substantially satisfying the sine condition.

Thus, a secondary light source composed of a number of light sources is formed at the image-side focal plane of the optical integrator 33. A beam from the secondary light source is restricted by an aperture stop 34 disposed near the image-side focal plane of the optical integrator 33, and then is made incident on a second condenser lens 35. The beam collected by way of the second condenser lens 35 passes through a rectangular opening portion of an illumination field stop 36 and illuminates a mask M in a superimposing manner byway of an image forming optical system 37. Thus, a rectangular illumination area similar to the cross-sectional form of each micro lens of the optical integrator 33 is formed on the mask M. An aperture stop 38 for blocking unnecessary light which causes flare and the like is disposed near the pupil plane of the image forming optical system 37.

The mask M is held on a mask stage (not depicted) which is two-dimensionally movable along a mask surface. Positional coordinates of the mask stage are configured so as to be measured by an interferometer (not depicted) and controlled in terms of position. A beam transmitted through the pattern of the mask M forms an image of the mask pattern onto a wafer W, which is a photosensitive substrate, by way of a projection optical system PL. The wafer W is held on a wafer stage (not depicted) which is two-dimensionally movable along a wafer surface. Positional coordinates of the wafer stage are configured so as to be measured by an interferometer (not depicted) and controlled in terms of position.

Thus, when batch exposure or scan exposure is carried out while the wafer W is two-dimensionally driven and controlled within a plane orthogonal to the optical axis of the projection optical system PL, individual exposure areas of the plate W are successively exposed to the pattern of the mask M. In the batch exposure, the individual exposure areas of the wafer W are batch exposed to the mask pattern according to so-called step-and-repeat technique. In the scan exposure, on the other hand, exposure with scanning is carried out while the mask M and the wafer W are moved relative to the projection optical system PL along a direction (scanning direction) optically corresponding to the shorter-side direction of the rectangular entrance surface of the optical integrator 33 according to so-called step-and-scan technique, whereby individual exposure areas of the wafer W are successively exposed to the pattern of the mask M.

In the fourth embodiment, the optical integrator 33 is configured so as to satisfy at least one of the above-mentioned conditional expressions (6) and (7). The width of marginal portions where illuminance decreases can be kept small, whereby an uniform illumination distribution can be obtained in the substantially over the whole illumination area formed on the mask M that is the surface to be irradiated, and consequently, substantially over the whole exposure area on the wafer W that is the surface to be irradiated. If the optical integrator 33 is configured so as to satisfy at least one of conditional expressions (6') and (7'), then the width of marginal portions where illuminance decreases can be kept smaller, whereby a further uniform illumination distribution can be obtained substantially over the whole illumination area.

Meanwhile, when carrying out scan exposure in the exposure apparatus in accordance with the fourth embodiment, the illuminance distribution along the scanning direction (the direction optically corresponding to the shorter-side direction of the rectangular entrance surface of the optical integrator 33) is averaged smoothed by an action of the scan exposure, whereby it is preferred that conditional expression (6) concerning the longer-side direction of the rectangular entrance surface of the optical integrator 33 in conditional expressions (6) and (7) be satisfied. Similarly, when carrying out scan exposure in the fourth embodiment, it is further preferred that conditional expression (6') be satisfied.

Figure 10:
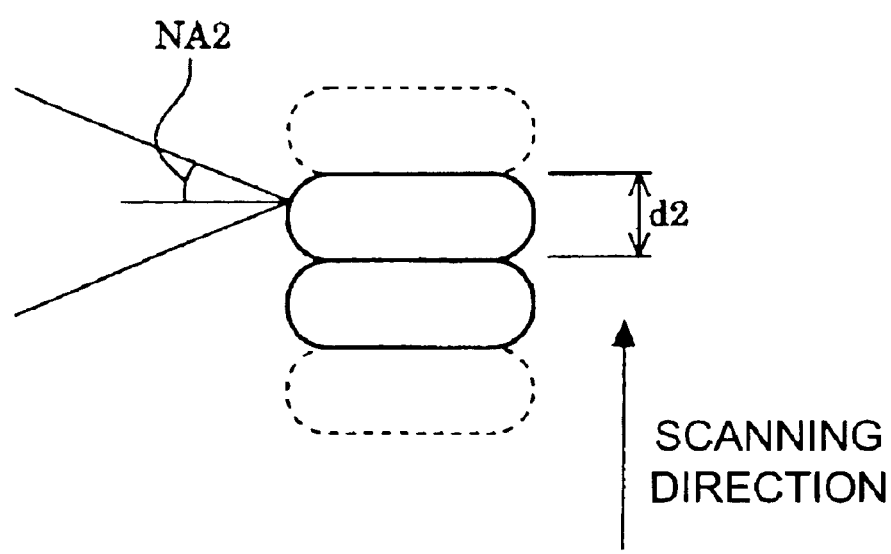
FIG. 10 is a view showing the numerical aperture of a beam incident on given two adjacent micro lenses in an optical integrator and the size of micro lens in a scanning direction.

Meanwhile, in the case of scan exposure using a pulse oscillation light source as with the exposure apparatus in accordance with the fourth embodiment, it is desirable that the phase difference in illumination light between any two adjacent micro lenses in the optical integrator 33 change randomly per pulse. Letting $NA_2$ be the numerical aperture of the incident beam and $d_2$ be the size of micro lens along the scanning direction as shown in FIG. 10, the coherence region at the entrance surface is $\lambda/NA_2$, whereby illumination is effected with $d_2/(\lambda/NA_2)$ sets of phase differences. It is necessary that the number of these sets be at least 10, i.e., the following conditional expression (8) be satisfied. It is further desirable that the lower limit of conditional expression be greater than the number of pulses (which is usually 30 to 50).

$$10 < d_2/(\lambda/NA_2) \tag{8}$$

Though the present invention is applied to illumination optical apparatus for microscopes and photolithographic exposure apparatus in the above-mentioned embodiments, they are not restrictive, and the present invention is also applicable to other common illumination optical apparatus.

In the above-mentioned third and fourth embodiments, the beam from marginal areas where illuminance decreases in the illumination field formed at the image-side focal plane of condenser lenses 25 and 35 may be blocked or not by the aperture stops 24 and 34. When blocking the beam from the marginal areas, the loss in light energy quantity can be kept low since the width of marginal are as where illuminance decreases is kept small in accordance with the present invention.

As explained in the foregoing, the optical integrator of the present invention can yield a uniform irradiation distribution substantially over the whole illumination field formed, even when the size of each micro lens is made small so that the wavefront dividing number is set greater. The illumination optical apparatus incorporating the optical integrator of the present invention therein can therefore irradiate the surface to be irradiated with a uniform illuminance distribution substantially over the whole surface. In addition, the exposure apparatus incorporating the illumination optical apparatus of the present invention therein can illuminate a mask with a uniform illuminance distribution substantially over the whole mask, thus being able to transfer fine patterns of the mask.

Fifth Embodiment

Figure 11:
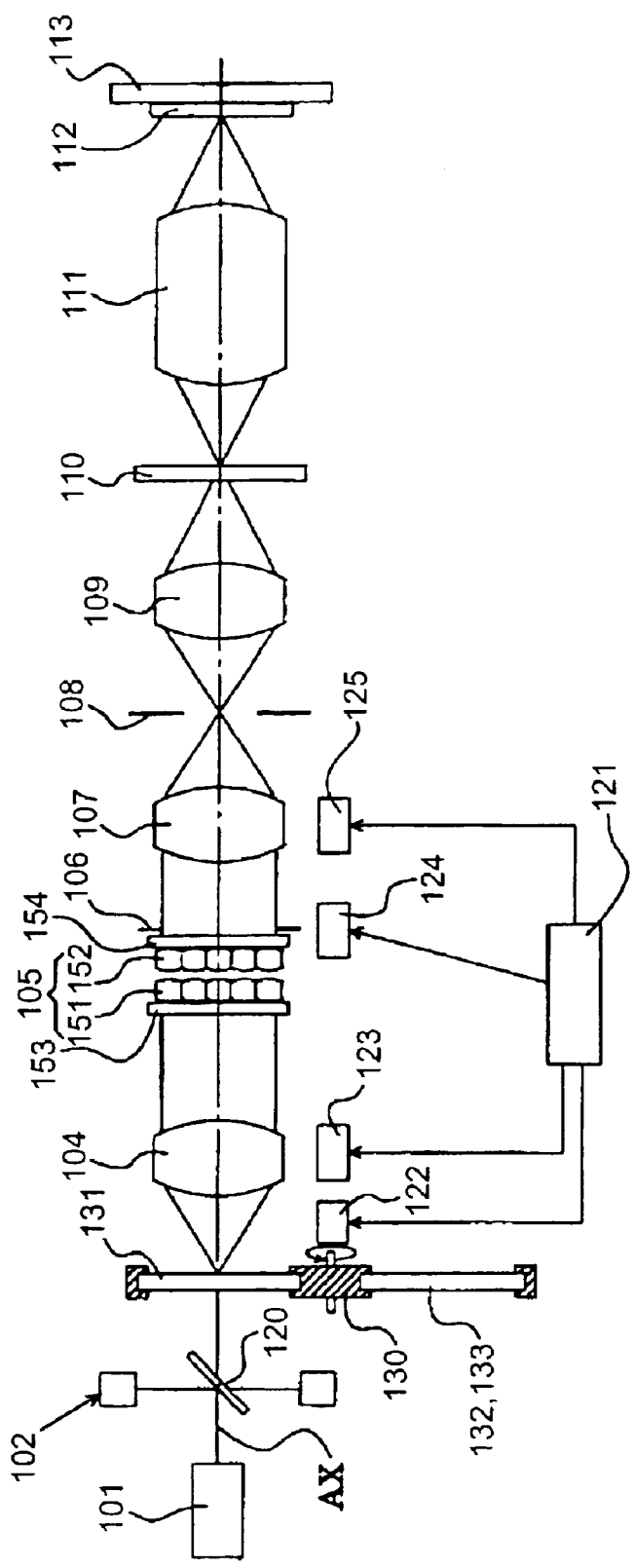
FIG. 11 is a view schematically showing the configuration of the projection exposure apparatus in accordance with a fifth embodiment.

The projection exposure apparatus in accordance with a fifth embodiment of the present invention will now be explained with reference to FIG. 11. FIG. 11 is a view schematically showing a lithographic projection exposure apparatus equipped with an illumination optical apparatus in accordance with an embodiment of the present invention. In the projection exposure apparatus shown in FIG. 11, the illumination optical apparatus is set so as to carry out conventional circular illumination.

The projection exposure apparatus is equipped with an excimer laser light source for supplying light having a wavelength of 248 nm or 193 nm, for example, as a light source 101 for supplying exposure light (illumination light). A substantially parallel beam emitted from the light source 101 along a reference optical axis AX is shaped into a beam having a desirable rectangular cross section by way of a shaping optical system (hot depicted) and then is made incident on an optical delay unit 102.

The beam made incident on the optical delay unit 102 along the optical axis AX is split into a beam transmitted through a half mirror 120 and a beam reflected by the half mirror 120. The beam reflected by the half mirror 120 is successively deflected by four reflecting mirrors (not depicted) which are arranged so as to form a rectangular delay optical path, for example, and then returns to the half mirror 120. The beam reflected by the half mirror 120 a after once traveling through the delay optical path is emitted along the optical axis AX as with the beam transmitted through the half mirror 120 without traveling through the delay optical path, whereby an optical path length difference equal to the optical path length of the delay optical path is provided between the two beams.

Thus, the beam incident on the optical delay unit 102 along the optical axis AX is divided into a plurality of beams with time, whereby an optical path length difference equal to the optical path length of the delay optical path is provided between two beams which are timewise continuous to each other. The optical path length difference provided here is set to the timewise coherence distance of the beam from the coherent light source 101 or longer. As a consequence, coherency (coherence property) can be lowered in the wave train divided by the optical delay unit 102, whereby interference fringes and speckles can favorably be restrained from occurring in the surface to be irradiated. For favorably suppressing the occurrence of speckles, it is preferred that optical delay units such as that mentioned above are arranged in three stages along the optical axis AX. Further detailed configurations and operations concerning this kind of optical delay means are disclosed in specifications, drawings, and the like of Japanese Patent Application Laid-Open No. HEI 1-198759, Japanese Patent Application Laid-Open No. HEI 11-174365, and Japanese Patent Application Laid-Open No. 2000-223405 (U.S. Ser. No. 09/300660), for example.

The beams divided into timewise incoherent multiple pulsed by way of the optical delay unit 102 with time are made incident on a diffractive optical element (DOE) 131. In general, the diffractive optical element is constructed by forming steps in a glass substrate with a pitch on the order of the wavelength of exposure light (illumination light), and acts to diffract incident beams at a desirable angle. Specifically, the diffractive optical element 131 for circular illumination converts a substantially parallel rectangular beam incident along the optical axis AX into a divergent beam having a circular cross section. Meanwhile, since the diffractive optical element is effective in reducing the occurrence of interference fringes and speckles in the surface to be irradiated, the installation of optical delay unit 102 may be omitted when appropriate.

The circular divergent beam having traveled by way of the diffractive optical element 131 is transmitted through a zoom lens 104 acting as a first condenser optical system, and is made incident on multiple light source image forming member 105 constituted by a pair of micro fly's eye lenses 151 and 152. Thus, a circular illumination field is formed at the entrance surface of the multiple light source image forming member 105 (i.e., the entrance surface of the micro fly's eye lens 151 on the light source side). The size of thus formed illumination field (i.e., its diameter) varies depending on the focal length of the zoom lens 104.

In order to prevent the entrance surface of the micro fly's eye lens 151 and the exit surface of the micro fly's eye lens 152 from being contaminated upon photochemical reactions, a pair of plane-parallel plates 153 and 154 are disposed as cover glasses adjacent the entrance surface of the micro fly's eye lens 151 and the exit surface of the micro fly's eye lens 152, respectively. Therefore, even when contamination is generated due to a photochemical reaction, it will be sufficient if only the pair of cover glasses 153 and 154 are replaced without replacing the pair of micro fly's eye lenses 151 and 152 that are positioned and adjusted as will be mentioned later.

Figure 12A:
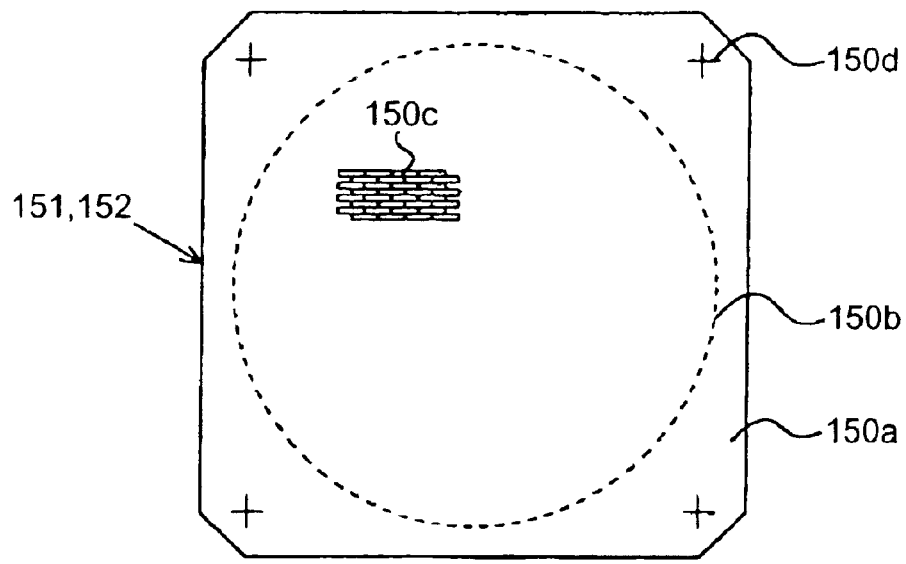
FIG. 12A is a view showing the configuration of each micro fly's eye lens of multiple light source forming member along an optical axis AX.
Figure 12B:
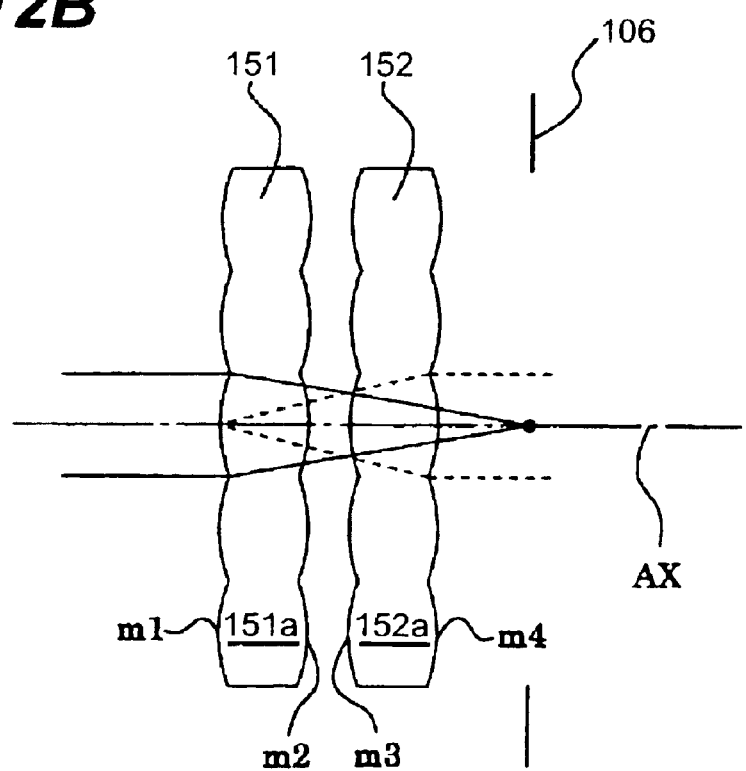
FIG. 12B is a view showing operations and cross-sectional forms of a pair of micro fly's eyes lenses.

FIG. 12A is a view showing the configuration of multiple light source image forming member included in a projection exposure apparatus, illustrating the configuration of each micro fly's eye lens as seen along the optical axis AX, whereas FIG. 12B is a view showing operations and cross-sectional forms of a pair of micro fly's eye lenses.

The individual micro fly's eye lenses 151 and 152 have the same configuration, each being an optical element composed of a number of rectangular micro lens elements 150c, each having a positive refracting power, densely arranged in a matrix as shown in FIGS. 12A and 12B. Each of the micro fly's eye lenses 151 and 152 is constructed by etching a square plane-parallel glass sheet 150a so as to form the micro lens group 150c in a circular area 150b.

In general, each of micro lens elements (each of micro optical elements) constituting a micro fly's eye lens (optical element bundle) is smaller than each of lens elements constituting a fly's eye lens. Also, unlike the fly eye's lens composed of lens elements separated from each other, a number of micro lens elements are integrally formed without being separated from each other in the micro fly's eye lens. Nevertheless, the micro fly's eye lens and the fly's eye lens are in common with each other in that lens elements each having a positive refracting power are arranged in a matrix. The number of micro lens elements constituting the micro fly's eye lenses depicted in FIGS. 11, 12A, and 12B is much smaller than the actual number thereof in order to clarify the drawings.

As a consequence, the beam incident on the pair of micro fly's eye lenses 151 and 152 is two-dimensionally divided by a number of micro lens elements. Then, as indicated by solid lines in FIG. 12B, one light source is formed at the image-side focal plane of a combining optical system composed of a pair of micro lens elements 151a and 152a corresponding to each other along the optical axis AX in the pair of micro fly's eye lenses 151 and 152 (i.e., near the exit surface of the micro fly's eye lens 152 facing the surface to be irradiated). Here, as indicated by broken lines in FIG. 12B, the pair of micro fly's eye lenses 151 and 152 are configured such that their object-side focal plane coincides with the entrance surface of the micro fly's eye lens 151 on the light source side.

Hence, a number of light sources (hereinafter referred to as "secondary light source") having a circular form identical to that of the illumination field formed at the entrance surface of the micro fly's eye lens 151 on the light source side are formed at the image-side focal plane of the pair of micro fly's eye lenses 151 and 152. Thus, the pair of micro fly's eye lenses 151 and 152 constitute one wavefront dividing type optical integrator and, consequently, multiple light source forming member 105 for forming a number of light sources according to a beam from the light source 101.

Preferably, the zoom lens 104 continuously changes its focal length over a range of 3:1, for example, in order for its object-side focal plane and the diffracting surface of the diffractive optical element 131 to coincide with each other and for its image-side focal plane and the entrance surface of the micro fly's eye lens 151 to coincide with each other. It is preferred that the zoom lens 104 comprise three lens groups which can be moved independently from each other along the optical axis.

A beam from the circular secondary light source formed at the image-side focal plane of the pair of micro fly's eye lenses 151 and 152 is made incident on an iris stop 106 disposed in the vicinity thereof. The iris stop 106 is an illumination aperture stop, having a substantially circular opening portion (light-transmitting portion) centered at the optical axis AX, configured so as to continuously change its opening diameter while substantially maintaining the circular form.

The diffractive optical element 131 is configured so as to be freely inserted into and retracted from the illumination optical path, and is selectively replaceable with a diffractive optical element 132 for annular modified illumination and a diffractive optical element 133 for quadrupolar modified illumination. Specifically, the three diffractive optical elements 131 to 133 are supported on a turret (rotary plate) 130 which can rotate about a predetermined axis parallel to the optical axis AX. Operations of the diffractive optical element 132 for annular modified illumination and the diffractive optical element 133 for quadrupolar modified illumination will be explained later.

Here, switching among the diffractive optical element 131 for circular illumination, the diffractive optical element 132 for annular modified illumination, and the diffractive optical element 133 for quadrupolar modified illumination is effected by a first driving system 122 which operates according to a command from a control system 121. The focal length of zoom lens 104 is changed by a second driving system 123 which operates according to a command from the control system 121. The opening diameter of iris stop 106 is changed by a third driving system 124 which operates according to a command from the control system 121.

The light from the secondary light source by way of the iris stop 106 having a circular opening portion is subjected to a light-condensing action of a zoom lens 107 acting as a second condenser optical system, and then illuminates in a superimposing manner, a predetermined surface optically conjugate with a mask 110 which will be mentioned later. The zoom lens 107 is an fsinθ lens configured so as to satisfy the sine condition (and consequently suppress the occurrence of coma). Thus, at this predetermined surface, a rectangular illumination field similar to the form of each of micro lens elements constituting the micro fly's eye lens 151 and 152 is formed. The size of the rectangular illumination field formed at this predetermined surface and the illumination NA vary depending on the focal length of zoom lens 107.

Preferably, the zoom lens 107 continuously changes its focal length such that its object-side focal plane and the image-side focal plane of the pair of micro fly's eye lenses 151 and 152 coincide with each other while its image-side focal plane and the above-mentioned predetermined surface coincide with each other. As with the zoom lens 104, it is preferred that the zoom lens 104 comprise three lens groups which are movable independently from each other along the optical axis. Thus, the zoom lens 107 is configured so as to be able to continuously change its focal length over a predetermined range, and the focal length is changed by a fourth driving system 125 which operates according to a command from the control system 121.

Disposed at a predetermined plane optically conjugate with the mask 110 is a mask blind 108 as an illumination field stop. The beam passing through the opening portion (light-transmitting portion) of the mask blind 108 is subjected to a light-condensing action of a relay optical system 109, and then illuminates, in a superimposing manner, the mask 110 formed with a predetermined pattern. Thus, the relay optical system 109 forms an image of the rectangular opening portion of the mask blind 108 onto the mask 110.

The beam transmitted through the pattern of mask 110 forms an image of the mask pattern onto a wafer (or plate) 112, which is a photosensitive substrate as a workpiece, by way of a projection optical system 111. The wafer 112 is held on a wafer stage 113 which is two-dimensionally movable within a plane orthogonal to the optical axis AX of the projection optical system 111. Thus, when batch exposure or scan exposure (scanning exposure) is carried out while the wafer 112 is two-dimensionally driven and controlled, individual exposure areas (shot areas) of the wafer 112 are successively exposed to the pattern of mask 110.

In the batch exposure technique, the individual exposure areas of the wafer are batch exposed to the mask pattern according to so-called step-and-repeat technique. In this case, the illumination area on the mask 110 has a near-square rectangular form, and each of the micro lens elements in the pair of micro fly's eye lenses 151 and 152 has a near-square rectangular form, too.

In the scan exposure technique, on the other hand, the individual exposure areas of the wafer are exposed to the mask pattern in a scanning manner while the mask and wafer are moved relative to the projection optical system according to so-called step-and-scan technique. In this case, for example, the illumination area on the mask 110 has a rectangular form in which the ratio of shorter side to longer side is 1:3, and each of the micro lens elements of the pair of micro fly's eye lenses 151 and 152 has a rectangular form similar thereto.

If the focal length of zoom lens 107 is changed in this embodiment, then the size of the illumination area formed at the pattern surface of mask 110, and consequently, the size of the exposure area formed at the exposure surface of the wafer 112 will change. Also, as the focal length of zoom lens 107 changes, the illumination NA in the pattern surface of mask 110 changes.

If the focal length of zoom lens 104 changes, on the other hand, then the illumination NA on the mask 110 changes without altering the size of the illumination area formed at the pattern surface of mask 110.

When the focal length of zoom lens 107 is set to a predetermined value, then it is possible for this embodiment to obtain a desirable size of illumination area on the mask 110, and consequently, a desirable size of exposure area on the wafer 112.

If the focal length of zoom lens 104 is set to a predetermined value with respect to the focal length of zoom lens set at a predetermined value, then a desirable size of illumination NA can be obtained on the mask 110 and, consequently, it can be set or adjusted to a desirable ó value.

As mentioned above, the diffractive optical element 131 is configured so as to be freely inserted into and retracted from the illumination optical path and is selectively replaceable with the diffractive optical element 132 for annular modified illumination and the diffractive optical element 133 for quadrupolar modified illumination.

The annular modified illumination and quadrupolar modified illumination obtained when the diffractive optical elements 132 and 133 are set into the illumination optical path in place of the diffractive optical element 131, respectively, will now be explained.

The diffractive optical element 132 for annular modified illumination converts a parallel beam having a rectangular cross section incident along the optical axis AX into an annular divergent beam. The annular divergent beam obtained by way of the diffractive optical element 132 is transmitted through the zoom lens 104 and then is made incident on the pair of micro fly's eye lenses 151 and 152. Thus, anannular illumination field is formed at the entrance surface of the micro fly's eye lens 151 on the light source side. As a result, a second light source having an annular form identical to that of the illumination field formed at the entrance surface of the micro fly's eye lens 151 on the light source side is formed at the image-side focal plane of the pair of micro fly's eye lenses 151 and 152, whereby annular modified illumination can be carried out according to the beam from this annular secondary light source.

On the other hand, the diffractive optical element 133 for quadrupolar modified illumination converts a parallel beam having a rectangular cross section incident along the optical axis AX into a quadrupolar divergent beam. The quadrupolar divergent beam obtained by way of the diffractive optical element 133 is transmitted through the zoom lens 104 and then is made incident on the pair of micro fly's eye lenses 151 and 152. Thus, a quadrupolar illumination field is formed at the entrance surface of the micro fly's eye lens 151 on the light source side. As a result, a second light source having a quadrupolar form identical to that of the illumination field formed at the entrance surface of the micro fly's eye lens 151 on the light source side is formed at the image-side focal plane of the pair of micro fly's eye lenses 151 and 152, whereby quadrupolar modified illumination can be carried out according to the beam from this quadrupolar secondary light source.

Thus, the diffractive optical elements 131 to 133 constitute optical intensity distribution changing member for changing the optical intensity distribution of the beam incident on the multiple light source forming member 105.

Meanwhile, an aspheric surface is introduced to a refractive surface of each of the micro lens elements constituting the pair of micro fly's eye lenses 151 and 152 in this embodiment. This point will now be explained with reference to a pair of micro lens elements 151*a* and 152*a* which should correspond to each other along the optical axis AX in the pair of micro fly's eye lenses 151 and 152.

As shown in FIG. 12B, the micro lens element 151*a* has a biconvex form defined by a refractive surface m1 facing the light source and a refractive surface m2 facing the surface to be irradiated, whereas the micro lens element 152*a* has a biconvex form defined by a refractive surface m3 facing the light source and a refractive surface m4 facing the surface to be irradiated.

In this embodiment, at least one of the above-mentioned four refractive surfaces m1 to m4 is formed into an aspheric surface which is symmetrical about an axis (center axis) parallel to the optical axis AX. Since the number of parameters in terms of optical designing increases as the aspheric surface is introduced in this case, it becomes easier to yield a desirable design solution, whereby the degree of freedom in design improves remarkably from the viewpoint of aberration correction in particular. Consequently, in a combining optical system composed of a pair of micro lens elements 151*a* and 152*a*, not only spherical aberration is favorably restrained from occurring, but also the occurrence of coma can favorably be suppressed as the sine condition is substantially satisfied. As a result, in this embodiment, the multiple light source image forming member 105 constituted by the pair of micro fly's eye lenses 151 and 152 substantially satisfies the sine condition, so as to favorably restrain the unevenness in illumination from occurring due to the multiple light source forming member 105, whereby the uniformity in illuminance in the surface to be irradiated and the uniformity in numerical aperture can be satisfied at the same time.

Operations of this embodiment will now be verified according to a specific numerical example of the pair of micro fly's eye lenses 151 and 152. In the following numerical example, as a mode with a high productivity, it is assumed that the four refractive surfaces m1 to m4 are formed into aspheric surfaces having totally the same form.

First, in the numerical example, the size of each micro lens element is set to 0.54 mm×0.2 mm, and the refractive index n of each micro lens element with respect to illumination light is set to 1.508. Then, each of the axial thickness $d_1$ of micro lens element 151*a* and the axial thickness $d_3$ of micro lens element 152*a* is set to 1.3 mm, whereas the axial space $d_2$ between a pair of micro lens elements 151*a* and 152*a* is set to 0.53 mm.

As mentioned above, the four refractive surfaces m1 to m4 are formed into aspheric surfaces having properties identical to each other. The aspheric surfaces are represented by the following expression:

$$S(y)=(y^2/r)/\{1+(1-\kappa y^2/r^2)^{1/2}\}$$

where y is the height in a direction perpendicular to the center axis, S(y) is the distance (sag amount) along the center axis from the tangent plane of the apex of each aspheric surface at the height y to the respective aspheric surface, r is the reference radius of curvature (radius of apex curvature), and ê is the conical coefficient.

Specifically, the radius of apex curvature $r_1$ of the refractive surface m1 of micro lens element 151*a* and the radius of apex curvature $r_3$ of the refractive surface m3 of micro lens element 152*a* are both set to 2.091 (mm$^{-1}$). On the other hand, the radius of apex curvature $r_2$ of the refractive surface m2 of micro lens element 151*a* and the radius of apex curvature $r_4$ of the refractive surface m4 of micro lens element 152*a* are both set to −2.091 (mm$^{-1}$). The conical constant κ is set to −2.49 in each of the refractive surfaces m1 to m4.

Each of the focal length of micro lens element 151*a* and the focal length of micro lens element 152*a* becomes 2.29 mm, whereby the composite focal length of micro lens elements 151*a* and 152*a* becomes 1.7 mm.

In the multiple light source forming member 105 composed of thus configured pair of micro fly's eye lenses 151 and 152, spherical aberration becomes −0.025, the sine condition unsatisfying amount becomes −0.002, and coma becomes −0.005. That is, it can be seen that the above-mentioned numerical example introducing aspheric surfaces not only restrains spherical aberration from occurring, but also favorably suppresses the occurrence of coma by substantially satisfying the sine condition.

In FIG. 12A, the diameter of the circular area 150b formed with the micro lens elements 150c is defined so as to correspond to the maximum ó value to be set, and is set to about 86 mm, for example. As a consequence, when the size of micro lens element 150c is set to 0.54 mm×0.2 mm as indicated in the above-mentioned numerical example, then the effective number of micro lens elements 150c formed within the circular area 150b becomes about 50,000. In this case, a very large wavefront dividing effect is obtained in the multiple light source forming member 105, whereby the occurrence of unevenness in illuminance can be reduced on the mask 110, which is the surface to be irradiated, or on the wafer 112. As a result, fluctuations in the unevenness in illuminance and changes in telecentricity can be kept very low even when switching illumination conditions (switching among circular illumination, annular modified illumination, and quadrupolar illumination, changing of illumination parameters such as the size of illumination area and ó value, and the like).

Since a very large wavefront dividing effect is obtained in the multiple light source forming member 105, it becomes unnecessary for an illumination aperture stop having an annular opening portion or a quadrupolar (generally multipolar) opening portion to be disposed at the position of iris stop 106 upon annular modified illumination or quadrupolar modified illumination. That is, even when switching is to be carried out among circular illumination, annular modified illumination, and quadrupolar illumination, it will be sufficient if the opening diameter of iris stop 106 is changed as necessary so as to block unnecessary beams such as flare light, without synchronously carrying out the switching among circular illumination, annular modified illumination, and quadrupolar illumination as in the prior art. In other words, arrangement of an illumination aperture stop known as ó stop may be omitted, whereby the configuration can be simplified.

For yielding a sufficient wavefront dividing effect in the present invention, it is preferred that the effective number of micro lens elements constituting one micro fly's eye lens be 1,000 or greater. For further enhancing the wavefront dividing effect, it is preferred that the effective number of micro lens elements be 50,000 or greater. Here, the effective number of micro lens elements constituting one micro fly's eye lens corresponds to the number of combining optical systems and the number of center axes (optical axes) of individual micro lens elements parallel to the optical axis AX, and consequently, the number of wavefront divisions of multiple light source forming member 105.

Meanwhile, in this embodiment, since the multiple light source forming member 105 is constituted by a pair of micro fly's eye lenses 151 and 152, whereas the size and focal length of each micro lens element are very small, it is important for a pair of micro lens elements which should correspond to each other along the optical axis AX to be positioned with respect to each other, i.e., for the pair of micro fly's eye lenses 151 and 152 to be positioned with respect to each other. Specifically, it is necessary for a pair of micro lens elements which should correspond to each other to be positioned without two-dimensionally translating their positions within a plane orthogonal to the optical axis AX and without rotating their positions about the optical axis AX within a plane orthogonal to the optical axis AX.

As shown in FIG. 12A, each of the micro fly's eye lenses therefore is formed with four alignment marks 150d acting as means for positioning the pair of micro fly's eye lenses 151 and 152 in this embodiment. The four alignment marks 150d are formed by depositing chromium, for example, at positions corresponding to the four corners of a square outside the circular area 150b formed with a number of micro lens elements 150c, i.e., outside the illumination optical path. Each alignment mark 150d is formed with a positional precision of about 11 m, for example, while having a size of about 2 mm.

Figure 13:
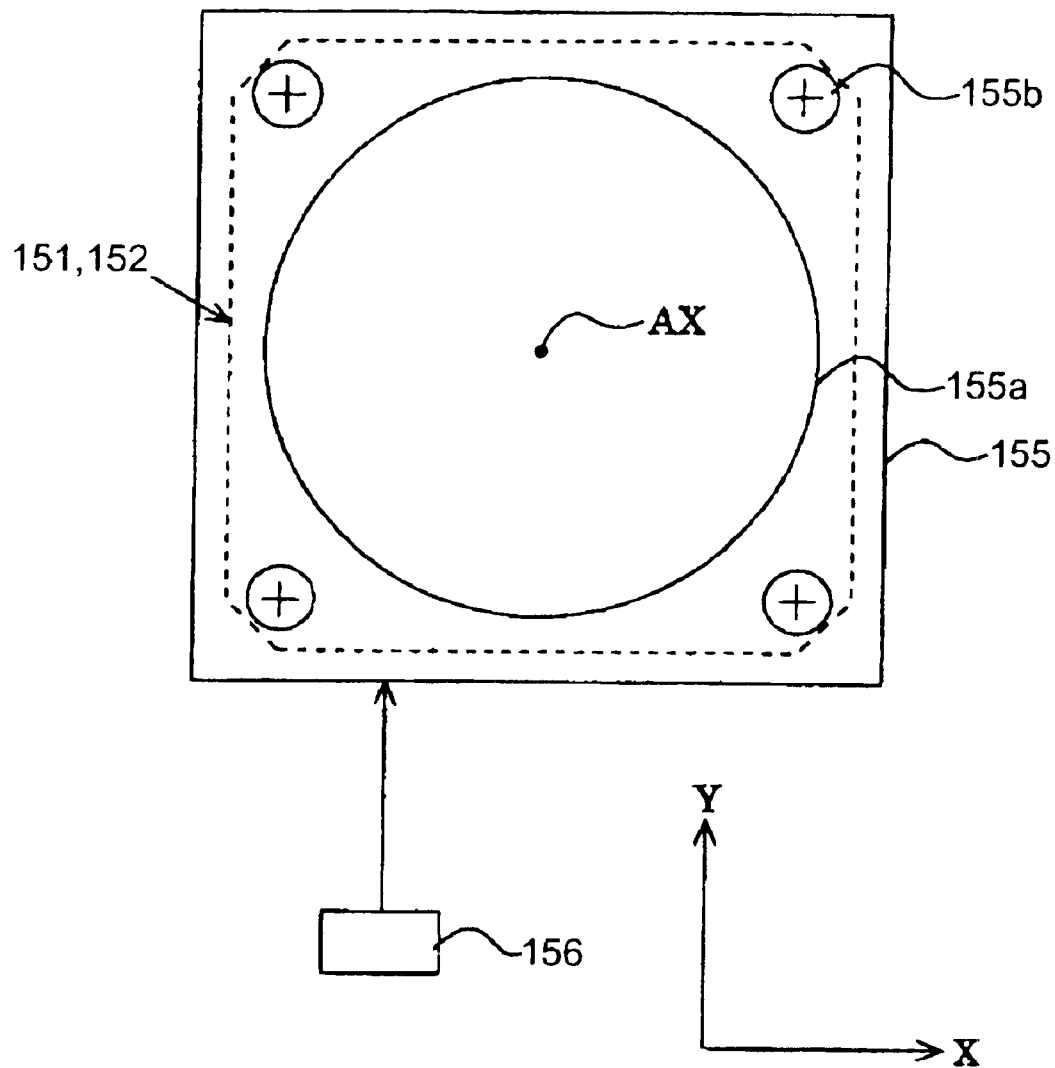
FIG. 13 is a view for explaining positioning of a pair of micro fly's eyes lenses.

The micro fly's eye lenses 151 and 152 thus formed with the alignment marks 150d are supported with a holding member 155 such as the one shown in FIG. 13, and is positioned while in a state attached to another holding member (not depicted) in the illumination optical path. The holding member 155 is formed with a circular opening portion 155a corresponding to the circular area 150b and four circular opening portions 155b corresponding to the four alignment marks 150d, respectively. Also, a driving system 156 composed of a plurality of mircometers, for example, is connected to the holding member 155. Due to operations of the driving system 156, the holding member 155 positioned in the illumination optical path minutely moves along X and Y directions, and minutely rotates about the optical axis AX.

Upon positioning the pair of micro fly's eye lenses 151 and 152 with respect to each other, the four alignment marks formed in the micro fly's eye lens 151 and the four alignment marks formed in the micro fly's eye lens 152 are observed with unaided eye (naked eye) or through a loupe or microscope. Then, at least one of a pair of holding members 155 is minutely moved by the driving system 156 such that alignment marks 150d corresponding to each other align with each other along the optical axis AX. Thus, the pair of micro fly's eye lenses 151 and 152 can be positioned with respect to each other, and consequently, a pair of micro lens elements which should correspond to each other along the optical axis AX can be positioned with respect to each other. Here, both of the pair of holding members 155 may be made movable, or one of the pair of holding members 155 may be made movable while the other is fixed.

Another positioning method may be employed in which an angle measuring device such as autocollimator, for example, is used for observing the positional deviation between a pair of micro lens elements corresponding to each other. In this case, after the autocollimator is initially set while in a state where the pair of micro fly's eye lenses 151 and 152 are not inserted in the illumination optical path, the pair of micro fly's eye lenses 151 and 152 are inserted into the illumination optical path, and the positioning is carried out according to a beam transmitted through the pair of micro lens elements. Also employable is a method in which a beam transmitted through the pair of micro lens elements is observed with a microscope or the like, and the positional deviation of the pair of micro lens elements observed within its field of view is read off, so as to carry out positioning.

In an illumination optical apparatus such as that of this embodiment, it has been known that unevenness in illuminance occurs due to angular characteristics of antireflection films applied to individual lenses constituting the zoom lens 107 acting as a condenser optical system. Here, an antireflection film is formed by depositing a plurality of thin dielectric films onto a lens surface, and eliminates reflected light by dividing the reflected light in terms of amplitude and causing a number of light components to interfere with each other with their phases being shifted from each other. Since the shifting of phases is regulated depending on the film thickness, the antireflection effect may vary when the indcidence angle of beam changes. In general, light beams transmitted through more marginal areas of a lens are bent more greatly in an optical system using the lens, whereby the angle of incidence becomes greater. On the other hand, antireflection films are designed for vertical incidence, whereby light having a greater angle of incidence is more likely to be reflected. As a result, illuminance tends to decrease substantially like a quadratic curve as the image height is higher in the surface to be irradiated, i.e., as the position is farther from the optical axis.

In this embodiment, if a filter formed with a dot pattern of chromium is disposed at the surface of cover glass 153 facing the surface to be irradiated, then unevenness in illumination occurring due to the above-mentioned angular characteristics of antireflection films and the like can be corrected. Here, the dot pattern formed in a minute rectangular area corresponding to the entrance surface of each of the micro lens elements constituting the micro fly's eye lens 151 on the light source side is configured such that transmissivity is the lowest at the center thereof and gradually increases toward its marginal areas. It is necessary for the rectangular micro dot pattern areas formed in the cover glass 153 and the individual micro lens elements of the micro fly's eye lens 151 on the light source side to be positioned with respect to each other in this case as well. This positioning can be carried out as in the positioning of a pair of micro fly's eye lenses if the cover glass 153 is formed with the above-mentioned alignment marks.

Without being restricted to the entrance surface of the micro fly's eye lens 151 on the light source side, the above-mentioned filter may be disposed near a plane optically conjugate with the surface to be irradiated. Also, the above-mentioned dot pattern can directly be formed at the entrance surface of each of the micro lens elements constituting the micro fly's eye lens 151 on the light source side.

In place of the cover glass 153 formed with a dot pattern, a filter having different transmissivity values depending on the angle of incidence may be disposed at a pupil position of the illumination optical apparatus (e.g., at the position of iris stop 106 or its conjugate plane), so as to correct the above-mentioned unevenness in illumination.

A method of correcting the above-mentioned unevenness in illumination by moving a part of a plurality of lenses constituting the zoom lens 107 acting as a condenser optical system in the optical axis direction may be considered. In this method, however, not only various kinds of aberration such as distortion may occur, but also illumination parameters such as σ value may vary along with the change in focal length of the zoom lens 107.

Also, as mentioned above, the unevenness in illumination may slightly fluctuate upon switching illumination conditions. In this case, when the above-mentioned switching of filters and the like are carried out upon switching the illumination conditions, then the fluctuation of unevenness in illumination can be corrected.

Though a pair of micro fly's eye lenses disposed with a gap therebetween constitute multiple light source forming member in the above-mentioned embodiment, at least two optical element bundles disposed with a gap therebetween can also constitute multiple light source forming member in general. Here, an optical element bundle is a concept encompassing two-dimensional arrays of lens surfaces and two-dimensional arrays of reflecting surfaces.

While micro fly's eye lenses are formed by etching in the above-mentioned embodiment, they may also be formed by a denting (an impressing) technique or a grinding technique, for example.

Though a pair of micro fly's eye lenses are disposed with a gap therebetween in the above-mentioned embodiment, the space therebetween may also be filled with an inert gas or optical glass. When a light source supplying ultraviolet light having a wavelength shorter than a predetermined wavelength is used, it is preferred that the wavefront dividing type optical integrator be formed from silica glass or fluorite.

Though micro fly's eye lenses are used as the wavefront dividing type optical integrator in the fifth embodiment, a wavefront dividing type optical integrator such as a fly eye's lens, for example, may also be used. In this case, it is preferred that the fly's eye lens be constituted by a sufficient number of lens elements for yielding a sufficient wavefront dividing effect.

Though the fifth embodiment is configured such that diffractive optical elements acting as optical intensity distribution changing member are positioned in the illumination optical path in a turret fashion, a known slider mechanism, for example, may be utilized so as to switch the above-mentioned diffractive optical elements. Meanwhile, detailed explanations concerning diffractive optical elements which can be utilized in the present invention are disclosed in U.S. Pat. No. 5,850,300 and the like.

Though diffractive optical elements are used as optical intensity distribution changing member in the above-mentioned embodiment, wavefront dividing type optical integrators such as fly's eye lens and micro fly's eye lens, for example, may also be used.

In the above-mentioned embodiment, an illumination field is once formed at a predetermined plane conjugate with the mask 110, the beam from this illumination field is restricted by the mask blind 108, and then an illumination field is formed on the mask 110 by way of the relay optical system 109. However, it is also possible to employ a configuration in which, without the relay optical system 109, an illumination field is directly formed on the mask 110 disposed at the position of mask blind 108.

Though the above-mentioned embodiment illustrates an example in which a quadrupolar secondary light source is formed, a bipolar secondary light source (having two illuminants) or multipolar secondary light sources such as octapolar secondary light source (having eight illuminants) may also be formed.

Though KrF excimer laser (having a wavelength of 248 nm) and ArF excimer laser (having a wavelength of 193 nm) are used as the light source in the above-mentioned embodiment, the present invention is also applicable to light sources including g-line, h-line, and/or i-line and light sources such as $F_2$ laser.

Though the above-mentioned embodiment explains the present invention with reference to a projection exposure apparatus-equipped with an illumination optical apparatus by way of example, it is clear that the present invention is also applicable to common illumination optical apparatus for uniformly irradiating surfaces to be irradiated other than masks.

Hence, the projection exposure apparatus in accordance with this embodiment can satisfy the uniformity in illuminance on the exposed surface of a photosensitive substrate, which is a surface to be irradiated, and the uniformity in numerical aperture at the same time. As a result, favorable projection/exposure with a high throughput can be carried out under favorable exposure conditions.

Since projection/exposure can be carried out under favorable exposure conditions in an exposure method in which a pattern of a mask disposed on a surface to be irradiated is projected onto a photosensitive substrate, favorable micro devices (semiconductor device, image pickup device, liquid crystal display device, thin film magnetic head, and the like) can be made.

Sixth Embodiment

The projection exposure apparatus in accordance with a sixth embodiment of the present invention will be explained with reference to FIG. 14A. FIG. 14A is a view schematically showing the configuration of a projection exposure apparatus equipped with an illumination optical apparatus in accordance with an embodiment of the present invention. In FIG. 14A, Z axis is set along the normal direction of a wafer W which is a substrate (workpiece) coated with a photosensitive material, Y axis is set in a direction parallel to the paper surface of FIG. 14A within the wafer surface, and X axis is set in a direction perpendicular to the paper surface of FIG. 14A within the wafer surface.

The projection exposure apparatus shown in FIG. 14A is equipped with an excimer laser light source for supplying light having a wavelength of 248 nm or 193 nm, for example, as a light source 201 for supplying exposure light (illumination light). A substantially parallel beam having a desirable rectangular cross section emitted from the light source 201 along a reference optical axis AX is made incident on an optical delay unit 202.

The optical delay unit 202 timewise divides an incident beam into a plurality of beams propagating through respective optical paths having optical path length differences therebetween, recombines these plurality of beams, and then emits the resulting composite beam. Here, the optical path length differences are set to the timewise coherence distance of the beam from the coherent light source 201 or longer. As a consequence, coherency (coherence property) can be lowered in the wave train divided by the optical delay unit 202, whereby interference fringes and speckles can favorably be restrained from occurring in the surface to be irradiated. For favorably suppressing the occurrence of speckles, it is preferred that optical delay units 202 such as that mentioned above are arranged in three stages along the optical axis AX.

Further detailed configurations and operations concerning this kind of optical delay means are disclosed in specifications, drawings, and the like of Japanese Patent Application Laid-Open No. HEI 1-198759, Japanese Patent Application Laid-Open No. HEI 11-174365, Japanese Patent Application Laid-Open No. HEI 11-312631, Japanese Patent Application Laid-Open No. 2000-223405, Japanese Patent Application Laid-Open No. 2000-223396, and U.S. Ser. No. 09/300660, for example.

The beams timewise divided into incoherent multiple pulses by way of the optical delay unit 202 with time are directed to a turret 230 provided with a plurality of micro fly's eye lenses (micro fly's eye optical member) 231, 232.

FIG. 14B is an XY plan view of the turret 230 as seen from its exit side. As shown in FIG. 14B, the turret 230 is provided with the micro fly's eye lens 231 for annular illumination, the micro fly's eye lens 232 for multipolar (e.g., quadrupolar, octapolar, etc.) illumination, and a hole 233 for conventional illumination. Here, the micro fly's eye lens 231 for annular illumination has a number of lens surfaces arranged in a two-dimensional matrix on the XY plane, each lens surface having a hexagonal cross section in the XY plane. The micro fly's eye lens for multipolar illumination also has a number of lens surfaces arranged in a two-dimensional matrix on the XY plane, whereas each lens surface has a quadrangular cross section in the XY plane.

The following explanation will mainly relate to a case where the micro fly's eye lens 231 for annular illumination is set into the illumination optical path.

Returning to FIG. 14A, a plurality of lens surfaces of the micro fly's eye lens 231 for annular illumination collect the beam from the light source 201 by way of the optical delay unit 202, so as to form a plurality of light source images (which are real or virtual images when the refracting power of lens surface is positive or negative, respectively), whereby a divergent beam having a predetermined divergent angle is emitted from the micro fly's eye lens 231. An afocal zoom optical system 204 is disposed on the exit side of the micro fly's eye lens 231. The afocal zoom optical system 204 is configured such that its angular magnification is variable, whereby the incident divergent beam is emitted by way of the afocal zoom optical system 204 so as to yield an angle corresponding to the set angular magnification. The beam emitted from the afocal zoom optical system 204 is directed to a turret 250 provided with a plurality of diffractive optical elements 251 to 253.

FIG. 14C is an XY plan view of the turret 250 as seen from its exit side. AS shown in FIG. 14C, the turret 250 is provided with the diffractive optical element 251 for annular illumination, the diffractive optical element 252 for multipolar (e.g., quadrupolar, octapolar, etc.) illumination, and the diffractive optical element 253 for conventional illumination.

Here, the diffractive optical elements 251 to 253 are constructed by forming steps in a light-transmitting substrate (glass substrate) with a pitch on the order of the wavelength of exposure light (illumination light), and act to diffract incident beams at a desirable angle. Specifically, the diffractive optical element 251 for annular illumination converts the beam incident along the optical axis of the illumination optical apparatus (Z axis) into a divergent beam having a ring-shaped divergent cross section in a far field region. The diffractive optical element 252 for multipolar illumination converts the beam incident along the optical axis of the illumination optical apparatus (Z axis) into a plurality of divergent beams having a quadrupolar cross section forming four points respectively positioned in the first to fourth quadrants in XY coordinates whose origin is located at the optical axis. The diffractive optical element 253 for conventional illumination converts the beam incident along the optical axis of the illumination optical apparatus into a divergent beam having a circular cross section in a far field region.

Since the diffractive optical elements 251 to 253 are effective in reducing the occurrence of interference fringes and speckles in the surface to be irradiated, the installation of optical delay unit 202 may be omitted when appropriate.

Returning to FIG. 14A, the diffractive optical element 251 for annular illumination is set into the illumination optical path in the case where the micro fly's eye lens 231 for annular illumination is set into the optical path. Since the diffractive optical element 251 is not illuminated with a parallel beam but with a beam having a predetermined angle (numerical aperture) given by the micro fly's eye lens 231 and afocal zoom optical system 204, its far field region is formed with an annular (doughnut-shaped) optical intensity distribution having a width corresponding to the above-mentioned predetermined angle instead of a ring-shaped optical intensity distribution whose width is substantially zero.

In the example of FIG. 14A, a zoom optical system 206 subsequent to the diffractive optical element 251 (252, 253)

forms its far field region at a finite distance (at or near the image-side focal position of the zoom optical system 206). As a consequence, an annular optical intensity distribution is formed at or near the image-side focal position of the zoom optical system 206.

When the focal length of zoom optical system 206 is changed here, then the annular optical intensity distribution is proportionally enlarged or reduced while keeping its annularity ratio (the ratio of inside diameter to outside diameter of annularity). Also, since the width of annularity (difference between the outside and inside diameters of annularity) can be changed when the angular magnification of afocal zoom optical system 204 is altered as mentioned above, the annularity ratio and annularity width can be set to given values independently from each other when the angular magnification of afocal zoom optical system 204 and the focal length of zoom optical system 206 are adjusted independently from each other.

A case where both of the micro fly's eye lens 232 and diffractive optical element 252 for multipolar illumination are set into the illumination optical path will be explained in brief. Since the micro fly's eye lens 232 is formed with a plurality of lens surfaces each having a rectangular cross section as mentioned above, the beam emitted from the micro fly's eye lens 232 and then made incident on the afocal zoom optical system 204 becomes a beam having a rectangular cross section at a pupil plane obtained when the object point of the afocal zoom optical system is taken as the position of micro fly's eye lens 232, thereby being made incident on the diffractive optical element 252 as a beam having an angle (numerical aperture) corresponding to the angular magnification of the afocal zoom optical system 204.

In the far field region of the diffractive optical element 252, i.e., at or near the image-side focal position of zoom optical system 206, a plurality of beams having four rectangular cross sections respectively positioned in the first to fourth quadrants in XY coordinates whose origin is located at the optical axis arrive.

Here, as in the annular illumination, the respective sizes of four rectangular cross sections of beams formed at or near the image-side focal position of zoom optical system 206 are changed when the angular magnification of afocal zoom optical system 204 is altered. Also, if the focal length of zoom optical system 206 is altered, then the distance from the optical axis to the center position of the four beams having rectangular cross sections formed at or near the image-side focal position of zoom optical system 206 is changed.

At the time of conventional illumination, the hole 233 of the turret 230 and the diffractive optical element 253 are set into the illumination optical path. As a consequence, the afocal zoom optical system 204 functions to receive a parallel beam having a rectangular cross section from the optical delay unit 202 and change, according to the angular magnification thereof, the width of XY cross section of the parallel beam. That is, the afocal zoom optical system 204 functions as a beam expander at the time of conventional illumination.

Since the diffractive optical element 253 forms a beam having a circular cross section in the far field region in response to the parallel beam as mentioned above, a beam having a circular cross section is formed at or near the image-side focal position of zoom optical system 206. When the focal length of zoom optical system 206 is altered, then the diameter of the beam having a circular cross section is changed.

The projection exposure apparatus shown in FIG. 14A has a first driving unit 234 for exchanging, inserting, or retracting micro fly's eye lenses by driving the turret 230; a second driving unit 244 for driving lenses of the afocal zoom optical system 204 so as to change its angular magnification; a third driving unit 254 for exchanging diffractive optical elements by driving the turret 250; and a fourth driving unit 264 for driving lenses of the zoom optical system 206 so as to change its focal length. The first to fourth driving units 234, 244, 254, 264 are connected to a control unit 214 and are controlled by commands from the control unit 214.

Meanwhile, the beam from the zoom optical system 206 is made incident on an optical integrator 207 having a pair of micro fly's eye lenses. The optical integrator 207 will now be explained with reference to FIGS. 15A to 17C.

Figure 15A:
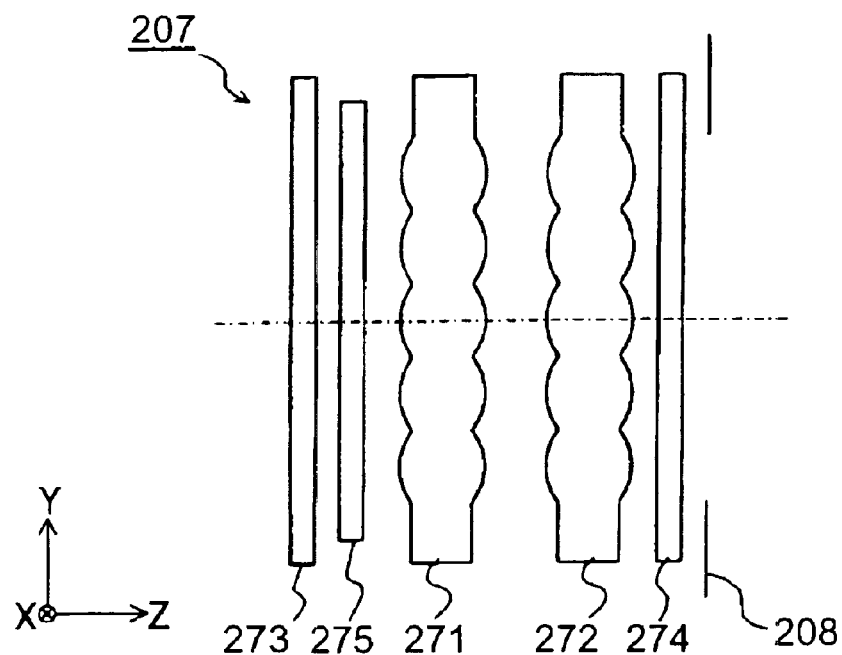
FIG. 15A is a view showing an embodiment of diffractive optical element as light source image enlarging member.
Figure 15B:
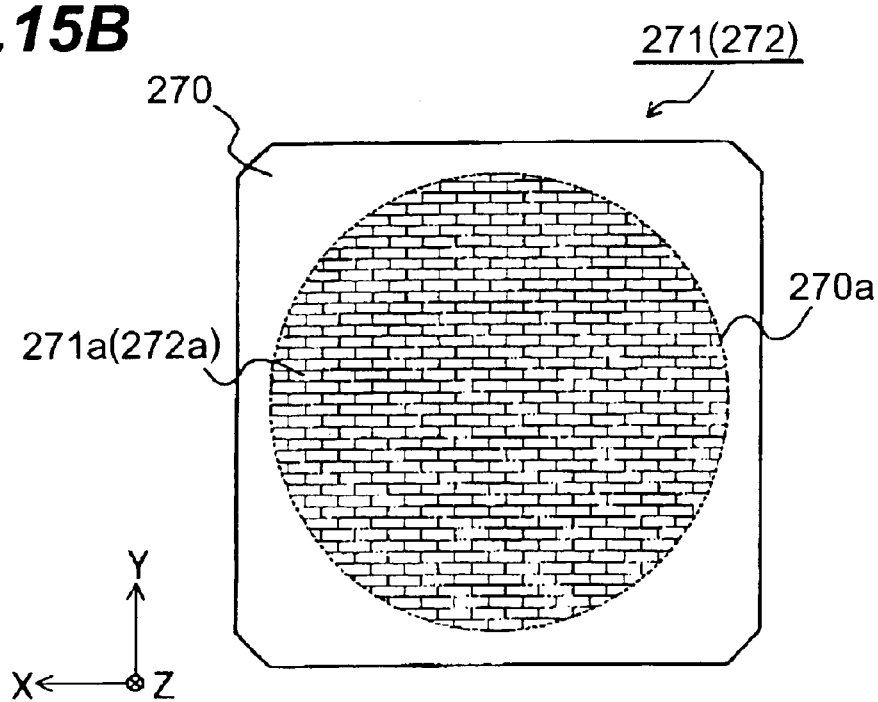
FIG. 15B is a plan view of a micro fly's eye lenses.

FIG. 15A is a YZ cross-sectional view of the optical integrator 207, whereas FIG. 15B is an XY plan view of a micro fly's eye lens 271 (272) in the optical integrator 207.

As shown in FIG. 15A, the optical integrator 207 of this embodiment has a pair of micro fly's eye lenses 271, 272, an entrance-side cover glass 273 positioned on the entrance side of micro fly's eye lenses, an exit-side cover glass 274 positioned on the exit side of micro fly's eye lenses, and a diffractive optical element 275 acting as light source image enlarging member.

Here, the pair of micro fly's eye lenses 271, 272 have basic configurations identical to each other, each being an optical element comprising a number of micro lens elements 271a (272a), each having a rectangular cross section and a positive refracting power, densely arranged in a two-dimensional matrix as shown in FIG. 15B. Each micro fly's eye lens 271, 272 is constructed by etching a substantially square plane-parallel glass substrate 270 so as to form micro lens surfaces in a circular effective area 270a.

Though FIG. 15B shows a number of micro lens surfaces 271a (272a) formed on the entrance side of each micro fly's eye lens 271 (272), each micro fly's eye lens 271 (272) has a plurality of micro lens surfaces 271b (272b) formed on the exit side thereof coaxial with the respective micro lens surfaces 271a (272a) formed on the entrance side thereof. The micro lens surfaces 271b (272b) are also formed in a circular effective area by etching the plane-parallel glass substrate 270.

In the optical integrator 207 in this embodiment, 1,000 to 50,000 or more micro lens surfaces 271a (271b, 272a, 272b) are formed within the effective area 270a. For example, the size of each micro lens surface may be about 0.54 mm×0.2 mm, whereas the diameter of effective area 270a may be 86 mm, whereby the number of micro lens surfaces may become about 50,000. For clarification, the number of micro lens surfaces formed in micro fly's eye lenses depicted in the drawing is much smaller than the actual number.

Since the entrance surface of micro fly's eye lens 271 is disposed conjugate with a wafer W surface which is a surface to be irradiated as will be mentioned later, the outer form of one micro lens surface is similar—rectangular form in this embodiment—to the illumination area on the wafer W.

Figure 16:
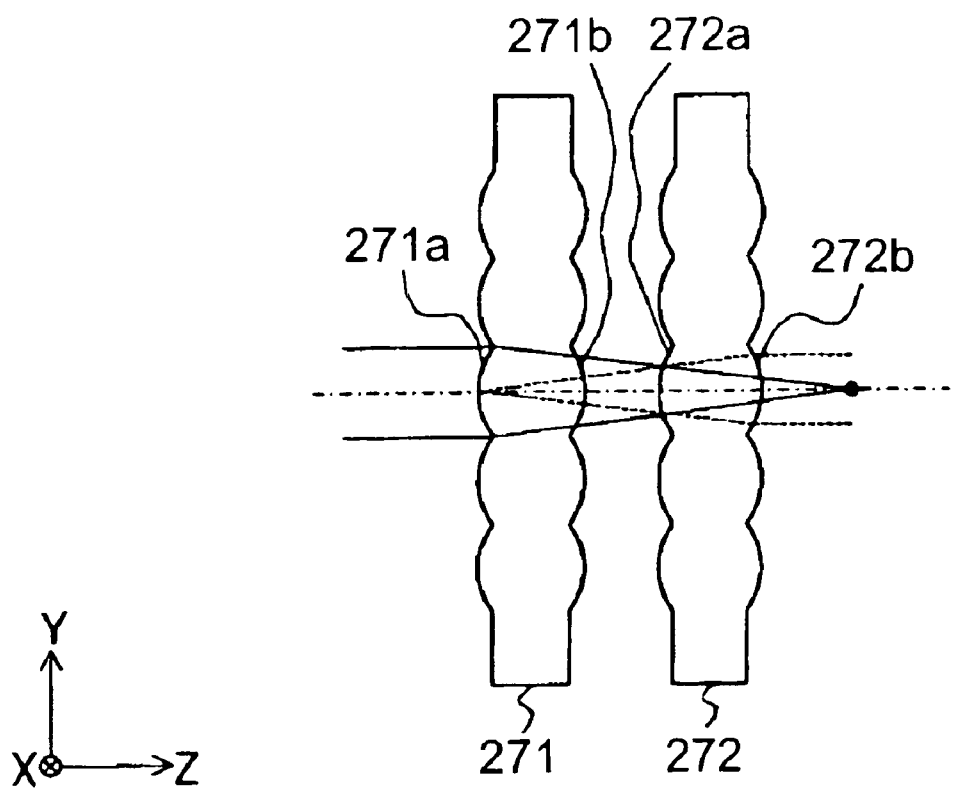
FIG. 16 is a view for explaining functions of micro fly's eyes lenses.

FIG. 16 is an optical path view of the pair of micro fly's eye lenses 271, 272. As shown in FIG. 16, a pair of micro lens surfaces 271a, 271b of the micro fly's eye lens 271 and a pair of micro lens surfaces 272a, 272b of the micro fly's eye lens 272 are disposed coaxial with each other along an optical axis indicated by a dash-single-dot line in the drawing.

As indicated by solid lines in FIG. 16, a beam incident in a parallel manner onto a combining optical system composed of the micro lens surfaces 271a, 271b, 272a, 272b arranged along the optical axis forms a light source image at the image-side focal plane of the combining optical system. Also, as indicated by broken lines in FIG. 16, the object-side focal plane of the combining optical system composed of the micro lens surfaces 271a, 271b, 272a, 272b arranged along the optical axis is configured so as to coincide with the entrance surface (micro lens surface 271a) of micro fly's eye lens 271.

A plurality of micro lens surfaces on the entrance side of micro fly's eye lens 271 and those on the exit side thereof, and a plurality of micro lens surfaces on the entrance side of micro fly's eye lens 272 and those on the exit side thereof are positioned so as to be coaxial with their respective axes parallel to the optical axis also in micro lens surfaces other than those arranged along the optical axis.

As a consequence, a secondary light source composed of an assembly of a number of light source images is formed at the image-side focal plane of the pair of micro fly's eye lenses 271, 272. In this embodiment, the image-side focal plane of the pair of micro fly's eye lenses 271, 272 acts as a pupil (illumination pupil) of the illumination optical apparatus.

Here, the secondary light source has a form substantially similar to the cross sectional form of the beam incident on the optical integrator 207, so that, for example, an annular secondary light source is formed at the illumination pupil when the micro fly's eye lens 231 for annular illumination and the diffractive optical element 251 for annular illumination are set into the illumination optical path, and a secondary light source having four rectangular cross sections eccentric with respect to the optical axis (aggregate of four light source images having rectangular cross sections respectively positioned in the first to fourth quadrants in XY coordinates whose origin is located at the optical axis) is formed at the illumination pupil when the micro fly's eye lens 231 for multipolar (quadrupolar) illumination and the diffractive optical element 251 for multipolar (quadrupolar) illumination are set into the illumination optical path. At the time of conventional illumination, on the other hand, a circular secondary light source is formed at the illumination pupil.

Returning to FIG. 14A, an iris stop 208 adapted to continuously change the diameter of circular opening is disposed at the position of illumination pupil (image-side focal plane of the pair of micro fly's eye lenses 271, 272), whereas the beam from the secondary light source formed at the position of this iris stop 208 is collected by a zoom condenser optical system 209 whose object-side focal point is positioned at the iris stop 208, so as to illuminate, in a superimposing manner, an illumination field stop (reticle blind) 210 positioned in the vicinity of the image-side focal point of the zoom condenser optical system 209. In this embodiment, the zoom condenser optical system 209 is a zoom lens having a projection characteristic of fsinθ, whose operations will be explained later. The opening diameter of iris stop 208 is set to a predetermined diameter according to the driving of a fifth driving unit 284 controlled by the above-mentioned control unit 214.

By way of an illumination field stop image forming optical system 211 (blind image forming system) which forms an image of the opening portion of illumination field stop onto a pattern surface of a reticle R, the beam having passed through the opening portion of the illumination field stop 210 forms an illumination area having a form similar to the opening portion of illumination field stop onto the pattern surface of reticle R.

Light from a reticle pattern positioned within the illumination area arrives on the wafer W by way of a projection optical system PL located between the reticle R and wafer W, thereby forming an image of the reticle pattern within an exposure area on the wafer W. Here, the reticle R is mounted on a reticle stage 212 which is movable at least in Y direction, whereas the wafer W is mounted on a wafer stage 213 which is at least two-dimensionally movable within XY plane.

In this embodiment, the exposure area on the wafer W and the illumination area on the reticle R have a rectangular form (slot form) whose longitudinal direction is oriented in X direction. When the reticle R and wafer W are moved with respect to the projection optical system PL at a speed ratio corresponding to the projection magnification of projection optical system (e.g., −¼×, −⅕×, −⅙×, etc.), the pattern image formed in the pattern forming area of reticle R can be transferred onto one shot area on the wafer W.

In the sixth embodiment, an annular or multipolar secondary light source is formed substantially without light energy quantity loss by use of the micro fly's eye lenses 231, 232 and diffractive optical elements 251, 252. In such a secondary light source (secondary light source having an annular form, a multipolar form, or the like) having an optical intensity distribution in which optical intensity is set lower in the pupil center region including the optical axis than in its surrounding region, the energy density of a number of light sources forming the secondary light source increases.

In the micro fly's eye lens 272 and exit-side cover glass 274 located near a number of light source images in this case, there is a fear that the antireflection film provided on their surfaces and the substrates themselves may break or the transmissivity may deteriorate or change with time even if they may fall short of breaking.

In the sixth embodiment, the diffractive optical element 275 acting as light source image enlarging member hence is disposed on the light source side of the micro fly's eye lens 271 constituting a part of the optical integrator 207. With reference to FIGS. 17A to 17C and 18, functions of the diffractive optical element 275 as light source image enlarging member will now be explained.

FIGS. 17A to 17C are views for explaining the principle of diffractive optical element 275, illustrating the diffractive optical element 275 and the entrance-side lens surface 271a of micro fly's eye lens 271. As shown in FIG. 17A, the diffractive optical element 275 functions to diverge its incident parallel beam at a predetermined angle of divergence θ. Here, a far field pattern FFP whose cross section within XY plane is substantially circular as shown in FIG. 17B is formed in a far field region FF of the diffractive optical element 275. The diffractive optical element 275 may also form a far field pattern FFP whose cross section within XY plane is substantially rectangular as shown in FIG. 17C.

Figure 18:
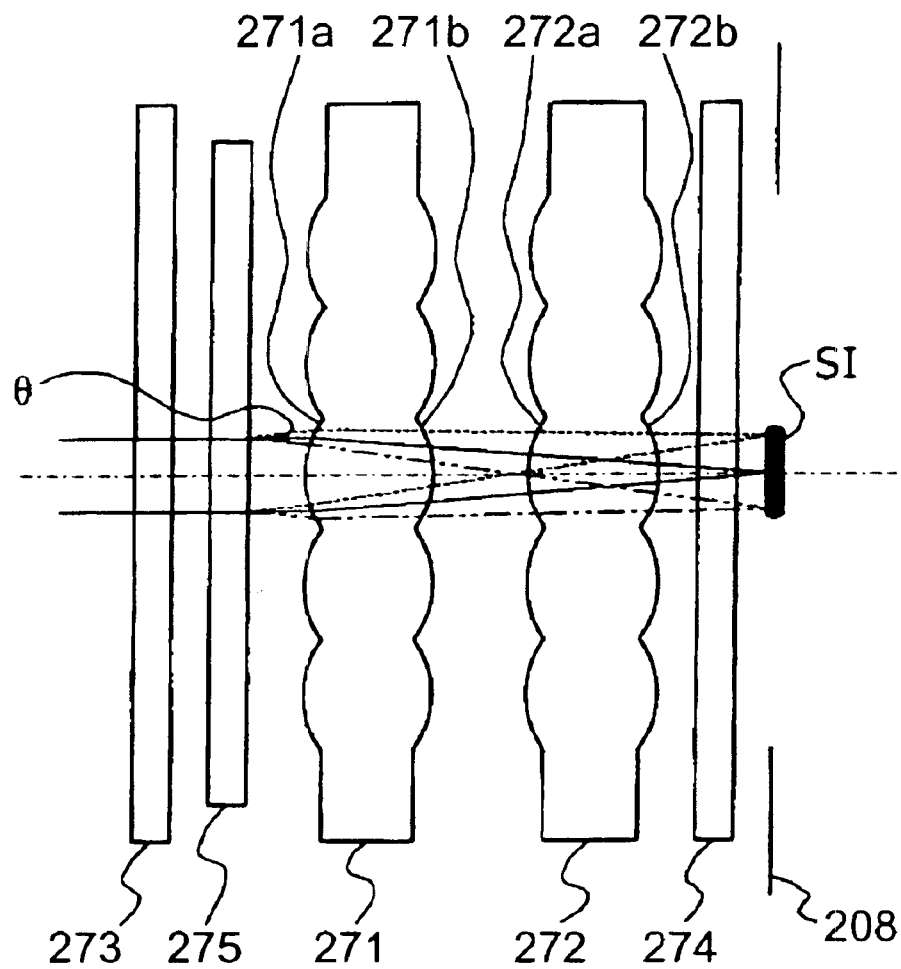
FIG. 18 is a view for explaining a function of a diffractive optical element as light source image enlarging member.

FIG. 18 is a view showing optical paths of the divergent beam from the diffractive optical element 275. In FIG. 18, of the divergent beam from the diffractive optical element 275, a parallel beam advancing in parallel to the optical axis is indicated by solid lines, a parallel line advancing obliquely upward with respect to the optical axis is indicated by broken lines, and a parallel line advancing obliquely downward with respect to the optical axis is indicated by chain double-dashed line.

Here, the parallel beam parallel to the optical axis indicated by solid lines is refracted by the individual lens surfaces 271a to 272b of the pair of micro fly's eye lenses 271, 272, so as to intersect the optical axis at the position of iris stop 208 (position of illumination pupil). That is, a light source image based on the parallel beam parallel to the optical axis is formed at this position on the optical axis. On the other hand, the parallel beam advancing obliquely upward with respect to the optical axis indicated by broken lines in the drawing is refracted by the lens surfaces 271a to 272b, so as to be collected on the upper side of the optical axis at the position of iris stop 208 (position of illumination pupil), whereas the parallel beam advancing obliquely downward with respect to the optical axis indicated by chain double-dashed line in the drawing is refracted by the lens surfaces 271a to 272b, so as to be condensed on the lower side of the optical axis at the position of iris stop 208 (position of illumination pupil). Since the angular distribution of the light diverging from the diffractive optical element 275 is not discrete but continuous, an enlarged light source image SI, instead of a divided light source image, is formed at the position of iris stop 208.

Though FIG. 18 relates to the light source image SI formed by the lens surfaces 271a to 272b arranged along the optical axis, the micro fly's eye lenses 271, 272 have a plurality of sets of lens surfaces arranged along a plurality of axes parallel to the optical axis in practice, whereby a plurality of enlarged light source images SI are formed at the position of illumination aperture stop.

Since energy density becomes lower in thus enlarged light source images SI, there is no fear that the antireflection film provided on the micro fly's eye lens 272 and exit-side cover glass 274 and the substrates themselves may break or the transmissivity may deteriorate or change with time even if they fall short of breaking. As a consequence, the surface to be irradiated can be illuminated stably.

In this embodiment, it is preferred that the angle of divergence of the diffractive optical element 275 acting as light source image enlarging member be set such that no loss in illumination light occurs in the optical integrator 207. That is, in the case where the optical integrator 207 has a plurality of two-dimensionally arranged micro lens surfaces (271a, 271b, 272a, or 272b) as in this embodiment, it is preferred that the angle of divergence of diffractive optical element 275 be set such that the size of enlarged images Si be smaller than the size of micro lens surfaces (271a, 271b, 272a, or 272b) within XY plane.

Here, it the angle of divergence of diffractive optical element 275 is such that the size of enlarged images SI is greater than the size of micro lens surfaces (271a, 271b, 272a, or 272b) within XY plane, then a beam will advance to the outside of a plurality of micro lens surfaces (271a, 271b, 272a, or 272b), thereby failing to contribute to forming a secondary light source, so that light energy quantity loss occurs. The size of enlarged light source images SI is determined not only by the angle of divergence of diffractive optical element 275, but also by the focal length of micro fly's eye lenses 271, 272, the angle (numerical aperture) of the beam incident on the diffractive optical element 275, the distance between the diffractive optical element 275 and the micro fly's eye lens 271, and the like.

In this embodiment, the angle of divergence of the diffractive optical element 275 is set to about 2° to 3°, so that the size of light source images SI becomes about two times that in the case where the diffractive optical element 275 is not inserted.

Returning to FIG. 17A, the diffractive optical element 275 as light source image enlarging member is disposed such that the entrance-side lens surface 271a of micro fly's eye lens 271 is positioned near the near field region NF of the diffractive optical element 275. Since each of a plurality of entrance-side lens surfaces 271a of micro fly's eye lens 271 is disposed substantially conjugate with the exposure area on the wafer W, there is a fear that the illuminance distribution within the exposure area on the wafer W may become uneven if the illuminance distribution is uneven within the entrance-side lens surface 271a.

It is preferable that near field region of the diffractive optical element, as light source image enlarging member, has a substantially uniform illuminance distribution.

Enlarging each of a plurality of light source images formed by an optical integrator as in this embodiment can be effective in that σ value (the reticle-side numerical aperture of the illumination optical apparatus with respect to the reticle-side numerical aperture of the projection optical system) can be set continuously. This will now be explained with reference to FIGS. 19A and 19B.

Figure 19A:
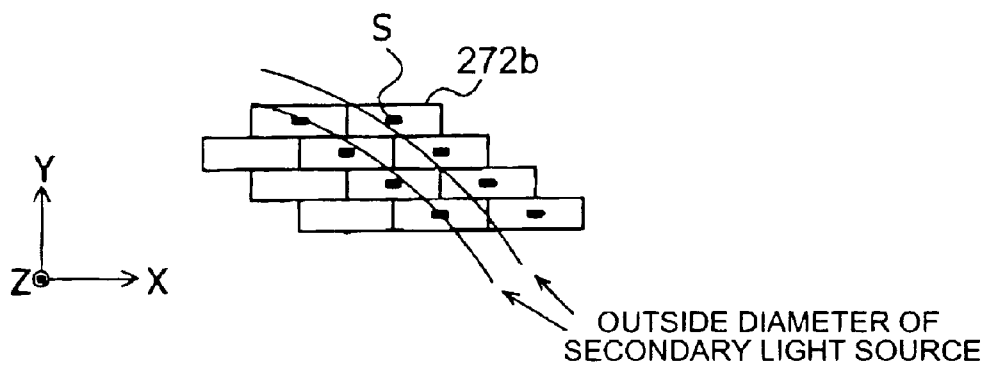
FIG. 19A is a view for explaining an effect of light source image enlarging member.
Figure 19B:
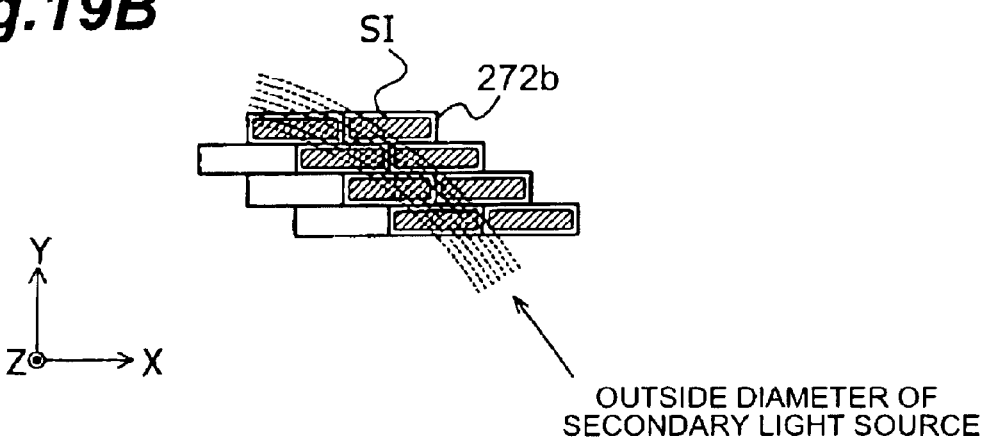
FIG. 19B is a view for explaining an effect of light source image enlarging member.

FIGS. 19A and 19B are plan views of an optical integrator as seen from its exit surface side, in which FIG. 19A shows a state where light source images S without enlargement are formed, whereas FIG. 19B shows a state where enlarged light source images S are formed.

In the case where light source images S without enlargement are formed as shown in FIG. 19A, a plurality of light source images S are disposed discretely from each other, whereby the outside diameter of secondary light source can be set only discretely as indicated by solid lines in the drawing. In the case where enlarged light source images SI are formed as shown in FIG. 19B, on the other hand, a plurality of enlarged light source images SI are arranged densely, whereby the outside diameter of secondary light source can be set substantially continuously as indicated by broken lines in the drawing. This can be effective in improving the image forming performance of projection exposure apparatus by continuously controlling a value.

Enlarging each of a plurality of light source images formed by an optical integrator as in this embodiment is particularly effective in the case where the number of lens surfaces constituting the optical integrator is smaller (the size of a plurality of lens surfaces is larger).

Enlarging each of a plurality of light source images formed by an optical integrator as in this embodiment also yields an effect of reducing the damage to optical members caused by flare light. Suppose a case where flare light occurs within an optical system from an optical integrator to a wafer and forms a focal point within or near an optical member of the optical system. In this case, if the size of light source images itself is greater, then the energy of flare light at the light-condensing position becomes lower, thereby yielding an effect of preventing the optical member (or thin films on the optical-member) from breaking and elongating the period of time until it breaks, i.e., its life.

Though the diffractive optical element 275 is used as light source image enlarging member in the sixth embodiment, it may be either a refraction optical element or a diffuser. Even when a refraction optical element or diffuser is used as light source image enlarging member, it is preferred that the range of angle of divergence from the light source image enlarging member be set to a desirable value, and that the illuminance distribution of light source image enlarging member in the far field region and that in the near field region (or at a position conjugate with the surface to be irradiated in the optical integrator) be substantially uniform.

Though the far field pattern formed in the far field region by the light source image enlarging member is circular or rectangular in the above-mentioned embodiment as shown in FIGS. 17B and 17C, the form of far field pattern is not limited thereto. For example, it may take various forms such as polygonal shapes including rectangular (square or oblong), hexagonal, trapezoidal, rhombic, and octagonal forms, elliptical forms and arc forms. However, it is preferred that the form of the far field pattern of light source image forming means be similar to that of the illumination area formed at the surface to be irradiated.

In the above-mentioned embodiment, the condenser optical system 209 for condensing light from the secondary light source formed at the exit surface of optical integrator 207 in order to illuminate the illumination field stop 210 in a superimposing manner is configured such that its projection characteristic becomes F sin è. Specifically, it satisfies the projection relationship of:

$$Y = F \sin \theta \qquad (1)$$

where F is the focal length of condenser optical system 209, è is the angle of incidence of a principal ray onto the condenser optical system 209 when the object-side focal position of the condenser optical system 209 is an entrance pupil, and Y is the distance from the optical axis to a position at which the principal ray emitted from the condenser optical system 209 is made incident on the surface to be irradiated or a surface conjugate therewith. Though the condenser optical system 209 is a zoom optical system with a variable focal length, it substantially maintains the projection relationship of the above-mentioned expression (1) upon zooming.

If the secondary light source is approximately considered to be a perfectly diffuse planer illuminant (perfectly diffuse planer light source) when the condenser optical system 209 is configured as such, then the illuminance and numerical aperture within the XY plane where the illumination field stop 210 is located can be made constant regardless of positions within the XY plane.

In order for the secondary light source formed by the optical integrator 207 to be approximately considered a perfectly diffuse planer illuminant in this embodiment, the micro lens surfaces 271a, 271b, 272a, 272b in the optical integrator 207 are formed aspheric, so as to achieve spherical aberration correction and coma correction (fulfillment of sine condition) of the optical integrator 207. In this embodiment, illumination beams with a uniform illuminance and uniform numerical aperture reach the illumination field stop 210, and consequently, the uniformity in illuminance and uniformity in numerical aperture can be achieved in the whole exposure area on the wafer W, which is a surface to be irradiated.

Though all the micro lens surfaces 271a, 271b, 272a, 272b are shaped into the same aspheric form for facilitating their making in this embodiment, the micro lens surface may have forms different from each other, and it is not necessary for all the micro lens surfaces to be provided with aspheric surfaces.

Also, all the micro lens surfaces 271a, 271b, 272a, 272b in the optical integrator 207 may have spherical forms. In this case, if the micro lens surfaces have respective surface forms different from each other, the sine condition can be fulfilled while correcting spherical aberration.

Though the micro fly's eye lenses 271, 272 are employed as the optical integrator 207 in this embodiment, a fly's eye lens constituted by a plurality of rod-shaped lenses integrated in a two-dimensional matrix may be employed in place thereof.

The micro fly's eye lens and the fly's eye lens are in common with each other in that a number of micro lens surfaces are arranged in a two-dimensional matrix. However, the micro fly's eye lens differs from the fly's eye lens composed of lens elements separated from each other in that a number of micro lens elements are integrally formed without being separated from each other.

As compared with the fly's eye lens, the micro fly's eye lens is advantageous in that the size of its micro lens surfaces can be made minute. When the size of micro lens surfaces is made minute, then the wavefront dividing effect of optical integrator 207 becomes very high, whereby the uniformity in illuminance at the surface to be irradiated (wafer W surface) can be improved, and the fluctuation in illuminance distribution at the surface to be irradiated and the fluctuation in telecentricity can be suppressed to a very low value even when illumination conditions are altered (e.g., from conventional illumination to modified illumination).

The above-mentioned embodiment comprises the entrance-side cover glass 273 and exit-side cover glass 274 in order to prevent surfaces of the micro fly's eye lenses 271, 272 and the diffractive optical element 275 acting as light source image enlarging member from being contaminated upon photochemical reactions. Even when contamination is generated due to a photochemical reaction, it will be sufficient if only a pair of cover glasses 273, 274 are replaced, without replacing a pair of micro fly's eye lenses 271, 272 and the diffractive optical element 275. Preferably, the optical path between the pair of cover glasses 273, 274 is filled with air having a higher degree of cleanness, dry air, and/or an inert gas such as nitrogen or helium.

Though the diffractive optical element 275 is disposed between the entrance-side cover glass 273 and the micro fly's eye lens 271 in the above-mentioned embodiment, the plane of entrance-side cover glass 273 on the exit side (micro fly's eye lens side) may be formed with a diffractive surface, refractive surface, or light-diffusing surface, so as to provide the exit surface of entrance-side cover glass 273 with light source image enlarging member.

In the case where, in order to regulate the illumination distribution at the surface to be irradiated (wafer W surface), an optical member (transmissivity distribution adjusting member) for adjusting the transmissivity distribution is disposed in an optical path on the light source side from the optical integrator at a position substantially conjugate with the surface to be irradiated, it is preferably disposed in an optical path between the entrance-side cover glass 273 and the micro fly's eye lens 271. This can reduce the contamination of transmissivity distribution adjusting member. Preferably, the transmissivity distribution adjusting member is disposed in an optical path between the diffractive optical element 275 acting as light source image enlarging member and the micro fly's eye lens 271 (a plurality of lens surfaces arranged in a two-dimensional matrix).

Such a transmissivity distribution adjusting member is disclosed in Japanese Patent Application Laid-Open No. SHO 64-42821, Japanese Patent Application Laid-Open No. HEI 7-130600, U.S. Pat. No. 5,615,047, Japanese Patent Application Laid-Open No. HEI 9-223661, Japanese Patent Application Laid-Open No. HEI 10-319321, U.S. Pat. No. 6,049,374, Japanese Patent Application Laid-Open No. 2000-21750, Japanese Patent Application Laid-Open No. 2000-39505, WO99/36832, and the like, for example.

Since a position near the entrance surface of the optical integrator 207 is taken as the image-side focal position of the zoom optical system 206 on the entrance side thereof in the above-mentioned embodiment, if a zeroth-order light component is emitted from the diffractive optical elements 251 to 253 due to a manufacture error or the like, then this zeroth order light component may become noise light.

Also, leakage light from between a plurality of lens surfaces may become noise light in the case where a plurality of lens surfaces are not densely arranged in a two-dimensional matrix, as in the fly's eye lens, or in the case where a plurality of lens surfaces are not formed densely due to a matter of convenience in the making of micro fly's eye lens.

In such a case, the exit-side cover glass may be provided with a light-shielding member for blocking the above-mentioned zeroth-order light component and leakage light. A light-shielding member provided in the exit-side cover glass will now be explained with reference to FIGS. 20A and 20B.

Figure 20A:
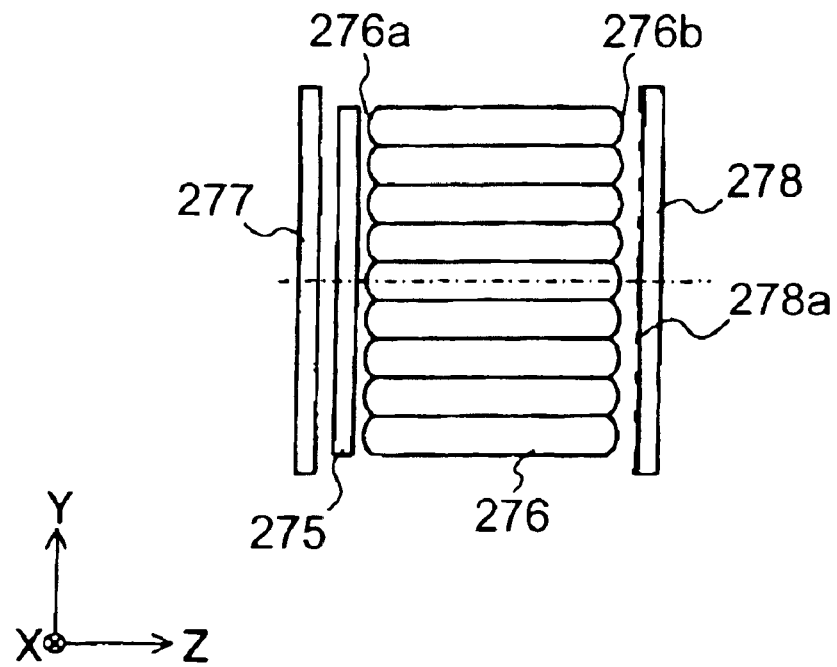
FIG. 20A is a view showing a light-shielding pattern provided in a cover glass.
Figure 20B:
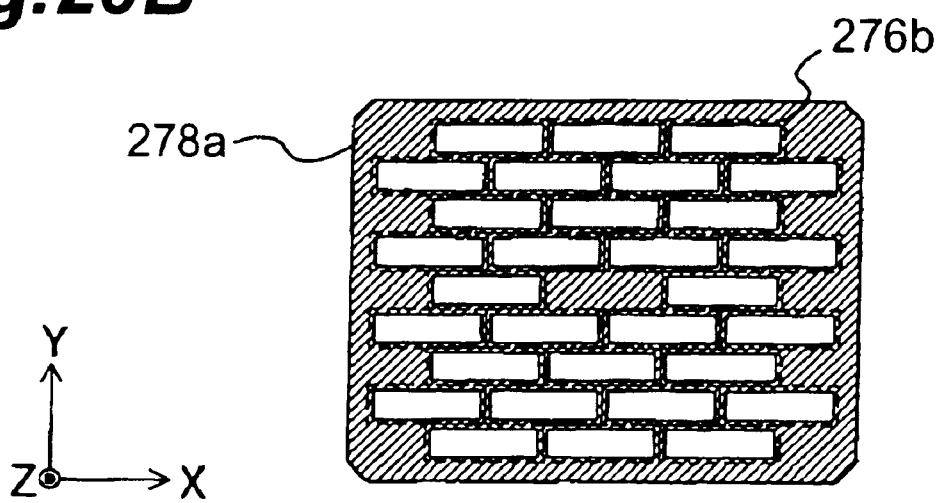
FIG. 20B is a view showing the light-shielding pattern provided in the cover glass.

FIGS. 20A and 20B are views for explaining the configuration of an optical integrator whose exit-side cover glass is provided with a light-shielding member, in which FIG. 20A is a YZ cross-sectional view, whereas FIG. 20B is an XY plan view showing the positional relationship between the exit-side cover glass and a fly eye's lens. In the example shown in FIGS. 20A and 20B, the optical integrator employs the fly's eye lens in place of the micro fly's eye lens.

The optical integrator shown in FIG. 20A comprises, successively from the light entrance side, an entrance-side cover glass 277, a diffractive optical element 275 as light source image enlarging member, a fly's eye lens 276 having a plurality of rod-shaped lens elements integrated in a two-dimensional matrix within XY plane, and an exit-side cover glass 278. These optical members are arranged so as to become coaxial with each other along an optical axis indicated by a dash-single-dot line in the drawing.

The exit-side cover glass 278 is provided with a light-shielding pattern 278a. This light-shielding pattern 278a is formed by depositing chromium or the like onto the exit-side cover glass 278, for example.

As shown in FIG. 20B, the light-shielding pattern 278a is positioned within XY plane so as to cover gaps between a plurality of lens elements constituting the fly's eye lens 276 (only the exit-side lens surface 276b being indicated by broken lines in FIG. 20B). For blocking the zeroth-order light component from the diffractive optical elements 251 to 235, this light-shielding pattern also covers positions in the vicinity of their optical axis.

Figure 21:
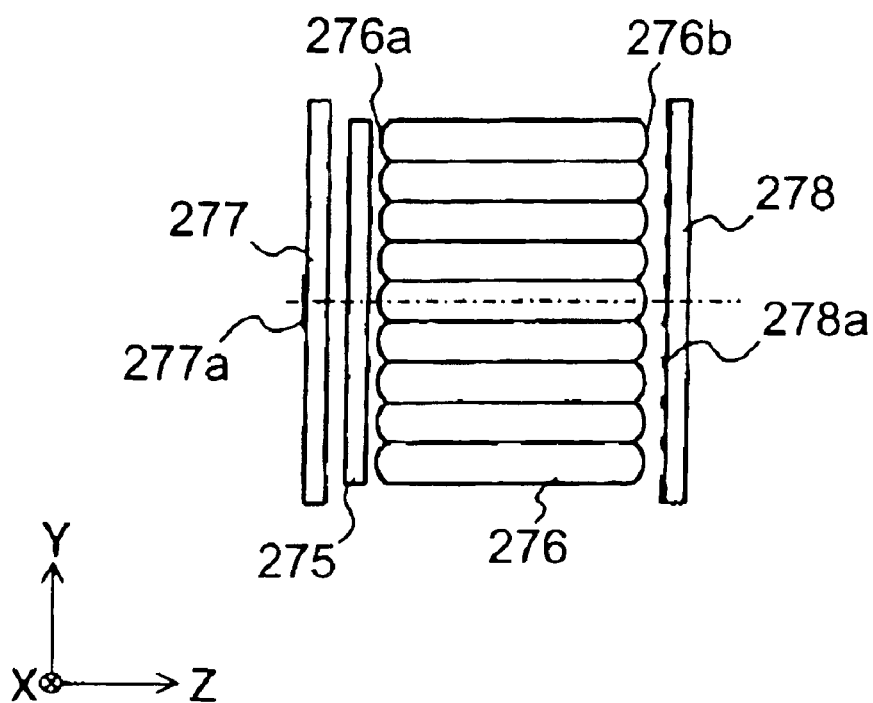
FIG. 21 is a view showing another light-shielding pattern provided in a cover glass.

As shown in FIG. 21, a light-shielding pattern 277a may be disposed at a position near the optical axis of the entrance-side cover glass 277 so as to prevent the zeroth-order light component from the diffractive optical elements 251 to 253 from converging at the image-side focal position of the zoom optical system 206 and damaging optical members near the converging point (entrance-side cover glass, micro fly's eye lens 271, and the like) and thin films on the optical members.

Returning to FIG. 14A, the configuration of zoom condenser optical system 209 will be explained. The zoom condenser optical system 209 comprises a plurality of lens groups along the optical axis direction (Z direction in the drawing), and can make its focal length variable by changing their intervals. Here, the object-side focal position of zoom condenser optical system 209 substantially coincides with the position of the secondary light source formed by the optical-integrator 207 (the position of iris stop 208 or the position of illumination pupil). Also, the illumination field stop 210 is positioned at the image-side focal position of zoom condenser optical system 209. The zoom condenser optical system 209 is configured such that its object-side and image-side focal positions would not fluctuate at the time when making its focal length variable. The movement of a plurality of lens groups of zoom condenser optical system 209 in the optical axis direction is carried out by a sixth driving unit 294.

When the focal length of zoom condenser optical system 209 is altered as such, then the size of the illumination area formed at the position of illumination field stop 210 can be changed.

The illumination field stop 210 has four light-shielding blades, for example, two of which have a pair of light-shielding sides along X direction in the drawing, whereas the remaining two light-shielding blades have a pair of light-shielding sides along Y direction in the drawing. These four light-shielding blades are driven by a seventh driving unit 297, so that the longitudinal and lateral sizes of the rectangular opening-portion formed by the light-shielding sides of four light-shielding blades can be set to given values. Two sets of light-shielding members, each having L-shaped orthogonal light-shielding sides, movable within XY plane may also be used in place of the four light-shielding blades.

As a consequence, the size of the illumination area formed on a reticle can be changed according to characteristics of the employed reticle without any loss in light energy quantity. Though the position of illumination field stop 210, and consequently, the numerical aperture of illumination light on the reticle R or wafer W change when the focal length of zoom condenser optical system 209 is altered, this will be compensated for when the size of secondary light source is altered by changing the focal length of zoom optical system 206 mentioned above.

The sixth driving unit 294 and seventh driving unit 297 are also regulated by the control unit 214.

Operations of the control unit 214 will now be explained. The control unit 214 is connected to an input unit 215 comprising, for example, a console or a reticle barcode reader disposed in a transfer path of the reticle R.

Information concerning various kinds of reticles to be successively subjected to exposure, information concerning illumination conditions of various kinds of reticles, information concerning exposure conditions of various kinds of wafers, and the like are fed into the control unit 214 by way of the input unit 215.

The control unit 214 stores information concerning desirable sizes of illumination area (exposure area), optimal illumination numerical aperture, optimal line width (resolution), desirable focal depth, and the like for various kinds of reticles and wafers in its internal memory, and supplies appropriate control signals to the first to seventh driving units in response to the input from the input unit 215.

For example, when carrying out conventional circular illumination under a desirable size of illumination area, optimal illumination numerical aperture, optimal resolution, and desirable focal depth, the first driving unit 234 positions the hole 233 into the illumination optical path according to a command from the control unit 214, and the third driving unit 254 positions the diffractive optical element 253 for conventional illumination into the illumination optical path according to a command from the control unit 214. Then, for yielding a desirable size of illumination area on the reticle R, the sixth driving unit 294 sets the focal length of zoom condenser optical system 209 according to a command from the control unit 214, and the seventh driving unit 294 sets the size and form of opening portion of the illumination field stop 210 according to a command from the control unit 214. Also, for yielding a desirable illumination numerical aperture on the reticle R, the fourth driving unit 264 sets the focal length of zoom optical system 206 according to a command from the control unit 214. For defining the outside diameter of the circular secondary light source formed by the optical integrator 207 in a state where the loss in light energy quantity is favorably suppressed, the fifth driving unit 284 sets the diameter of opening of the iris stop 208 according to a command from the control unit 214.

Since the circular secondary light source having a given size is formed by the zoom optical system 206 without blocking the beam, the iris stop 208 in this embodiment can be set to an opening diameter which is sufficient for blocking the flare light outside the circular secondary light source.

When the operation of changing the focal length of zoom optical system 204 caused by the fourth driving unit 264 and the operation of changing the focal length of zoom condenser optical system 209 caused by the sixth driving unit 294 are combined together, the size of illumination area in the reticle R and the illumination numerical aperture can be changed independently from each other.

When carrying out annular illumination under a desirable size of illumination area, optimal illumination numerical aperture, optimal resolution, and desirable focal depth, the first driving unit 234 positions the micro fly's eye lens 231 for annular illumination into the illumination optical path according to a command from the control unit 214, and the third driving unit 254 positions the diffractive optical element 251 for annular illumination into the illumination optical path according to a command from the control unit 214. Then, for yielding a desirable size of illumination area on the reticle R, the sixth driving unit 294 sets the focal length of zoom condenser optical system 209 according to a command from the control unit 214, and the seventh driving unit 294 sets the size and form of opening portion of the illumination field stop 210 according to a command from the control unit 214. Also, for yielding a desirable illumination numerical aperture on the reticle R, the fourth driving unit 264 sets the focal length of zoom optical system 206 according to a command from the control unit 214. For defining the outside diameter of the annular secondary light source formed by the optical integrator 207 in a state where the loss in light energy quantity is favorably suppressed, the fifth driving unit 284 sets the diameter of opening of the iris stop 208 according to a command from the control unit 214.

Since the annular secondary light source having a given annularity ratio and a given outside diameter is formed by the diffractive optical element 251 for annular illumination and the zoom optical systems 204, 206 without blocking the beam, the iris stop 208 in this embodiment can be set to an opening diameter which is sufficient for blocking the flare light outside the annular secondary light source.

The above-mentioned illumination numerical aperture at the time of annular illumination is defined by a light beam emitted from the outermost position of annular secondary light source.

When carrying out quadrupolar illumination under a desirable size of illumination area, optimal illumination numerical aperture, optimal resolution, and desirable focal depth, the first driving unit 234 positions the micro fly's eye lens 232 for quadrupolar illumination into the illumination optical path according to a command from the control unit 214, and the third driving unit 254 positions the diffractive optical element 252 for quadrupolar illumination into the illumination optical path according to a command from the control unit 214. Then, for yielding a desirable size of illumination area on the reticle R, the sixth driving unit 294 sets the focal length of zoom condenser optical system 209 according to a command from the control unit 214, and the seventh driving unit 294 sets the size and form of opening portion of the illumination field stop 210 according to a command from the control unit 214. Also, for yielding a desirable illumination numerical aperture on the reticle R, the fourth driving unit 264 sets the focal length of zoom optical system 206 according to a command from the control unit 214. For blocking the flare light outside the quadrupolar secondary light source, the fifth driving unit 284 sets the diameter of opening of the iris stop 208 according to a command from the control unit 214.

The above-mentioned illumination numerical aperture at the time of quadrupolar illumination is defined by a light beam emitted from the position farthest from the optical axis in the quadrupolar secondary light source.

Though the condenser optical system (zoom condenser optical system 209) for guiding the beam from the secondary light source into the illumination field stop conjugate with the surface to be irradiated is configured so as to have a variable focal length in the above-mentioned embodiment, the condenser optical system may have a substantially fixed focal length.

As mentioned above, the illuminance distribution within the exposure area on the wafer W may fluctuate if illumination conditions with respect to the reticle R (exposure conditions with respect to the wafer W) are changed. In such a case, an exposure amount distribution corresponding to an uneven illuminance distribution occurs within the exposure area in a batch exposure type projection exposure apparatus, whereas an exposure amount distribution occurs along a non-scanning direction in a scanning type exposure apparatus.

In this embodiment, since the number of wavefront divisions caused by the optical integrator is made very large, the fluctuation in illuminance at the surface to be irradiated and the fluctuation in telecentricity thereat are sufficiently small even when illumination conditions (exposure conditions) are changed.

When their amount of fluctuation is impermissible, however, it is preferred that the fluctuation of illuminance distribution within the exposure area along with the change in illumination conditions with respect to the reticle R (exposure conditions with respect to the wafer W) be determined beforehand, and the illuminance distribution (the exposure amount distribution along the non-scanning direction (X direction)) be corrected upon changing illumination conditions (or exposure conditions).

Examples of techniques for correcting the illuminance distribution (or exposure amount distribution) include:

(1) a technique in which at least apart of lens groups constituting the zoom condenser optical system 209 is moved with respect to at least one direction selected from the optical axis direction, a direction orthogonal to the optical axis, and a rotating direction whose axis is a direction orthogonal to the optical axis;

(2) a technique in which a plurality of sets of filters, each having an angular characteristic with its transmissivity varying depending on the angle of incidence, are prepared so as to yield angular characteristics different from each other and are selectively inserted into an optical path between the optical integrator 207 and zoom condenser optical system 209 (the optical path in which the light beam emitted from the optical axis of secondary light source is not parallel to the optical axis), or a technique in which the tilting angle of filter is adjusted in addition to exchanging the filters;

(3) a technique in which a plurality of transmissivity distribution adjusting members, to be positioned substantially conjugate with the surface to be irradiated in an optical path on the light source side from the optical integrator 207, for adjusting the transmissivity distribution are prepared so as to yield transmissivity distributions different from each other and are exchanged therebetween; and (4) a technique in which the form of opening of the illumination field stop 210 is deformed such that the opening width along the scanning direction yields a predetermined distribution in a non-scanning direction.

A batch exposure type projection exposure apparatus can yield a given illuminance distribution on the surface to be irradiated by using any of the above-mentioned techniques (1) to (3) or arbitrarily combining the above-mentioned techniques (1) to (3). A scanning type exposure apparatus can arbitrarily control the exposure amount distribution in a non-scanning direction on the surface to be irradiated by using any of the above-mentioned techniques (1) to (4) or arbitrarily combining the above-mentioned techniques (1) to (4).

As the above-mentioned technique (1), one disclosed in Japanese Patent Application Laid-Open No. HEI 10-275771 (U.S. Pat. No. 6,127,095) and the like, for example, can be used. As the above-mentioned technique (2), one disclosed in Japanese Patent Application Laid-Open No. HEI 9-190969, for example, can be used. As for the above-mentioned technique (3), transmissivity distribution adjusting members disclosed in the above-mentioned Japanese Patent Application Laid-Open No. SHO 64-42821, Japanese Patent Application Laid-Open No. HEI 7-130600 (U.S. Pat. No. 5,615,047), Japanese Patent Application Laid-Open No. HEI 9-223661, Japanese Patent Application Laid-Open No. HEI 10-319321 (U.S. Pat. No. 6,049,374), Japanese Patent Application Laid-Open No. 2000-21750, Japanese Patent Application Laid-Open No. 2000-39505, WO99/36832, and the like may be provided in an exchangeable manner. As for the above-mentioned technique (4), those disclosed in Japanese Patent Application Laid-Open No. HEI 7-1423313 (EP 633506 A), Japanese Patent Application Laid-Open No. HEI 10-340854 (U.S. Pat. No. 5,895,737), Japanese Patent Application Laid-Open No. 2000-58442 (EP 952491 A), Japanese Patent Application Laid-Open No. 2000-82655, Japanese Patent Application Laid-Open No. 2000-114164, and the like, for example, may be used.

Employable as the technique for correcting unevenness in illuminance is not only the technique in which the fluctuation in illuminance distribution within the exposure area along with the change in illumination conditions with respect to the reticle R (exposure conditions with respect to the wafer W) is determined beforehand, but also a technique in which the fluctuation in illuminance distribution on the wafer W is measured at the time of changing illumination conditions, and thus measured amount of fluctuation is corrected.

Examples of the method of correcting fluctuation in telecentricity include a technique in which the position of optical integrator 207 in the optical axis direction is adjusted, and a technique in which a part of lens groups of zoom condenser optical system 209 is tilted.

Though the diffractive optical elements 251 to 253 are used for forming annular, multipolar, and circular secondary light sources without light energy quantity loss in the above-mentioned embodiment, a refraction optical element for forming a annular, multipolar, or circular illumination area in a far field upon a refracting action may be used in place of the diffractive optical elements. An example of such a refraction optical element is disclosed in WO99/49505.

In this embodiment, not only the individual lens elements constituting the illumination optical apparatus (lens elements in the afocal zoom optical system 204, zoom optical system 206, zoom condenser optical system 209, and illumination field stop image forming optical system 211) and projection optical system PL, but also the surfaces of microfly's eye lenses 231, 232, 271, 272, diffractive optical elements 251 to 253, 275, and cover glasses 273, 274 are formed with an antireflection film adapted to prevent reflection from occurring with respect to the wavelength of illumination light. In particular, since the micro fly's eye lenses 231, 232, 271, 272 and diffractive optical elements 251 to 253, 275 are formed with an antireflection film, reflection can be suppressed there, whereby the illuminance on the surface to be irradiated can be enhanced efficiently. Especially, since the diffractive optical element may incur light energy quantity loss because of the fact that their efficiency of diffraction is not 100%, the reduction of light energy quantity loss effected by the antireflection film is important for enhancing the illuminance on the surface to be irradiated.

Here, examples of materials constituting the antireflection film include $AlF_3$ (aluminum fluoride); $BaF_2$ (barium fluoride); $CaF_2$ (calcium fluoride); $CeF_3$ (cerium fluoride); CsF (cesium fluoride); $ErF_3$ (erbium fluoride); $GdF_3$ (gadolinium fluoride); $HfF_2$ (hafnium fluoride); $LaF_3$ (lanthanum fluoride); LiF (lithium fluoride); $MgF_2$ (magnesium fluoride); NaF (sodium fluoride); $Na_3AlF_6$ (cryolite); $Na_5Al_3F_{14}$ (chiolite); $NdF_3$ (neodymium fluoride); $PbF_2$ (lead fluoride); $ScF_3$ (scandium fluoride); $SrF_2$ (strontium fluoride); $TbF_3$ (terbium fluoride); $ThF_4$ (thorium fluoride); $YF_3$ (yttrium fluoride); $YbF_3$ (ytterbium fluoride); $SMF_3$ (samarium fluoride); $DyF_3$ (dysprosium fluoride); $PrF_3$ (praseodymium fluoride); $EuF_3$ (europium fluoride); $HoF_3$ (holmium fluoride); bismuth fluoride ($BiF_2$); a fluorine resin comprising at least one material selected from the group consisting of tetrafluoroethylene resin (polytetrafluoroethylene, PTFE), chlorotrifluoroethylene resin (polychlorotrifluoroethylene, PCTFE), vinyl fluodride resin (polyvinyl fluoride, PVF), ethylene tetrafluoride/propylelne hexafluoride copolymer (fluorinated ethylene propylene resin, FEP), vinylidene fluoride resin (polyvinylidene fluoride, PVDF), and polyacetal (POM); $Al_2O_3$ (aluminum oxide); $SiO_2$ (silicon oxide); $GeO_2$ (germanium oxide); $ZrO_2$ (zirconium oxide); $TiO_2$ (titanium oxide); $Ta_2O_3$ (tantalum oxide); $Nb_2O_5$ (niobium oxide); $HfO_2$ (hafnium oxide); $CeO_2$ (cerium oxide); MgO (magnesium oxide); $Nd_2O_3$ (neodymium oxide); $Gd_2O_3$ (gadolinium oxide); $ThO_2$ (thorium oxide); $Y_2O_3$ (yttrium oxide); $Sc_2O_3$ (scandium oxide); $La_2O_3$ (lanthanum oxide); $Pr_6O_{11}$ (praseodymium oxide); ZnO (zinc oxide); PbO (lead oxide); a mixture group and complex compound group comprising at least two materials selected from a group of silicon oxides; a mixture group and complex compound group comprising at least two materials selected from a group of hafnium oxides; and a mixture group and complex compound group comprising at least two materials selected from a group of aluminum oxides.

Hence, in this embodiment, at least one kind of material selected from the group mentioned above is used as a material for the antireflection film.

Examples of a technique employable for forming the antireflection film made of the above-mentioned material on the micro fly's eye lenses 231, 232, 271, 272 and the diffractive optical elements 251 to 253, 275 include vacuum vapor deposition method, ion-assisted vapor deposition method, ion plating method, cluster ion beam method, sputtering method, ion beam sputtering method, CVD (chemical vapor deposition) method, immersion coating method, spin coating method, meniscus coating method, and sol-gel method.

A technique for making the micro fly's eye lenses 231, 232, 271, 272, and diffractive optical elements 251 to 253, 275 will now be explained in brief. First, form distributions of lens surfaces of the micro fly's eye lenses or diffraction pattern distributions of diffractive optical elements are designed. Subsequently, an exposure original is made according to the design data. Then, a substrate for micro fly's eye lenses or diffractive optical elements is prepared, and a photosensitive material is applied onto the substrate. A pattern on the exposure original is transferred to the substrate coated with the photosensitive material according to a photolithography technique. Thereafter, the substrate is developed and is etched with the developed pattern being used as a mask. The etching forms a plurality of lens surfaces (in the case of micro fly's eye lenses) or a diffraction pattern (diffractive optical element) on the substrate. This step of exposure, development, and etching is not restricted to once. Thereafter, the photosensitive material is removed from the substrate, and a thin film made of the above-mentioned material is formed on a surface of the substrate formed with a plurality of lens surfaces (in the case of micro fly's eye lenses) or a diffraction pattern (diffractive optical element) according to the above-mentioned technique, so as to form an antireflection film.

As a consequence, the light energy quantity loss in the micro fly's eye lenses 231, 232, 271, 272 and diffractive optical elements 251 to 253, 275 and the flare light due to reflections at their interfaces can be reduced, whereby the illuminance on the surface to be irradiated (on the wafer W surface) can be enhanced under a favorable illuminance uniformity.

As a material of the substrate for forming the micro fly's eye lenses 231, 232, 271, 272 and diffractive optical elements 251 to 253, 275, silica glass, fluorite, and silica glass doped with fluorine can be used. When the precision of etching is taken into account, silica glass or fluorine-doped silica glass is preferably used as the substrate material. If the wavelength (157 nm) of $F_2$ laser is used as illumination light, then fluorine-doped silica glass is preferably used as the substrate material.

Though the forgoing explanations relate to a case where a wavefront dividing type optical integrator (micro fly's eye lens or fly eye's lens) having micro lens surfaces arranged in a two-dimensional matrix is employed as an optical integrator, an internal reflection type integrator (rod type optical integrator, light tunnel, or light pipe) using internal reflection of a columnar optical member can also be employed as the optical integrator. In this case, in place of the micro fly's eye lenses 271, 272 and zoom condenser optical system 209 in the optical integrator 207 of FIG. 14A, a light-condensing optical system for forming a far field region of the diffractive optical element 275 onto the light-entrance surface of the internal reflection type optical integrator and the internal reflection type optical integrator having a light-exit surface positioned at or near the illumination field stop position may be disposed. In this case, the size of converging point at the light-entrance surface position of internal reflection type optical integrator can be enlarged by the diffractive optical element 275, which is effective in reducing damages to the light-entrance surface, and the size of virtual images of a plurality of light sources formed at the light-entrance surface, per se, can be enlarged by the diffractive optical element 275, which is effective in that σ value can be set continuously.

Though the above-mentioned embodiment explains a scanning type exposure apparatus by way of example, the present invention is also applicable to batch type exposure apparatus.

The projection magnification of the projection optical system may be not only that of reduction but also that of enlargement magnification or one-to-one magnification (unit magnification). As the projection optical system, any of dioptric optical system, catadioptric optical system, and cataptric optical system is employable.

Though the wavelength supplied by the light source 201 is 248 nm or 193 nm in the above-mentioned embodiment, $F_2$ laser supplying light having a wavelength of 157 nm in vacuum ultraviolet region may also be used as the light source 201.

When individual optical members and the like in the above-mentioned embodiment are electrically, mechanically, or optically connected together so as to achieve functions such as those mentioned above, a photo-lithgrahicexposure apparatus in accordance with this embodiment can be assembled.

If a mask is illuminated with an illumination system IL (illumination step), and a photosensitive substrate is exposed in a scan exposure or batch exposure manner to a transfer pattern formed in a mask by use of a projection optical system PL composed of projection optical modules (exposure step), then a micro device (semiconductor device, liquid crystal display device, thin film magnetic head, or the like) can be made. An example of technique for yielding a semiconductor device as a micro device by forming a predetermined circuit pattern on a wafer or the like acting as a photosensitive substrate (work) by use of the exposure apparatus of the above-mentioned embodiment will now be explained with reference to the flowchart of FIG. 22.

Figure 22:
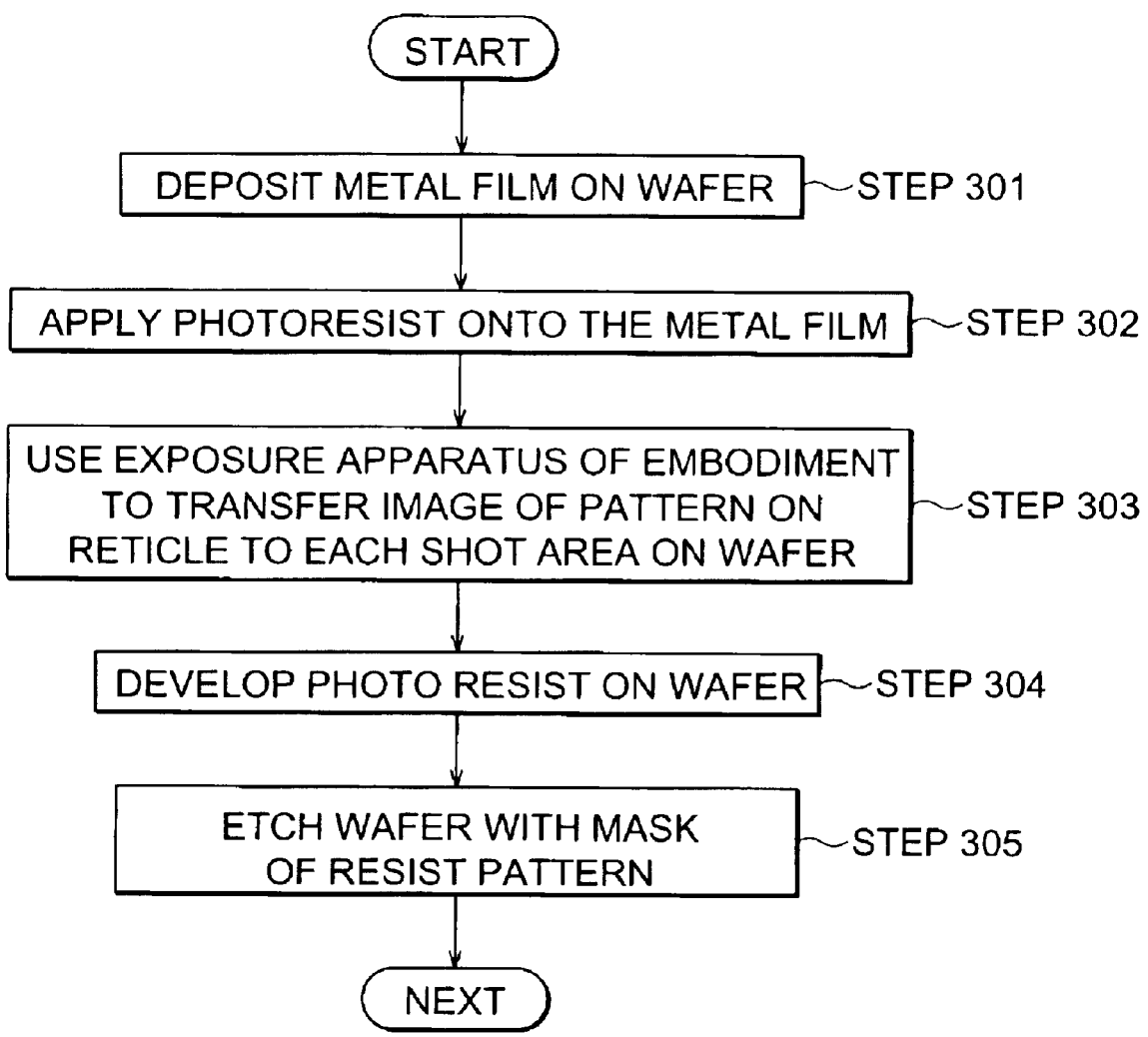
FIG. 22 is a flowchart showing a process for yielding a semiconductor device.

First, at step 301 of FIG. 22, a metal film is deposited on one lot of wafer. Subsequently, at step 302, a photoresist is applied onto the metal film on this one lot of wafer. Then, at step 303, the exposure apparatus shown in above embodiments is used such that an image of a pattern on the mask is successively projected and transferred onto individual shot areas on the one lot of water by way of the projection optical system (projection optical modules) of the exposure apparatus. Thereafter, the photoresist on the one lot of wafer is developed at step 304, and then etching is effected on the one lot of wafer while using the resist pattern as the mask at step 305, whereby a circuit pattern corresponding to the pattern on the mask is formed in each shot area on each wafer. Thereafter, circuit patterns of upper layer are formed and so forth, whereby a device such as semiconductor device is made. The foregoing semiconductor device making method can yield a semiconductor device having a very fine circuit pattern with a favorable throughput.

Also, the exposure apparatus of the above-mentioned embodiment can yield a liquid crystal display device as a micro device by forming a predetermined pattern (circuit pattern, electrode pattern, or the like) onto a plate (glass substrate). An example of this technique will now be explained with reference to the flowchart of FIG. 23.

Figure 23:
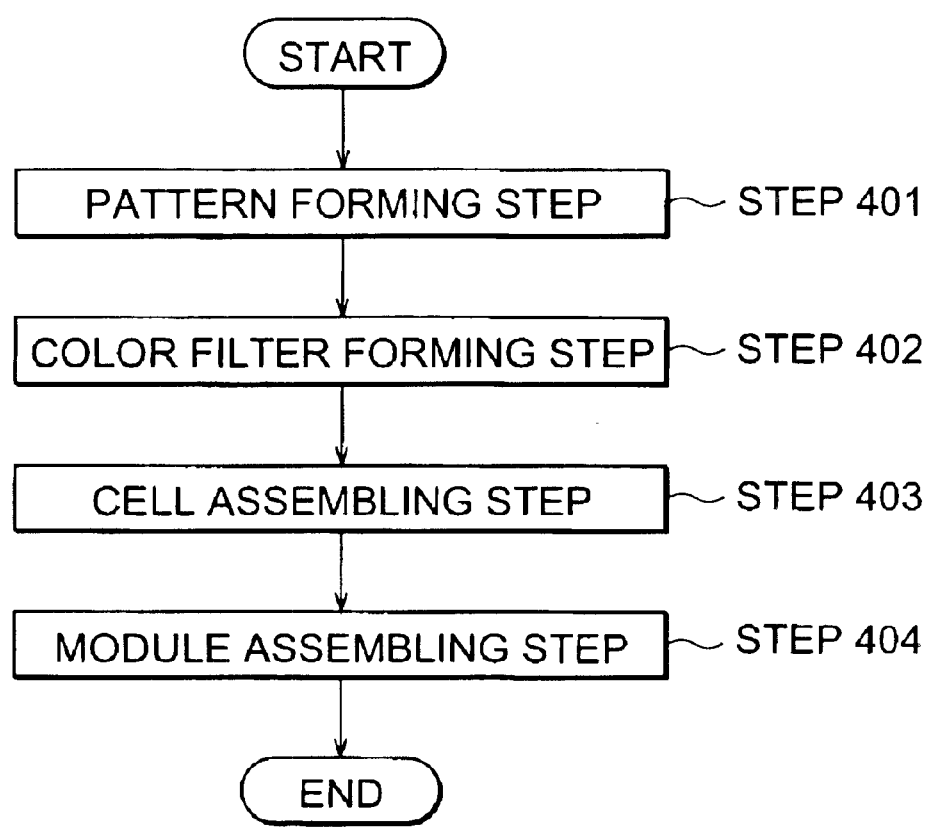
FIG. 23 is a flowchart showing a process for yielding a liquid crystal display device.

In FIG. 23, so-called photolithography step in which the exposure apparatus of this embodiment is used for transferring and projecting a mask pattern onto a photosensitive substrate (a glass substrate or the like coated with resist) is carried out at pattern forming step 401. As a consequence of this photolithography step, a predetermined pattern including a number of electrodes and the like are formed on the photosensitive substrate. Thereafter, the exposed substrate is subjected to individual steps such as developing step, etching step, and reticle peeling step, so that a predetermined pattern is formed on the substrate, and then the flow shifts to color filter forming step 402 subsequent thereto.

Next, at color filter forming step 402, a color filter in which a number of three-dot sets corresponding to R (Red), G(Green), and B (Blue) are arranged in a matrix, or a plurality of three-stripe filter sets of R, G, B are arranged in a horizontal scanning line direction is formed. After the color filter forming step 402, cell assembling step 403 is performed. At the cell assembling step 403, the substrate having a predetermined pattern obtained at the pattern forming step 401, the color filter obtained at the color filter forming step 402, and the like are used for assembling a liquid-crystal panel (liquid crystal cell). At the cell assembling step 403, for example, a liquid crystal is injected between the substrate having a predetermined pattern obtained at the pattern forming step 401 and the color filter obtained at the color filter forming step 402, so as to make the liquid crystal panel (liquid crystal cell).

Thereafter, at module assembling step 404, individual parts such as an electric circuit for causing the assembled liquid crystal panel (liquid crystal cell) to perform displaying operations, a back light, and the like are assembled, so as to accomplish a liquid crystal display device. According to the foregoing method of making a liquid crystal display device, a liquid crystal display device having a very fine circuit pattern can be obtained with a favorable throughput.

Thus, without being restricted to the above-mentioned embodiments, the present invention can be modified in various ways within the scope thereof.

As in the foregoing, the embodiments of present invention can reduce damages to optical members in illumination optical apparatus or improve the efficiency of illumination of illumination optical apparatus, and can improve image forming performances when applied to projection exposure apparatus.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A wavefront dividing type optical integrator comprising:

a plurality of micro optical elements arranged two-dimensionally, for forming a plurality of light sources by dividing a wavefront of an incident beam;

wherein each of said micro optical elements has a rectangular entrance surface and a rectangular exit surface, and wherein at least one of the following conditions is satisfied:

$$(d_1/2)(D_1/2)/(\lambda \cdot f) \geq 3.05$$

$$(d_2/2)(D_2/2)/(\lambda \cdot f) \geq 3.05$$

where f is a focal length of each of said micro optical elements, $d_1$ is a length of one side of the entrance surface of each of said micro optical elements, $d_2$ is a length of the other side of the entrance surface of each of said micro optical elements, $D_1$ is a length of the side of an exit surface in each of said micro optical elements corresponding to said one side of the entrance surface, $D_2$ is a length of the side of the exit surface in each of said micro optical elements corresponding to said other side of the entrance surface, and $\lambda$ is a wavelength of said incident beam.

2. An optical integrator according to claim 1, wherein each of said micro optical elements has a micro lens.

3. An optical integrator according to claim 2, wherein the length $d_1$ of said one side of the entrance surface is longer than the length $d_2$ of said other said of the entrance surface, and wherein the condition:

$$(d_1/2)(D_1/2)/(\lambda \cdot f) \geq 3.05$$

is satisfied.

4. A wavefront dividing type optical integrator, comprising:

a plurality of micro optical elements arranged two-dimensionally, for forming a plurality of light sources by dividing a wavefront of an incident beam, wherein each of said micro optical element has a rectangular entrance surface and a circular or a regular hexagonal exit surface, and wherein at least one or the following conditions is satisfied:

$$(d_1/2)(D/2)/(\lambda \cdot f) \geq 3.05$$

$$(d_2/2)(D/2)/(\lambda \cdot f) \geq 3.05$$

where f is a focal length of each of said micro optical elements, $d_1$ is a length of one side of the entrance surface of each of said micro optical elements, $d_2$ is a length of the other side of the entrance surface of each of said micro optical elements, D is a diameter of the circular exit surface or a diameter of a circle circumscribing the regular hexagonal exit surface of each of said micro optical elements, and $\lambda$ is a wavelength of said incident beam.

5. An optical integrator according to claim 4, wherein each of said micro optical elements has a micro lens.

6. An optical integrator according to claim 5, wherein the length $d_1$ of said one said of the entrance surface is longer than the length $d_2$ of said other side of the entrance surface, and wherein the condition:

$$(d_1/2)(D/2)/(\lambda \cdot f) \geq 3.05$$

is satisfied.

7. An observation apparatus for forming an image of an object to be observed, said observation apparatus comprising:

the illumination optical apparatus according to claim 4 for illuminating said object to be observed; and an image forming optical system, disposed between said object to be observed and said image, for forming an image of said object to be observed according to a light having traveled by way or said object to be observed.

8. A wavefront dividing type optical integrator, comprising:

a plurality of micro optical elements arranged two-dimensionally, for forming a plurality of light sources by dividing a wavefront of an incident beam, wherein each of said micro optical elements has a circular entrance surface with a diameter of d, or a regular hexagonal entrance surface inscribed in a circle having a diameter of d, wherein each of said micro optical elements has a circular exit surface with a diameter of d, or a regular hexagonal exit surface inscribed in a circle having a diameter of d, and wherein the following condition is satisfied:

$$(d_1/2)2/(\lambda \cdot f) \geq 3.05$$

where f is a focal length of each of said micro optical elements, and $\lambda$ is a wavelength of said incident beam.

9. An optical intergrator according to claim 8, wherein said micro optical element have a micro lens.

10. An illumination optical apparatus for illuminating a surface to be irradiated with a from a light source, said illumination optical apparatus comprising:
   the optical integrator according to claim 2, disposed in an optical path between said light source and said surface to be irradiated, for forming a plurality of light
   a light-guiding optical system, disposed in an optical path between said optical integrator and said surface to be irradiated, for guiding beams from a plurality of light sources formed by said optical integrator to said surface to be irradiated.

11. An illumination optical apparatus according to claim 10, wherein said light-guiding optical system comprises:
   a condenser optical system disposed in the optical path between said optical integrator and said surface to be irradiated, for condensing said beams from said light sources formed by said optical integrator so as to form an illumination field in a superposing manner; and
   an image forming optical system, disposed in the optical path between said condenser optical system and said surface to be irradiated, for forming an image of said illumination field near said surface to be irradiated with a beam from said illumination field.

12. An illumination optical apparatus according to claim 11, wherein said light-guiding optical system comprises:
   an aperture stop, disposed in an optical path of said image forming optical system at a position substantially optically conjugate with a position where said plurality of light sources are formed, for blocking an unnecessary beam.

13. An illumination optical system according to claim 10, wherein each of said micro lens in said optical intregrator has at least one refractive surface formed into an aspheric form which is symmetrical about an axis parallel to a reference optical axis.

14. An illumination optical system according to claim 13, wherein said optical integrator has a number of combining optical systems whose optical axes are respective axes parallel to said reference optical axis
   at least one refractive surface formed aspheric being formed into a predetermined aspheric surface in order to favorably restrain coma from occurring in said combing optical systems.

15. An illumination optical system according to claim 13, further comprising:
   a filter, disposed near the entrance side of said optical integrator, having a predetermined optical transmissivity distribution which contributes to correct an unevenness in illumination on said surface to be irradiated; and
   a positioning sub-system, connected to said optical integrator and said filter, for positioning said optical integrator and said filter with respect to each other.

16. An illumination optical system according to claim 13, wherein an iris stop adapted to change size of an opening portion is disposed adjacent the exit surface of said optical integrator.

17. An illumination optical system according to claim 13, wherein said optical integrator has at least two optical element bundles disposed along said reference optical axis with a gap therebetween.
   at least two of said optical element bundles having said aspheric optical surface.

18. An illumination optical system according to claim 17, wherein at least two of said optical element bundles have a number of combining optical system each comprising at least two micro optical elements corresponding to each other along said axis, all optical surfaces in said combining optical system being formed into aspheric surfaces having properties identical to each other.

19. An illumination optical system according to claim 17, further comprising:
   a positioning sub-system, connected to at least two of said optical element bundles, for positioning at least two of said optical element bundles with resect to each other.

20. An illumination optical system according to claim 13, wherein said optical integrator has at least 1,000 axes.

21. An exposure apparatus for transferring a pattern on a first surface onto a second surface, comprising:
   an illumination optical apparatus according to claim 13 for illuminating said first surface; and
   a projection optical apparatus, disposed in an optical path between said first surface and said second surface, for projecting said pattern onto said second surface,
   wherein said illumination optical system further comprises an optical intensity distribution changing member, disposed in an optical path between said light source and said optical integrator, for changing an optical intensity distribution of a beam incident on said optical integrator.

22. An illumination optical system according to claim 10, comprising a light source image enlarging member, disposed in an optical path between said optical intergrator and said light source at or near a position conjugate with said surface to be irradiated, for enlarging said light source images.

23. An illumination optical system according to claim 22, wherein a beam divergent angle of said light source image enlarging member is determined such that no loss in illumination light occurs in said optical integrator.

24. An illumination optical system according to claim 23, wherein said optical integrator has a plurality of lens surface, arranged two-dimensionally, each forming said light source image,
   wherein said light source image enlarging member enlarges said light source image formed by said lens surface, and
   wherein said beam diverging angle of said light source image enlarging member is set such that said enlarged light source image is smaller than said lens surface.

25. An illumination optical system according to claim 22, wherein said optical integrator has a plurality of lens surfaces, arranged two-dimensionally, each forming said light source image.

26. An illumination optical system according to claim 22, wherein a substantially uniform illuminance distribution is formed in a near field of said light source image enlarging member.

27. An illumination optical system according to claim 22, wherein only one pattern is formed in a far field of said light source image enlarging member.

28. An illumination optical system according to claim 22, wherein said far field pattern of said light source image enlarging member is circular, elliptical, or polygonal.

29. An illumination optical system according to claim 22, wherein sad illumination optical system forms a secondary light at a pupil thereof, and
   wherein said secondary light source having an optical intensity distribution in which the optical intensity in a pupil center region including an optical axis in a region on said pupil is set lower than that in a region surrounding said pupil center region is formed.

30. An illumination optical system according to claim 22, further comprising a diffractive optical element, disposed in an optical path between said light source and said optical integrator, for controlling said optical intensity distribution of said secondary light source.

31. An illumination optical system according to claim 30, comprising a zeroth-order light blocking member, disposed in an optical path between said diffractive optical element and said optical integrator, for blocking a zeroth-order light from said diffractive optical element.

32. An illumination optical system according to claim 31, wherein said optical integrator comprises:
a plurality of lens surfaces arranged two-dimensionally; and
an entrance-side cover glass disposed on the entrance side of said plurality of lens surfaces, and
said entrance-side cover glass being provided with said zeroth-order light blocking member.

33. An illumination optical system according to claim 22, wherein said light source image enlarging member has a diffractive optical element or diffuser.

34. An illumination optical system according to claim 33, wherein an anti-reflection film with respect to a wavelength of said illumination light is disposed on a surface of said diffractive optical element or diffuser.

35. An illumination optical system according to claim 34, wherein said anti-reflection film has at least one ingredient selected from; aluminum fluoride; barium fluoride; calcium fluoride; cerium fluoride; cesium fluoride; erbium fluoride; gadolinium fluoride; hafnium fluodride; lanthanum fluoride; lithium fluoride; magnesium fluoride; sodium fluoride; cryolite; chiolite; neodymium fluoride; lead fluoride; scandium fluoride; strontium fluoride; terbium fluoride; thorium fluoride; yttrium fluoride; ytterbium fluoride; samarium fluoride; dysprosium fluoride; praseodymium fluoride; curopium fluoride; holmium fluoride; oismuth fluoride; a fluorine resin comprising at least one material selected from the group including; polytetrafluoroethylene; polychlorotrifluoroethylene; polyvinyl fluoride; fluorinated ethylene propylene resin; polyvinylidene fluoride; and polyacetal; aluminum oxide; silicon oxide; germanium oxide; zirconium oxide; titanium oxide; tantalum oxide; niobium oxide; hafnium oxide; cerium oxide; magnesium oxide; neodymium oxide, gadolinium oxide; thorium oxide; yttrium oxide; scandium oxide; lanthanum oxide; praseodymium oxide; zinc oxide; lead oxide; a mixture group and a complex compound group comprising at two materials selected from a group of silicon oxides; a mixture group and complex compound group comprising at least two materials selected from a group of hafnium oxides; and a mixture group and a compound group comprising at least two materials selected from a group of aluminum oxides.

36. An illumination optical system according to claim 22, wherein said optical integrator comprises:
a plurality of lens surfaces arranged two-dimensionally, and
an exit-side cover glass disposed on the exit side of said plurality of lens surfaces,
wherein said exit-side cover glass has a light-shielding member provided on the exit-side cover glass for blocking light passing through a region different from said plurality or lens surfaces toward said surface to be irradiated.

37. An illumination optical system according to claim 22, further comprising a micro fly's eye lens disposed in the optical path between said light source and said surface to be irradiated, wherein said micro fly's eye lens comprises a substrate having a surface formed with a plurality of lens surfaces, and
wherein said lens surfaces of said micro fly's eye lens have an anti-reflection film, provided on the lens surfaces and said micro fly's eye lens, with respect to said illumination light.

38. An illumination optical system according to claim 22, comprising an illuminance distribution correcting member, disposed between said light source and said optical integrator, for controlling respective intensity distributions of Fourier-transformed images of said plurality of light source images independently from each other.

39. An illumination optical system according to claim 38, said optical integrator comprises:
a plurality of lens surfaces arranged two-dimensionally;
an entrance-said cover glass disposed on the entrance side of said plurality of lens surfaces; and
an exit-side cover glass disposed on the exit side of said plurality of lens surfaces,
wherein said illuminance distribution correcting member is disposed in an optical path between said entrance-side cover glass and said exit-said cover glass.

40. An illumination optical system according to claim 22, wherein said illumination optical apparatus forms an illumination area on said surface to be irradiated, said illuminance region having a form whose length in a predetermined direction differs from that in a direction orthogonal to said predetermined direction.

41. An illumination optical system according to claim 22, wherein said light source applies illumination light having a wavelength of 200 nm or shorter.

42. An illumination optical system according to claim 41, wherein said diffractive optical element or said micro fly's eye lens has a silica glass doped with fluorine.

43. An exposure apparatus illuminating a mask formed with a pattern with an illumination light in a predetermined wavelength range so as to form an image of said pattern onto a substrate by way of a projection optical system,
said exposure apparatus comprising the illumination optical apparatus according to claim 22 for supplying said illumination light to said mask.

44. An exposure apparatus according to claim 43, wherein an illumination area on said mask has a form whose length in a predetermined direction differs from that in a direction orthogonal to said predetermined direction, and
wherein exposure is carried out whiled changing a relative relationship between said mask and said illumination area.

45. An exposure method in which a mask formed with a pattern is illuminated with illumination light in a predetermined wavelength range so as to form an image of said pattern onto a substrate by way of a projection optical system.
wherein said illumination light is supplied to said mask by use of the illumination optical apparatus according to claim 22.

46. An exposure apparatus for projecting a pattern of a mask onto a photosensitive substrate,
said exposure apparatus comprising the illumination optical apparatus according to claim 10,
wherein said surface to be irradiated is set on said photosensitive substrate.

* * * * *